(12) United States Patent
Sone et al.

(10) Patent No.: US 10,020,374 B2
(45) Date of Patent: Jul. 10, 2018

(54) FIELD-EFFECT TRANSISTOR, SEMICONDUCTOR MEMORY DISPLAY ELEMENT, IMAGE DISPLAY DEVICE, AND SYSTEM

(75) Inventors: Yuji Sone, Kanagawa (JP); Naoyuki Ueda, Kanagawa (JP); Yuki Nakamura, Tokyo (JP); Yukiko Abe, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 13/515,463

(22) PCT Filed: Dec. 22, 2010

(86) PCT No.: PCT/JP2010/073846
§ 371 (c)(1),
(2), (4) Date: Jun. 12, 2012

(87) PCT Pub. No.: WO2011/078398
PCT Pub. Date: Jun. 30, 2011

(65) Prior Publication Data
US 2012/0248451 A1   Oct. 4, 2012

(30) Foreign Application Priority Data

Dec. 25, 2009  (JP) .................. 2009-295425
Mar. 18, 2010  (JP) .................. 2010-062244
(Continued)

(51) Int. Cl.
*H01L 29/04* (2006.01)
*H01L 29/49* (2006.01)
(Continued)

(52) U.S. Cl.
CPC ...... *H01L 29/4908* (2013.01); *H01L 29/7869* (2013.01); *H01L 29/7881* (2013.01);
(Continued)

(58) Field of Classification Search
CPC .............. H01L 29/7869; H01L 29/517; H01L 21/02565; H01L 29/4908
(Continued)

(56) References Cited

U.S. PATENT DOCUMENTS 5,572,060 A   11/1996  Butler et al.
5,614,018 A    3/1997  Azuma et al.
(Continued)

FOREIGN PATENT DOCUMENTS

CN        1199245 A    11/1998
CN     100409296 C     8/2008
(Continued)

OTHER PUBLICATIONS

International Search Report dated Apr. 5, 2011 in PCT/JP10/73846 filed on Dec. 22, 2010.
(Continued)

*Primary Examiner* — Thao X Le
*Assistant Examiner* — Laura Dykes
(74) *Attorney, Agent, or Firm* — Oblon, McClelland, Maier & Neustadt, L.L.P.

(57) ABSTRACT

A field-effect transistor includes a substrate; a source electrode, a drain electrode, and a gate electrode that are formed on the substrate; a semiconductor layer by which a channel is formed between the source electrode and the drain electrode when a predetermined voltage is applied to the gate electrode; and a gate insulating layer provided between the gate electrode and the semiconductor layer. The gate insulating layer is formed of an amorphous composite metal oxide insulating film including one or two or more alkaline-earth metal elements and one or two or more elements selected from a group consisting of Ga, Sc, Y, and lanthanoid except Ce.

21 Claims, 37 Drawing Sheets

(30) Foreign Application Priority Data

Dec. 3, 2010 (JP) ................................. 2010-270240
Dec. 6, 2010 (JP) ................................. 2010-271980

(51) Int. Cl.

| | |
|---|---|
| H01L 29/786 | (2006.01) |
| H01L 29/788 | (2006.01) |
| G09G 3/20 | (2006.01) |
| G09G 3/3233 | (2016.01) |
| G09G 3/36 | (2006.01) |
| H01L 27/108 | (2006.01) |
| H01L 27/32 | (2006.01) |
| G02F 1/1368 | (2006.01) |
| G02F 1/163 | (2006.01) |

(52) U.S. Cl.

CPC .... *G02F 1/1368* (2013.01); *G02F 2001/1635* (2013.01); *G09G 3/20* (2013.01); *G09G 3/3233* (2013.01); *G09G 3/3648* (2013.01); *H01L 27/10873* (2013.01); *H01L 27/3248* (2013.01); *H01L 27/3262* (2013.01)

(58) Field of Classification Search

USPC ........................................................ 257/59
See application file for complete search history.

(56) References Cited

U.S. PATENT DOCUMENTS

| | | | | |
|---|---|---|---|---|
| 5,689,456 | A | * | 11/1997 | Kobayashi ............. G11C 11/22 257/295 |
| 5,850,098 | A | * | 12/1998 | Butler et al. .................. 257/467 |
| 5,891,798 | A | * | 4/1999 | Doyle et al. .................. 438/624 |
| 6,348,705 | B1 | * | 2/2002 | Hendrix .................. C23C 16/40 257/295 |
| 6,642,131 | B2 | | 11/2003 | Harada |
| 6,706,646 | B1 | | 3/2004 | Lee et al. |
| 6,841,439 | B1 | | 1/2005 | Anthony et al. |
| 7,030,000 | B2 | | 4/2006 | Sakai et al. |
| 7,141,492 | B2 | | 11/2006 | Yudasaka |
| 7,582,572 | B2 | | 9/2009 | Iwasawa |
| 7,679,085 | B2 | | 3/2010 | Jun et al. |
| 7,989,361 | B2 | | 8/2011 | Seon et al. |
| 2001/0030340 | A1 | * | 10/2001 | Fujiwara ................ B82Y 10/00 257/314 |
| 2002/0055271 | A1 | | 5/2002 | Lee et al. |
| 2003/0063077 | A1 | * | 4/2003 | Koyama ...................... 345/204 |
| 2003/0148545 | A1 | * | 8/2003 | Zhuang ............. G11C 11/5685 438/3 |
| 2005/0142769 | A1 | | 6/2005 | Kamata et al. |
| 2005/0145910 | A1 | * | 7/2005 | Tamai .................. G11C 13/0007 257/296 |
| 2005/0151210 | A1 | * | 7/2005 | Li et al. ........................ 257/410 |
| 2006/0038242 | A1 | * | 2/2006 | Hsu ...................... H01L 29/516 257/407 |
| 2006/0234852 | A1 | | 10/2006 | Kim et al. |
| 2008/0020325 | A1 | * | 1/2008 | Su ........................ G03F 7/0042 430/311 |
| 2008/0211011 | A1 | * | 9/2008 | Takashima ........... H01L 29/792 257/324 |
| 2009/0039447 | A1 | | 2/2009 | Copel et al. |
| 2009/0280600 | A1 | * | 11/2009 | Hosono et al. ............... 438/104 |
| 2011/0006299 | A1 | | 1/2011 | Abe et al. |

FOREIGN PATENT DOCUMENTS

| | | |
|---|---|---|
| CN | 101364546 A | 2/2009 |
| JP | 54-22168 A | 2/1979 |
| JP | 5-211356 A | 8/1993 |
| JP | 9-181364 A | 7/1997 |
| JP | 10-506228 A | 6/1998 |
| JP | 11 135774 | 5/1999 |
| JP | 2001 319927 | 11/2001 |
| JP | 2002 134737 | 5/2002 |
| JP | 2002 270828 | 9/2002 |
| JP | 2002 367980 | 12/2002 |
| JP | 2002-543627 A | 12/2002 |
| JP | 2003 017687 | 1/2003 |
| JP | 2003017687 A * | 1/2003 |
| JP | 2003 258243 | 9/2003 |
| JP | 2003 289140 | 10/2003 |
| JP | 2003 332573 | 11/2003 |
| JP | 2004 241751 | 8/2004 |
| JP | 2004-342487 A | 12/2004 |
| JP | 3637325 | 4/2005 |
| JP | 2005 191293 | 7/2005 |
| JP | 3773448 | 2/2006 |
| JP | 3831764 | 10/2006 |
| JP | 2007-5028 A | 1/2007 |
| JP | 2007 115807 | 5/2007 |
| JP | 2007 165724 | 6/2007 |
| JP | 2008-16806 A | 1/2008 |
| JP | 2008 016807 | 1/2008 |
| JP | 2008 505352 | 2/2008 |
| JP | 2008 091904 | 4/2008 |
| JP | 2011 035376 | 2/2011 |
| KR | 10-2009-0050970 | 5/2009 |
| KR | 10-2009-0080522 | 7/2009 |

OTHER PUBLICATIONS

Taiwanese Office Action dated Aug. 26, 2013 in Taiwan Application No. 099145561 (with English Translation).

Korean Office Action dated Aug. 13, 2013, in Korea Patent Application No. 10-2012-7016002 (with English Translation).

Office Action and Search Report dated Jul. 21, 2014 in the corresponding Chinese Patent Application No. 201080064709.8 (with English Translation).

Asamitsu, A. et al., "Current switching of resistive states in magnetoresistive manganites," Letter to Nature, vol. 388, Jul. 3, 1997, pp. 50-52.

Singh, S.K. et al., "Growth, transport, and magnetic properties of $Pr_{0.67}Ca_{0.33}MnO_3$ thin films," Physics Department, University of Warwick, Coventry CV4 7AL, United Kingdom, Appl. Phys. Lett. 69(2), Jul. 8, 1996, pp. 263-65.

Tang, Genchu et al. "The electrical resistivity and thermal infrared properties of $La_{1-x}Sr_xMnO_3$ compounds," Journal of Alloys and Compounds, 461 (2008) pp. 486-89.

Japanese Office Action dated Jan. 24, 2017 in patent application No. 2016-042975 with English Translation.

Office Action dated Jul. 11, 2017 in Chinese Patent Application No. 201510559715.5 with English Translation.

* cited by examiner

FIG.26
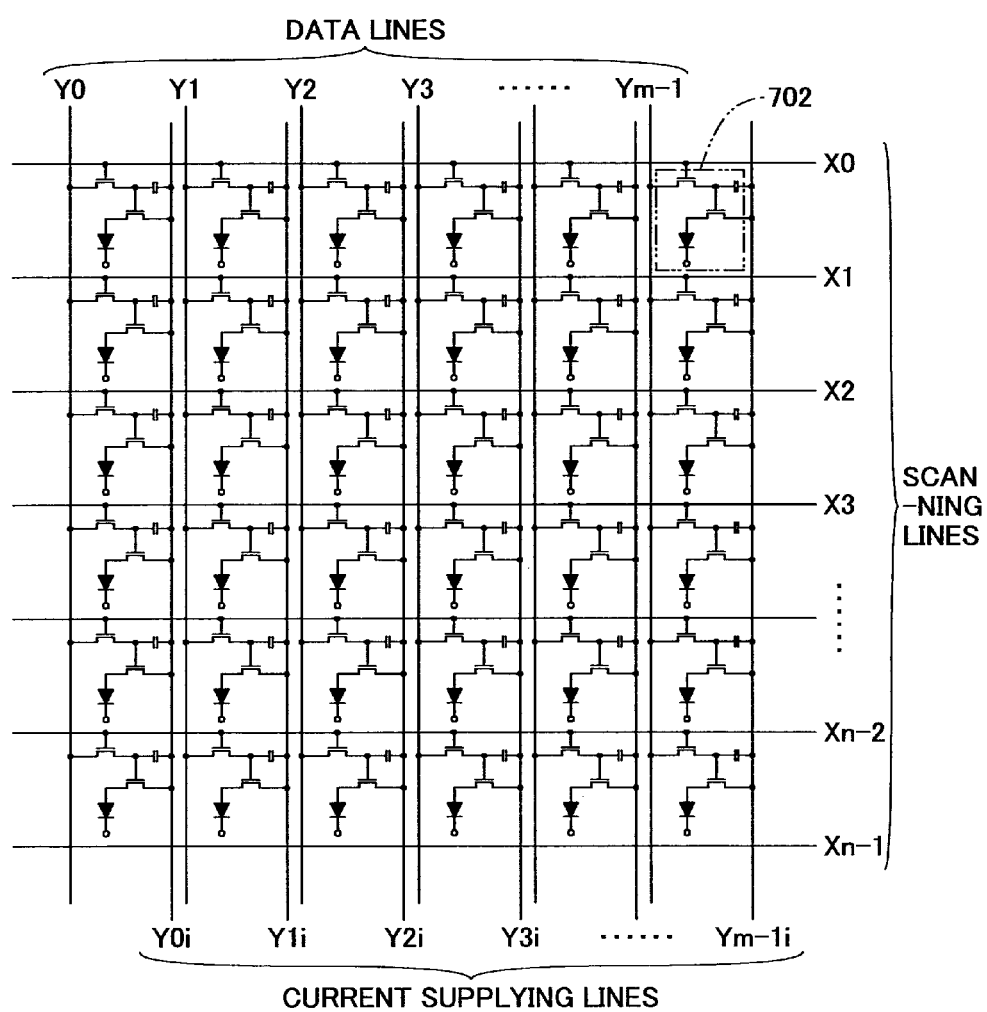
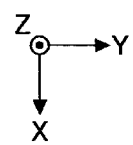

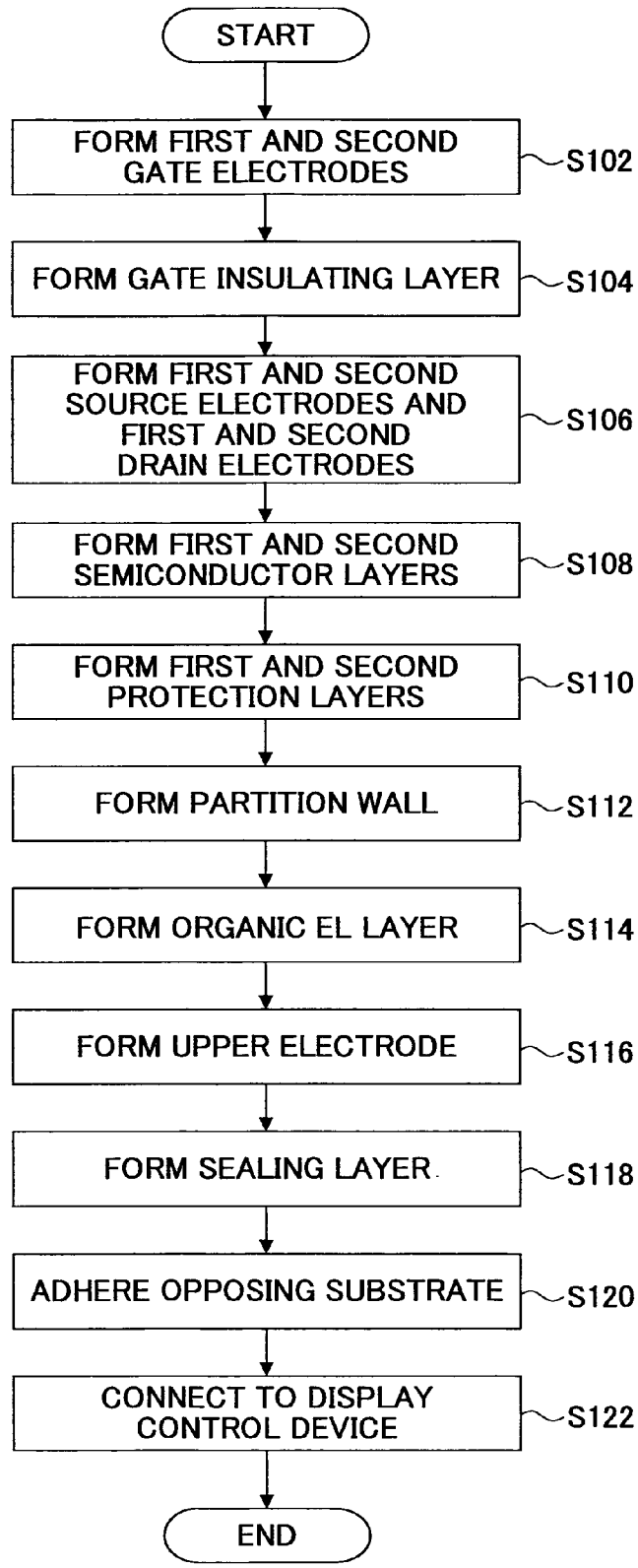

FIELD-EFFECT TRANSISTOR, SEMICONDUCTOR MEMORY DISPLAY ELEMENT, IMAGE DISPLAY DEVICE, AND SYSTEM

TECHNICAL FIELD

The present invention relates to field-effect transistors, semiconductor memories, display elements, image display devices, and systems, and more particularly to a field-effect transistor having an insulating film made of a dielectric oxide, and a semiconductor memory, a display element, an image display device, and a system including the field-effect transistor.

BACKGROUND ART

A field-effect transistor (FET) is a kind of semiconductor devices that controls the electric current between a source electrode and a drain electrode by applying a voltage to a gate electrode to provide a gate for the flow of electrons or holes depending on an electric field of a channel.

FETs are used as switching elements and amplifying elements due to their properties. Since an FET shows a small gate current and has a flat profile, it can be easily manufactured or integrated compared to a bipolar transistor. Therefore, an FET is now an indispensable element in an integrated circuit used in electronic devices.

There are electronic devices including FETs, of which basic structure is MIS (Metal Insulator Semiconductor) structure. Examples of the devices are a switching element, a memory, a logic circuit; other examples are an LSI (Large Scale Integrated Circuit) and an AM-TFT (Active Matrix Thin Film Transistor), which are formed by integrating the aforementioned elements. In the FETs, silicon oxide, oxynitride, and nitride have been used as gate insulating films and capacitor insulating films for a long time. The insulating films of these silicon compounds are not only excellent as insulating films, but also have high affinity with the MIS process.

However, in recent years and continuing, there is demand for electronic devices that are more highly integrated and that consume less power. Therefore, there has been proposed a technology for using, as the insulating film, a so-called high-k insulating film that has significantly a higher relative permittivity than $SiO_2$.

For example, in a microscopic MOS (Metal Oxide Semiconductor) device having a gate length of less than or equal to 0.1 µm, when the gate insulating layer of FET is made of $SiO_2$, the film thickness needs to be less than or equal to 2 nm, based on the scaling law. However, in this case, the gate leakage current caused by a tunnel current becomes a large problem. One approach to reduce the gate leakage current is increasing the thickness of the gate insulating layer by using the high-k insulating film as the gate insulating layer.

A volatile or non-volatile semiconductor memory is an example of a semiconductor device using the field-effect transistor.

In a volatile memory, the drain electrode of the field-effect transistor and the capacitor are serially connected. By using a high-k insulating film, power consumption can be reduced and high integration is possible. Currently, dielectric layers of capacitors are mainly made of laminated layers of $SiO_2/SiN_x/SiO_2$. Thus, there is further demand for insulating films having higher relative permittivity.

The writing/erasing voltage can be reduced in a non-volatile semiconductor memory, including a first gate insulating layer that is an insulating film provided between a semiconductor layer and a floating gate electrode, and a second gate insulating layer that is an insulating film provided between a floating gate electrode and a control gate electrode. Specifically, the writing/erasing voltage can be reduced as a result of increasing the coupling ratio by using a high-k insulating film as the second gate insulating film of the non-volatile semiconductor memory. Currently, second gate insulating layers are mainly made of laminated layers of $SiO_2/SiN_x/SiO_2$. Thus, there is further demand for insulating films having a higher relative permittivity.

In an AM-TFT used in displays, if a high-k insulating film is used in the gate insulating film, high saturation currents can be attained and the ON/OFF operation can be controlled by a low gate voltage, so that the power consumption can be reduced.

Typically, as materials of a high-k insulating film, metal oxide of metals such as Hf, Zr, Al, Y, and Ta have been discussed. Specific examples are $HfO_2$, $ZrO_2$, $Al_2O_3$, $Y_2O_3$, $Ta_2O_5$; silicates of these elements (HfSiO, ZrSiO); aluminates of these elements (HfAlO, ZrAlO), and nitrides of these elements (HfON, ZrON, HfSiON, ZrSiON, HfAlON, ZrAlON).

Meanwhile, in regard to ferroelectric memory materials, a perovskite structure and related substances have been discussed. The perovskite structure is expressed by $ABO_3$, which is typically a combination of a divalent metal ion (A site) and a tetravalent metal ion (B site), or a combination of trivalent metal ions corresponding to both the A site and the B site. Examples are $SrTiO_3$, $BaZrO_3$, $CaSnO_3$, and $LaAlO_3$. Furthermore, there are many crystals in which the B site is occupied by two kinds of ions, such as $SrBi_{0.5}Ta_{0.5}O_3$ and $BaSc_{0.5}Nb_{0.5}O_3$.

Furthermore, there is a series of crystals referred to as a layer type perovskite structure. This is expressed by $(AO)_m(BO_2)_n$, in which an m number of AO layers and an n number of $BO_2$ layers are laminated. For example, there are $Sr_2TiO_4$, $Sr_3Ti_2O_7$, and $Sr_4Ti_3O_{10}$, with respect to a basic structure of $SrTiO_3$ (m=n=1). According to such crystal structures, the composition ratio of A ions and B ions may be varied. Accordingly, a wide variety of crystal groups may appear, including the combination of B site ions. In the present application, a "perovskite structure related crystal" means a crystal having a perovskite structure or a layer type perovskite structure.

Incidentally, when a polycrystalline material is used as a gate insulating layer, a large leakage current flows at the interfaces of the crystal grain boundaries. Therefore, the function of the gate insulating film is degraded. Furthermore, when the crystal system has anisotropy, properties of the transistor may become irregular due to dielectric constant anisotropy.

Patent documents 1 and 2 disclose methods of decreasing leakage currents in the gate insulating layer, by using an amorphous insulating film made of a high-dielectric-constant silicate as the gate insulating layer.

Patent document 3 discloses a method of decreasing leakage currents in the gate insulating layer, by using an amorphous insulating film primarily made of $A_2B_2O_7$ having a pyrochlore structure, as the gate insulating layer.

Patent documents 4, 5, and 6 disclose methods of decreasing leakage currents in the gate insulating layer, by using laminated films including a high dielectric constant film as the gate insulating layer. Patent document 7 discloses a method of decreasing leakage currents in the gate insulating layer, by forming a high dielectric constant film of epitaxial growth on a substrate, and performing a heating process so that elements in the substrate and metal oxide elements in the gate insulating film are mixed together.

Furthermore, patent document 8 discloses a TFT device in which laminated films, including an inorganic oxide film having a high dielectric constant and an organic polymer film, are used as the gate insulating layer.

However, the problem with the insulating film disclosed in patent documents 1 and 2 is that the relative permittivity cannot be sufficiently increased, because the insulating film has plenty of $SiO_2$ content.

With the material disclosed in patent document 3, the gate insulating layer includes a crystalline phase. Therefore, an amorphous phase is formed in the region of an extremely narrow process condition. Accordingly, there are problems in the manufacturing process.

The problem with the methods disclosed in patent documents 4 through 8 is that the manufacturing process is complex and manufacturing costs are high.

Accordingly, there is a need for a field-effect transistor, a semiconductor memory, a display element, an image display device, and a system, including an insulating film having a high relative permittivity and a small amount of leakage currents formed by a simple method and at low cost.

Patent Document 1: Japanese Laid-Open Patent Application No. H11-135774
Patent Document 2: Japanese Patent No. 3637325
Patent Document 3: Japanese Laid-Open Patent Application No. 2002-270828
Patent Document 4: Japanese Laid-Open Patent Application No. 2002-134737
Patent Document 5: Japanese Patent No. 3773448
Patent Document 6: Japanese Laid-Open Patent Application No. 2003-258243
Patent Document 7: Japanese Patent No. 3831764
Patent Document 8: Japanese Laid-Open Patent Application No. 2008-16807
Patent Document 9: Japanese Laid-Open Patent Application No. 2001-319927
Patent Document 10: Japanese Laid-Open Patent Application No. 2002-367980
Patent Document 11: Japanese Laid-Open Patent Application No. 2004-241751
Patent Document 12: Japanese Laid-Open Patent Application No. 2007-165724
Patent Document 13: Japanese Laid-Open Patent Application No. 2008-91904

DISCLOSURE OF INVENTION

Aspects of the present invention provide a semiconductor device, an image display device, a system, insulating film forming ink, a method of manufacturing insulating film forming ink, and a method of manufacturing a semiconductor device, that solve or reduce one or more problems caused by the limitations and disadvantages of the related art.

An aspect of the present invention provides a field-effect transistor including a substrate; a source electrode, a drain electrode, and a gate electrode that are formed on the substrate; a semiconductor layer by which a channel is formed between the source electrode and the drain electrode when a predetermined voltage is applied to the gate electrode; and a gate insulating layer provided between the gate electrode and the semiconductor layer, wherein the gate insulating layer is formed of an amorphous composite metal oxide insulating film including one or two or more alkaline-earth metal elements and one or two or more elements chosen from a group consisting of Ga, Sc, Y, and lanthanoid except Ce.

With this configuration, an insulating film having a high relative permittivity and a small amount of leakage currents can be formed by a simple method, and therefore a field-effect transistor, a semiconductor memory, a display element, an image display device, and a system that are low-voltage-driven, highly integrated, high-resolution, and high-luminance, can be provided at low cost.

BRIEF DESCRIPTION OF DRAWINGS

FIG. 26 is for describing the television device according to the eighth embodiment of the present invention (3);

FIG. 39 is a flowchart of a method of manufacturing the organic EL display element according to example 7.

BEST MODE FOR CARRYING OUT THE INVENTION

Figure 1:
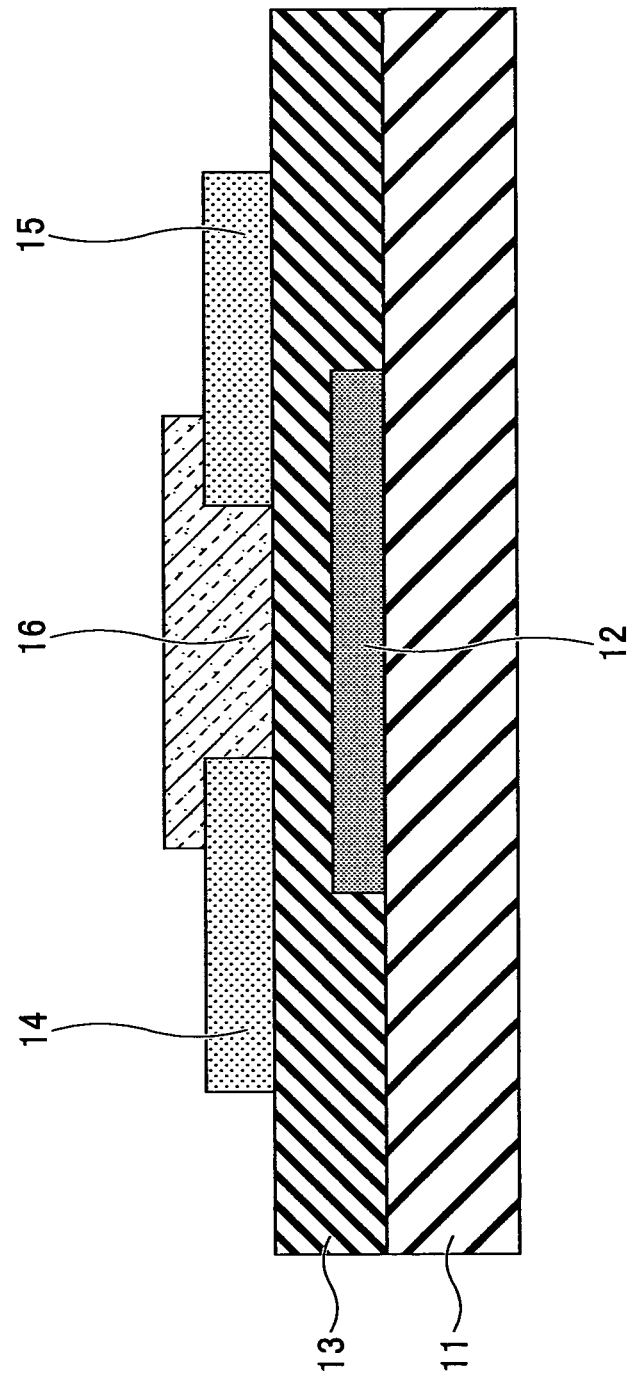
FIG. 1 illustrates a field-effect transistor according to a first embodiment of the present invention.

Embodiments of the present invention are described below with reference to the accompanying drawings.

The present invention is based on a result of intensive studies made by the inventors of the present invention. Specifically, the inventors have formulated an insulating material made of an oxide that is a single-layer film, has a high dielectric constant, and has a small amount of leakage currents. Furthermore, the inventors have formed an electronic device using this insulating material.

That is to say, the present invention is based on a finding that an amorphous phase is stably indicated in a composite metal oxide film including one or two or more alkaline-earth metal elements chosen from a group consisting of Be, Mg, Ca, Sr, Ba, and Ra; and one or two or more elements chosen from the other group consisting of Ga, Sc, Y, and lanthanoid except Ce, which is Ga, Sc, Y, La, Pr, Nd, Pm, Sm, Eu, Gd, Tb, Dy, Ho, Er, Tm, Yb, and Lu.

Alkaline-earth metal oxide tends to react to moisture and carbon dioxide in the atmosphere, and easily turns into hydroxide and carbonate. Therefore, alkaline-earth metal oxide alone is inappropriate for applying to electronic devices. Furthermore, simple metal oxides, such as $Ga_2O_3$, $Sc_2O_3$, $Y_2O_3$, and $Ln_2O_3$ are easily crystallized, and therefore the above-described problem of leakage currents arises. However, the inventors of the present invention have found that an amorphous insulating film can be formed in the atmosphere in a stable manner and over a wide composition area, with the use of a composite oxide including both one or two or more alkaline-earth metal elements chosen from a group consisting of Be, Mg, Ca, Sr, Ba, and Ra; and one or two or more elements chosen from the other group consisting of Ga, Sc, Y, and lanthanoid except Ce. Ce specifically becomes tetravalent in lanthanoid, and forms a crystal having a perovskite structure between Ce and the alkaline-earth metal. Therefore, in order to achieve an amorphous phase, it is preferable that we select the elements among lanthanoid except Ce.

In between the alkaline-earth metal and the Ga oxide, there is a crystal phase such as a spinel structure. Compared to perovskite structure crystals, these crystals do not precipitate unless the temperature is significantly high (typically, greater than or equal to 1000° C.). Furthermore, there are no reported stable crystal phases between alkaline-earth metal oxides and oxides made of Sc, Y, and lanthanoid except Ce. Even after a post process performed under high temperature, crystal rarely precipitates from an amorphous phase. Furthermore, the amorphous phase is even more stabilized when the composite oxide of the alkaline-earth metal elements and the elements chosen from the other group consisting of Ga, Sc, Y, and lanthanoid except Ce are formed of greater than or equal to three kinds of metal elements.

In consideration of forming a high dielectric constant film, the composition ratio of elements such as Ba, Sr, Lu, and La is preferably increased.

The composite metal oxide film according to an embodiment of the present invention can form an amorphous film over a wide composition range, and therefore the physical properties can be controlled over a wide range. For example, the relative permittivity is approximately 6 through 20, which is sufficiently higher than $SiO_2$. The relative permittivity can be adjusted to an appropriate value according to the purpose by selecting the composition.

Furthermore, the thermal expansion coefficient of the composite metal oxide film is similar to that of both typical wiring materials and semiconductor materials of $10^{-6}$ through $10^{-5}$. Therefore, even after repeating a heating process on the composite metal oxide film according to an embodiment of the present invention, the film is less likely to peel off, compared to the case of $SiO_2$ having a thermal expansion coefficient of $10^{-7}$. In particular, the composite metal oxide film forms a high quality interface between an oxide semiconductor such as a-IGZO (amorphous indium gallium zinc oxide).

Thus, by using the composite metal oxide film in an insulating film of an FET, a high-performance semiconductor device can be achieved.

The above-described composite metal oxide film may be formed by vacuum processes such as CVD (Chemical Vapor Deposition), ALD (Atomic Layer Deposition), and sputtering. By any of these methods, an amorphous film may be formed.

The film can also be formed by preparing ink for forming the above composite metal oxide film, applying or printing the ink on a substrate, and then firing the substrate.

A first type of insulating film forming ink used for forming the composite metal oxide film is formed with a solution including one or two or more alkaline-earth metal elements and one or two or more elements chosen from a group consisting of Ga, Sc, Y, and lanthanoid (excluding Ce).

A second type of insulating film forming ink includes one or two or more metal elements chosen from a group consisting of Al, Ti, Zr, Hf, Ce, Nb, and Ta, adding to the first type of ink.

The insulating film forming ink includes at least one of metal organic acid salt and a metal-organic complex of the above metal. In the present application, the word of "metal-organic complex" includes both an organometallic compound possessing a metal-carbon bond and a metal complex possessing a coordinate bond.

The metal organic acid salt is substituted or non-substituted carboxylate salt. Examples are magnesium ethyl-butyrate, calcium propionate, strontium neodecanoate, barium octylate, lanthanum 2-ethylhexanoate, yttrium neodecanoate, cerium 2-ethylhexanoate, zirconium naphthenate, and niobium 2-ethylhexanoate, although not so limited.

The metal-organic complex includes an acetylacetonato derivative, a substituted or non-substituted phenyl group, or a substituted or non-substituted alkoxy group. Examples are strontium acetylacetonato hydrate, tris(2,2,6,6-tetramethyl-3,5-heptanedionato)neodymium, tetraethoxy acetylacetonato tantalum, magnesium salicylate, titanium butoxide, and aluminum di (s-butoxide) acetoacetic ester chelate, although not so limited.

Furthermore, the metal-organic complex may include a carbonyl group, a substituted or non-substituted alkyl group, or a substituted or non-substituted cyclodienyl group. Examples are niobium pentacarbonyl, tris(cyclopentadienyl) yttrium, bis(cyclopentadienyl)dicarbonyl titan (II), tetra benzyl hafnium, and diethyl aluminum, although not so limited.

Furthermore, the insulating film forming ink includes inorganic salt of the above metals. Examples are strontium carbonate, scandium nitrate hydrate, gallium sulfate, and hafnium (IV) dichloride oxide octahydrate, although not so limited.

As the solvent used in the insulating film forming ink, a solvent in which the above metal raw material compound can be stably dissolved or dispersed may be appropriately selected. Examples are toluene, xylene, acetylacetone, isopropanol, ethyl benzoate, N,N-dimethylformamide, propylene carbonate, 2-Ethylhexanoic acid, mineral spirits, dimethyl propylene urea, 4-butyrolactone, 2-methoxyethanol, ethylene glycol, and water, although not so limited.

The method of applying the insulating film forming ink on the substrate may be conventional methods such as spin coating, inkjet printing, slit coating, nozzle printing, gravure printing, and micro contact printing. Physical properties of the solution of the insulating film forming ink such as viscosity are preferably adjusted to values that are appropriate for the coating process. As examples of a means for adjusting the viscosity, ethylene glycol or dipropylene glycol monomethyl ether may be added to the solvent as a thickening agent, although not so limited. By using an appropriate printing method, the ink can be printed only in a specified area, so that there is no need to subsequently perform a patterning procedure.

Next, by performing a heating process on the insulating film forming ink applied on the substrate, the ink can be converted into an oxide insulating film. The heating process may be performed by a conventional method such as resistance heating, infrared heating, and laser beam radiation. In order to convert the metal raw material compound into an oxide, it is necessary to break the metal-carbon and the oxygen-carbon bond of the metal-oxygen-carbon bond in the metal raw material compound. In order to achieve this, an appropriate method can be used to apply energy required for the decomposition reaction with heat, light, and so on. There are methods for facilitating the conversion into the oxide insulating film, such as a method of breaking the chemical bonds in the metal-organic complex by irradiating ultraviolet (UV) light or a method of facilitating oxidation by turning the atmosphere into an ozone atmosphere. Furthermore, in order to form a high-density film, the reaction conditions of the metal raw material compound and the boiling point of the solvent are preferably appropriately selected, in order to attain fluidity of the reaction intermediate and excessive reaction products including carbon, hydrogen, oxygen, and nitrogen.

According to the above procedures, the insulating film according to an embodiment of the present invention can be formed. The insulating film according to an embodiment of the present invention has an amorphous structure, and the leakage current is considerably low when an electric field is applied.

First Embodiment

A description is given of a field-effect transistor according to a first embodiment of the present invention with reference to FIG. 1.

The field-effect transistor according to the first embodiment includes an insulating substrate 11, a gate electrode 12, a gate insulating layer 13, a source electrode 14, a drain electrode 15, and a semiconductor layer 16.

First, the insulating substrate 11 is prepared. The insulating substrate 11 may be made of alkali-free glass or silica-glass that is already widely used in flat panel displays. Furthermore, a plastic substrate made of materials such as polycarbonate (PC), polyimide (PI), polyethylene terephthalate (PET), and polyethylene naphthalate (PEN) may also be appropriately used as the insulating substrate 11. In order to clean the surface and to improve adhesiveness, a pre-process is preferably performed by oxygen plasma, UV ozone, UV irradiation and cleaning, etc.

Next, the gate electrode 12 is formed on the insulating substrate 11. Various materials and processes may be used to form the gate electrode 12. Examples of materials are metals and alloys such as Mo, Al, and Cu, transparent conducting oxides such as ITO and ATO, and organic conductive materials such as polyethylene dioxythiophene (PEDOT) and polyaniline (PANI). Examples of processes include forming a film by sputtering, spin coating, or dip coating, and then performing patterning by photolithography, or by performing a printing process such as inkjet printing, nano-in-printing, and gravure printing, so that a film having a requested shape is directly formed.

Next, the gate insulating layer 13 is formed. In the present embodiment, the gate insulating layer 13 is a composite metal oxide insulating film made of one or two or more alkaline-earth metal elements chosen from a group consisting of Be, Mg, Ca, Sr, Ba, and Ra; and one or two or more elements chosen from the other group consisting of Ga, Sc, Y, and lanthanoid except Ce.

The amounts of elements included in the composite metal oxide insulating film are not particularly limited. The composition can be determined so as to satisfy the respective properties required by the field-effect transistor to be manufactured, such as the dielectric constant, dielectric loss, the thermal expansion coefficient, process compatibility, and cost. The gate insulating film according to an embodiment of the present invention may have a composition selected from a wide range, and therefore a wide range of requested specifications can be satisfied.

The process is not particularly limited. For example, a film is formed by a vacuum film forming process such as a CVD method and an ALD method, or a sputtering method, and then a photolithography method is performed to form a requested pattern. The film can be formed by preparing ink for forming the above composite metal oxide film, applying the ink on a substrate, and then firing the substrate under appropriate conditions. The method of applying the ink may be conventional methods such as spin coating, inkjet printing, slit coating, nozzle printing, gravure printing, and micro contact printing. By using appropriate printing methods and conditions, the ink can be printed only in a specified area, so that there is no need to subsequently perform a patterning procedure. An amorphous film can be formed by any of the film forming methods.

Next, the source electrode 14 and the drain electrode 15 are formed. Various materials and processes may be used. Examples of materials are metals and alloys such as Mo, Al, and Ag, transparent conducting oxides such as ITO and ATO, and organic conductive materials such as polyethylene dioxythiophene (PEDOT) and polyaniline (PANI). Examples of processes include forming a film by sputtering, spin coating, or dip coating, and then performing patterning by photolithography, or by performing a printing process such as inkjet printing, nano-in-printing, and gravure printing, so that a film having a requested shape is directly formed.

Next, the semiconductor layer 16 is formed so as to form a channel between the source electrode 14 and the drain electrode 15. Examples of the semiconductor layer 16 are an oxide semiconductor such as polycrystal silicon (p-Si), amorphous silicon (a-Si), and In—Ga—Zn—O, and an organic semiconductor such as pentacene, although not so limited. Among these, the oxide semiconductor is preferable in consideration of the stability of the interface of the gate insulating layer 13 and the semiconductor layer 16.

The process is not particularly limited. Examples of processes include a vacuum film forming process such as sputtering, a pulse laser deposition (PLD) method, a CVD method, and an ALD method, and a solution process such as spin coating and dip coating, and then performing patterning by photolithography, or by performing a printing process such as inkjet printing, nano-in-printing, and gravure printing, so that a film having a required shape is directly formed.

According to the above procedures, the field-effect transistor is formed.

In the field-effect transistor according to the present embodiment, the composite metal oxide insulating film forming the gate insulating layer 13 has an amorphous structure, and has a relative permittivity of approximately greater than or equal to six, which is higher than that of $SiO_2$. Therefore, the leakage current is decreased, and the field-effect transistor can be driven at low voltage.

The field-effect transistor shown in FIG. 1 is a so-called bottom gate/bottom contact type. However, the field-effect transistor according to the present embodiment of the present invention may be, for example, a bottom gate/top contact type as shown in FIG. 2, a top gate/bottom contact type as shown in FIG. 3, or a top gate/top contact type as shown in FIG. 4.

Figure 2:
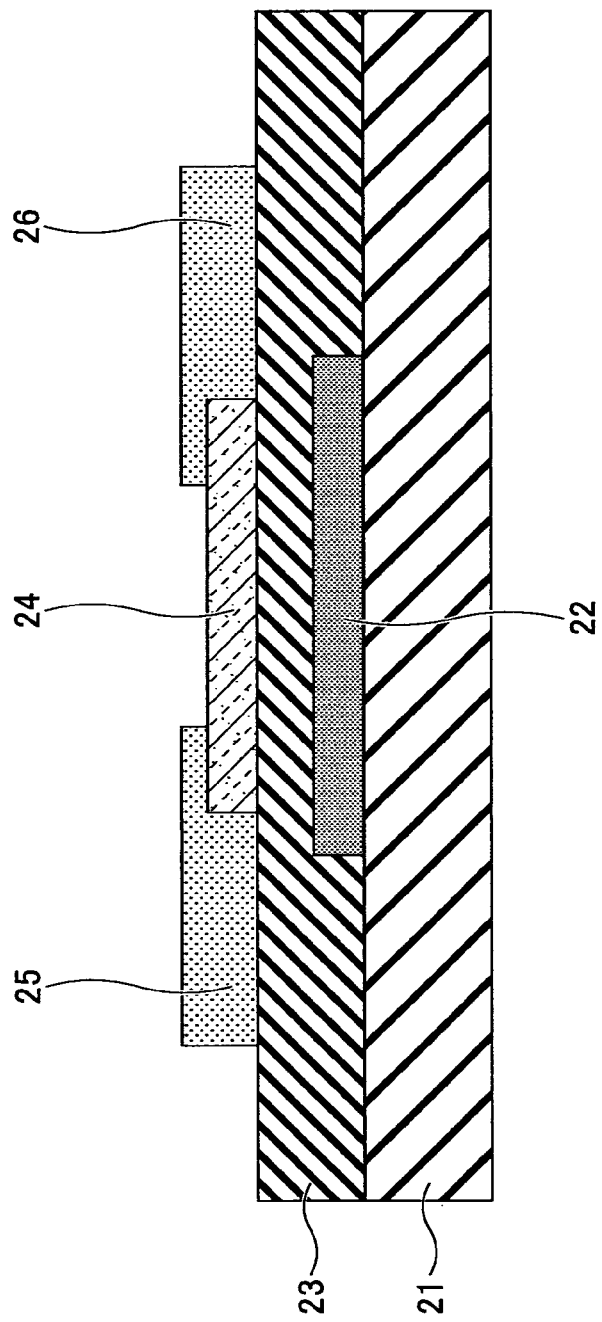
FIG. 2 illustrates another example (1) of the field-effect transistor according to the first embodiment of the present invention.

Specifically, the bottom gate/top contact type shown in FIG. 2 is formed as follows. A gate electrode 22 made of a metal material is formed on an insulating substrate 21. A gate insulating layer 23 is formed so as to cover the gate electrode 22. A semiconductor layer 24 is formed on the gate insulating layer 23. A source electrode 25 and a drain electrode 26 are formed so that a channel is formed on the gate insulating layer 23.

Figure 3:
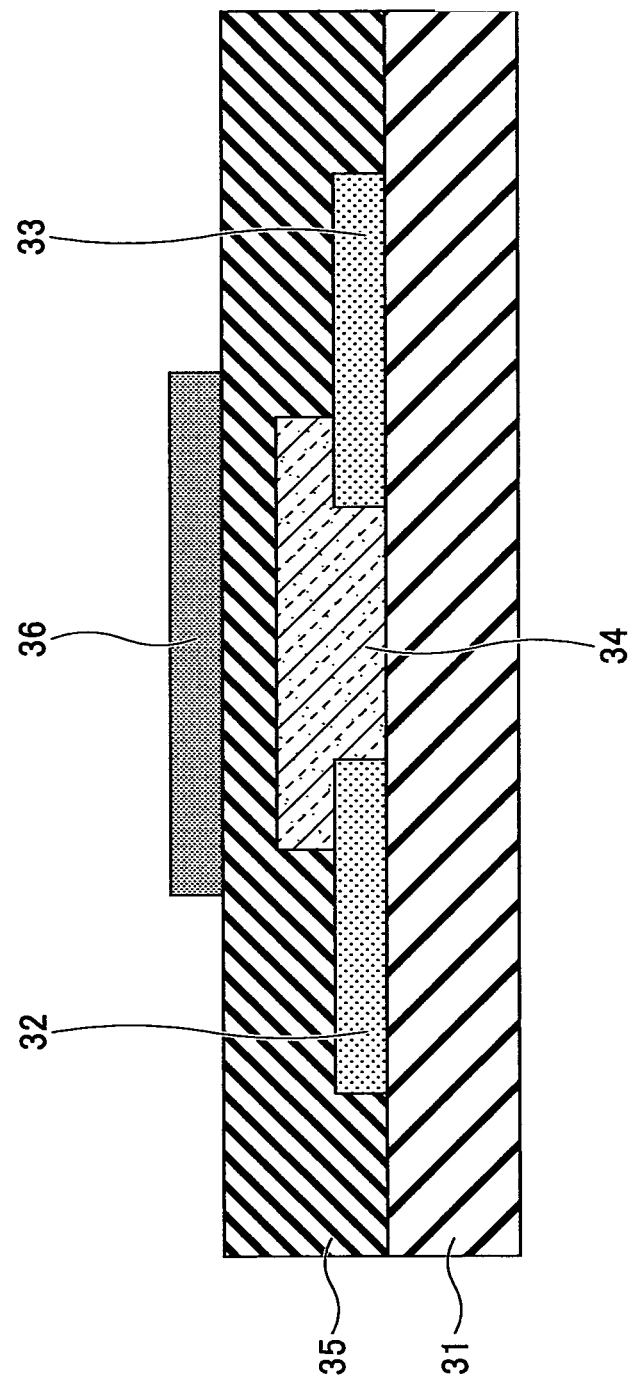
FIG. 3 illustrates yet another example (2) of the field-effect transistor according to the first embodiment of the present invention.

A top gate/bottom contact type as shown in FIG. 3 is formed as follows. A source electrode 32 and a drain electrode 33 are formed on an insulating substrate 31. A semiconductor layer 34 is formed so as to form a channel between the source electrode 32 and the drain electrode 33. A gate insulating layer 35 is formed so as to cover the source electrode 32, the drain electrode 33, and the semiconductor layer 34. A gate electrode 36 is formed on the gate insulating layer 35.

Figure 4:
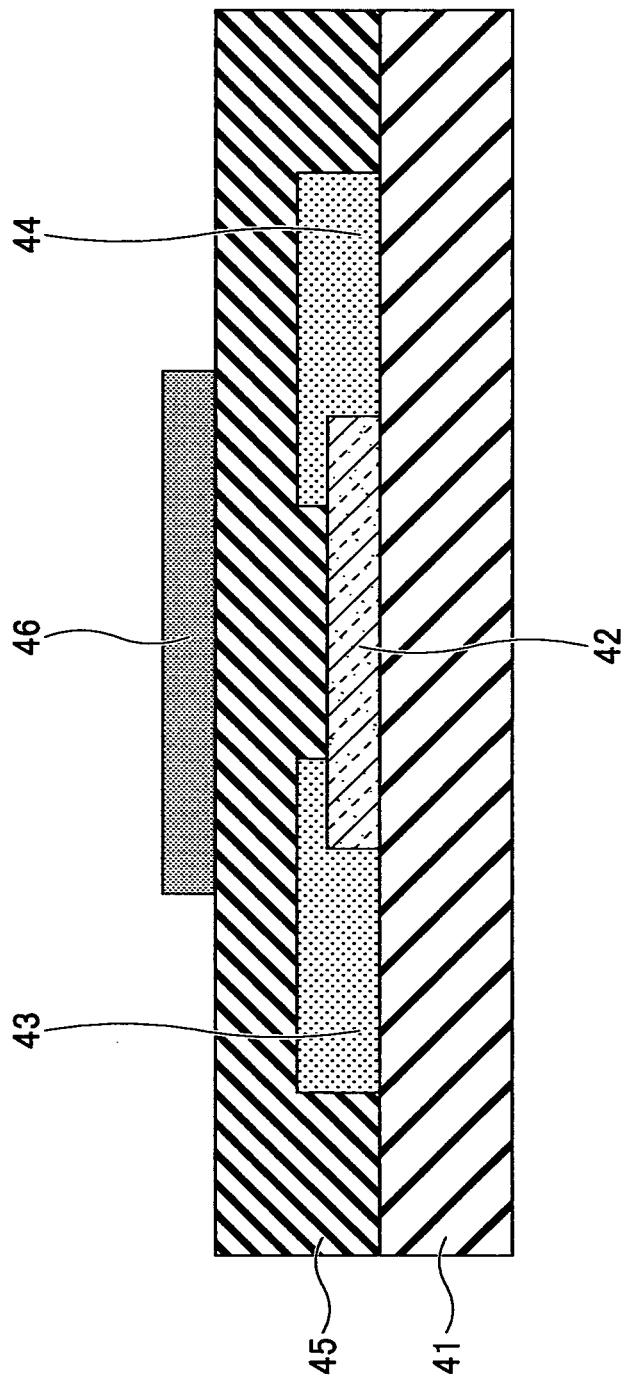
FIG. 4 illustrates yet another example (3) of the field-effect transistor according to the first embodiment of the present invention.

A top gate/top contact type as shown in FIG. 4 is formed as follows. A semiconductor layer 42 is formed on an insulating substrate 41. A source electrode 43 and a drain electrode 44 are formed so as to form a channel on the semiconductor layer 42. A gate insulating layer 45 is formed in such a manner as to cover the source electrode 43, the drain electrode 44, and the semiconductor layer 42. A gate electrode 46 is formed on the gate insulating layer 45.

The field-effect transistor according to the present embodiment may be used as a driving circuit in, e.g., a semiconductor memory, a TFT, or a display (display element).

Second Embodiment

Figure 5:
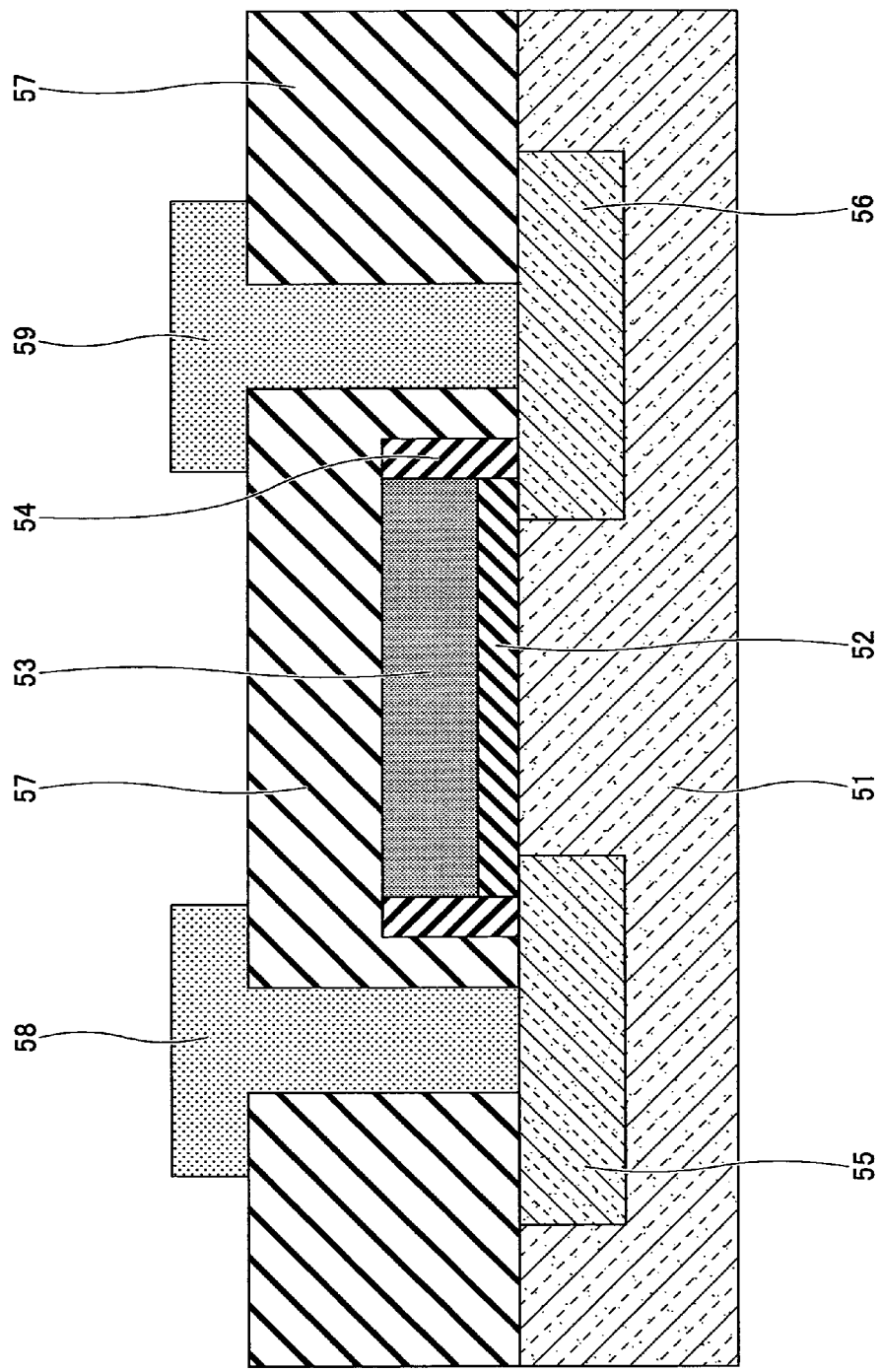
FIG. 5 illustrates a field-effect transistor according to a second embodiment of the present invention.

A description is given of a field-effect transistor according to a second embodiment of the present invention with reference to FIG. 5.

The field-effect transistor according to the second embodiment includes a semiconductor substrate 51, a gate insulating layer 52, a gate electrode 53, a gate side wall insulating film 54, a source area 55, a drain area 56, an interlayer insulating film 57, a source electrode 58, and a drain electrode 59.

First, the semiconductor substrate 51 is prepared. The material of semiconductor substrate 51 is not particularly limited as long as it is a semiconductor material. For example, Si (silicon) or Ge (germanium) in which specified impurities are added may be appropriately used.

Next, the gate electrode 52 is formed on the insulating substrate 51. In the present embodiment, the gate insulating layer 52 is a composite metal oxide insulating film made of one or two or more alkaline-earth metal elements chosen from a group consisting of Be, Mg, Ca, Sr, Ba, and Ra; and one or two or more elements chosen from the other group consisting of Ga, Sc, Y, and lanthanoid except Ce.

The amounts of elements included in the composite metal oxide insulating film are not particularly limited. The composition can be determined so as to satisfy the respective properties required by the field-effect transistor to be manufactured, such as the dielectric constant, the dielectric loss, the thermal expansion coefficient, process compatibility, and cost. The gate insulating film according to an embodiment of the present invention may have a composition selected from a wide range, and therefore a wide range of requested specifications can be satisfied.

The process is not particularly limited. For example, a film is formed by a vacuum film forming process such as a CVD method and an ALD method, or a sputtering method, and then a photolithography method is performed to form a requested pattern. The film can be formed by preparing ink for forming the above composite metal oxide film, applying the ink on a substrate, and then firing the substrate under appropriate conditions. The method of applying the ink may be conventional methods such as spin coating, inkjet printing, slit coating, nozzle printing, gravure printing, and micro contact printing. By using appropriate printing methods and conditions, the ink can be printed only in a specified area, so that there is no need to subsequently perform a patterning procedure. An amorphous film can be formed by any of the film forming methods.

Next, the gate electrode 53 is formed. The material and process are not particularly limited. Examples of materials are polysilicon, metal materials such as Al, and a laminated body, which may be formed by laminating barrier metals such as TiN and TaN laminated on those materials. Examples of the process are vacuum film forming processes such as CVD and sputtering. Furthermore, although not shown, there may be formed a silicide layer such as NiSi, CoSi, and TiSi on the surface of the gate electrode 53 for the purpose of reducing the resistance.

The method of patterning the gate insulating layer 52 and the gate electrode 53 is not particularly limited. For example, a photolithography method may be performed, in which a mask is formed with the use of photoresist, and then dry etching is performed to remove parts of the gate insulating layer 52 and the gate electrode 53 from areas that are not covered by the mask.

Next, the gate side wall insulating film 54 is formed on the side walls of the gate insulating layer 52 and the gate electrode 53. The material and process are not particularly limited. Examples of the materials are insulating materials such as SiON and $SiO_2$. Examples of processes are vacuum film forming processes such as CVD and sputtering. The method of patterning the gate side wall insulating film 54 is not particularly limited. In one example, the gate side wall insulating film 54 is formed on the entire substrate, and then the entire surface is etched back by dry etching.

Next, ions are selectively implanted into the semiconductor substrate 51, to form the source area 55 and the drain area 56. Although not shown, there may be formed a silicide layer such as NiSi, CoSi, and TiSi on the surface of the source area 55 and the drain area 56 for the purpose of reducing the resistance.

Next, the interlayer insulating film 57 is formed. The material and process are not particularly limited. Examples of the materials are insulating materials such as SiON and $SiO_2$. Examples of processes vacuum film forming processes such as CVD and sputtering. The method of patterning the interlayer insulating film 57 is not particularly limited. In one example, a requested pattern may be formed by photolithography, so that through holes are formed as shown in FIG. 5.

Next, the source electrode 58 and the drain electrode 59 are formed. The source electrode 58 and the drain electrode 59 are formed by filling the through holes formed in the interlayer insulating film 57 so as to be connected with the source area 55 and the drain area 56, respectively.

The material and process are not particularly limited. Examples of materials are metal materials such as Al and Cu. Examples of processes are filling the through holes by a vacuum film forming process such as sputtering, and then performing patterning by photolithography, or by filling the through holes by CVD or a coating method, and then flattening the parts by CMP (Chemical Mechanical Polishing). A laminated body may be formed by laminating barrier metals such as TiN and TaN on the metal materials. A CVD method may be performed to form W plugs by filling the through holes with W.

According to the above procedures, the field-effect transistor is formed. In the field-effect transistor according to the present embodiment, the composite metal oxide insulating film forming the gate insulating layer 52 has an amorphous structure, and the relative permittivity is greater than or equal to six, which is higher than that of $SiO_2$. Therefore, the leakage current can be decreased, and the field-effect transistor can be driven at low voltage and can be highly integrated.

In the field-effect transistor according to the second embodiment shown in FIG. 5, the semiconductor substrate 51 corresponds to the semiconductor layer forming a channel between the source area 55 and the drain area 56.

Furthermore, although not shown, a semiconductor layer made of SiGe may be formed between the semiconductor substrate 51 made of Si and the gate insulating layer 52. Furthermore, FIG. 5 illustrates a top gate structure; however, the gate insulating layer 52 may be used in a so-called double gate structure or a fin type FET.

The field-effect transistor according to the present embodiment may be used in a semiconductor memory, etc.

Third Embodiment

Figure 6:
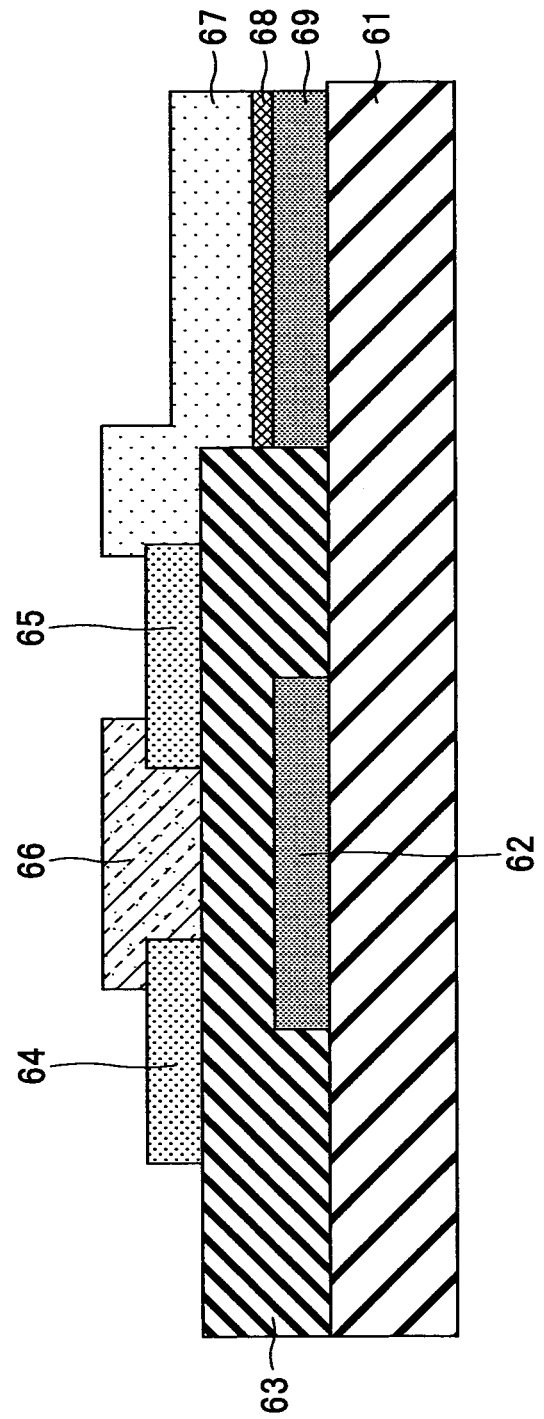
FIG. 6 illustrates a volatile memory according to a third embodiment of the present invention.

A description is given of a volatile semiconductor memory device (first example) according to a third embodiment of the present invention with reference to FIG. 6.

The volatile semiconductor memory device (first example) according to the present embodiment includes an insulating substrate 61, a gate electrode 62, a gate insulating layer 63, a source electrode 64, a drain electrode 65, a semiconductor layer 66, a first capacitor electrode 67, a capacitor dielectric layer 68, and a second capacitor electrode 69.

First, the insulating substrate 61 is prepared. The materials are the same as those of the substrate 11 of the first embodiment.

Next, the gate electrode 62 is formed on the insulating substrate 61. The materials and processes are the same as those of the gate electrode 12 of the first embodiment.

Next, the second capacitor electrode 69 is formed. Various materials and processes may be used to form the second capacitor electrode 69. Examples of materials are alloys, metals such as Mo, Al, Cu, and Ru, transparent conducting oxides such as ITO and ATO, and organic conductive materials such as polyethylene dioxythiophene (PEDOT) and polyaniline (PANI). Examples of processes include forming a film by sputtering, spin coating, or dip coating, and then performing patterning by photolithography, or by performing a printing process such as inkjet printing, nano-in-printing, and gravure printing, so that a film having a requested shape is directly formed.

The gate electrode 62 and the second capacitor electrode 69 may be formed simultaneously if they are made with the same materials and processes.

Next, the gate insulating layer 63 is formed. In the present embodiment, the gate insulating layer 63 is a composite metal oxide insulating film made of one or two or more alkaline-earth metal elements chosen from a group consisting of Be, Mg, Ca, Sr, Ba, and Ra; and one or two or more elements chosen from the other group consisting of Ga, Sc, Y, and lanthanoid except Ce.

The amounts of elements included in the composite metal oxide insulating film are not particularly limited. The composition can be determined so as to satisfy the respective properties required by the volatile semiconductor memory device to be manufactured, such as the dielectric constant, the dielectric loss, the thermal expansion coefficient, process compatibility, and cost. The gate insulating film according to an embodiment of the present invention may have a composition selected from a wide range, and therefore a wide range of requested specifications can be satisfied.

The process is not particularly limited. For example, a film is formed by a vacuum film forming process such as a CVD method, an ALD method, and a sputtering method, and then a photolithography method is performed to form a requested pattern. The film can be formed by preparing ink for forming the above composite metal oxide film, applying the ink on a substrate, and then firing the substrate under appropriate conditions. The method of applying the ink may be conventional methods such as spin coating, inkjet printing, slit coating, nozzle printing, gravure printing, and micro contact printing. By using appropriate printing methods and conditions, the ink can be printed only in a specified area, so that there is no need to subsequently perform a patterning procedure. An amorphous film can be formed by any of the film forming methods.

Next, the capacitor dielectric layer 68 is formed on the second capacitor electrode 69. The materials of the capacitor dielectric layer 68 are not particularly limited. For example, a high dielectric oxide material including Hf, Ta, and La and a ferroelectric material such as lead zirconate titanate (PZT) and strontium bismuth tantalate (SBT) may be used. The capacitor dielectric layer 68 may be made of the insulating film according to an embodiment of the present invention, i.e., a composite metal oxide insulating film made of one or two or more alkaline-earth metal elements chosen from a group consisting of Be, Mg, Ca, Sr, Ba, and Ra; and one or two or more elements chosen from the other group consisting of Ga, Sc, Y, and lanthanoid except Ce.

The amounts of elements included in the composite metal oxide insulating film are not particularly limited. The composition can be determined so as to satisfy the respective properties required by the volatile semiconductor memory device to be manufactured, such as the dielectric constant, the dielectric loss, the thermal expansion coefficient, process compatibility, and cost. The gate insulating film according to an embodiment of the present invention may have a composition selected from a wide range, and therefore a wide range of requested specifications can be satisfied.

The process is not particularly limited. For example, a film is formed by a vacuum film forming process such as a CVD method, an ALD method, and a sputtering method, and then a photolithography method is performed to form a requested pattern. The film can be formed by preparing ink for forming the above composite metal oxide film, applying the ink on a substrate, and then firing the substrate under appropriate conditions. The method of applying the ink may be conventional methods such as spin coating, inkjet printing, slit coating, nozzle printing, gravure printing, and micro contact printing. By using appropriate printing methods and conditions, the ink can be printed only in a specified area, so that there is no need to subsequently perform a patterning procedure. An amorphous film can be formed by any of the film forming methods.

The gate insulating layer 63 and the capacitor dielectric layer 68 may be formed simultaneously if they are made with the same materials and processes.

Next, the source electrode 64 and the drain electrode 65 are formed. The materials and the processes are the same as those used for the source electrode 14 and the drain electrode 15 of the first embodiment.

Next, the first capacitor electrode 67 is formed. Various materials and processes may be used to form the first capacitor electrode 67. Examples of materials are alloys, metals such as Mo, Al, Cu, and Ru, transparent conducting oxides such as ITO and ATO, and organic conductive materials such as polyethylene dioxythiophene (PEDOT) and polyaniline (PANI). Examples of processes include forming a film by sputtering, spin coating, or dip coating, and then performing patterning by photolithography, or by performing a printing process such as inkjet printing, nano-in-printing, and gravure printing, so that a film having a requested shape is directly formed.

The source electrode 64, the drain electrode 65, and the first capacitor electrode 67 may be formed simultaneously if they are made with the same materials and processes.

Next, the semiconductor layer 66 is formed. Examples of the semiconductor layer 66 are polycrystalline silicon (p-Si), amorphous silicon (a-Si), an oxide semiconductor such as a-IGZO, and an organic semiconductor such as pentacene, although not so limited. Among these, the oxide semiconductor is preferable in consideration of the stability of the interface of the gate insulating layer 63 and the semiconductor layer 66. The process is not particularly limited. Examples of processes include forming a film by a vacuum film forming process such as sputtering, a pulse laser deposition (PLD) method, a CVD method, and an ALD method, and a solution process such as spin coating and dip coating, and then performing patterning by photolithography, or by performing a printing process such as inkjet printing, nano-in-printing, and gravure printing, so that a film having a requested shape is directly formed.

According to the above procedures, the volatile memory is formed.

From a first point of view, in the volatile memory according to the present embodiment, the composite metal oxide insulating film forming the gate insulating layer 63 has an amorphous structure, and the relative permittivity is greater than or equal to six, which is higher than that of $SiO_2$. Therefore, the leakage current can be decreased, and the volatile memory can be driven at low voltage.

From a second point of view, in the volatile memory according to the present embodiment, the composite metal oxide insulating films forming the gate insulating layer 63 and the capacitor dielectric layer 68 have amorphous structures, and the relative permittivity is greater than or equal to six, which is higher than that of $SiO_2$. Therefore, the leakage current can be mitigated, and the volatile memory can be driven at low voltage.

Figure 7:
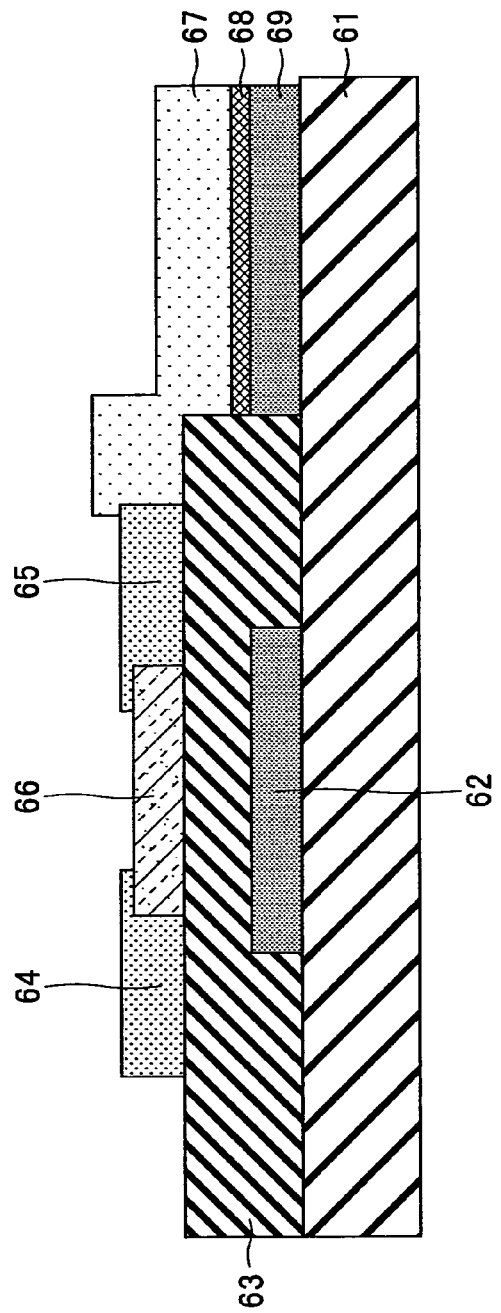
FIG. 7 illustrates another example (1) of the volatile memory according to the third embodiment of the present invention.
Figure 8:
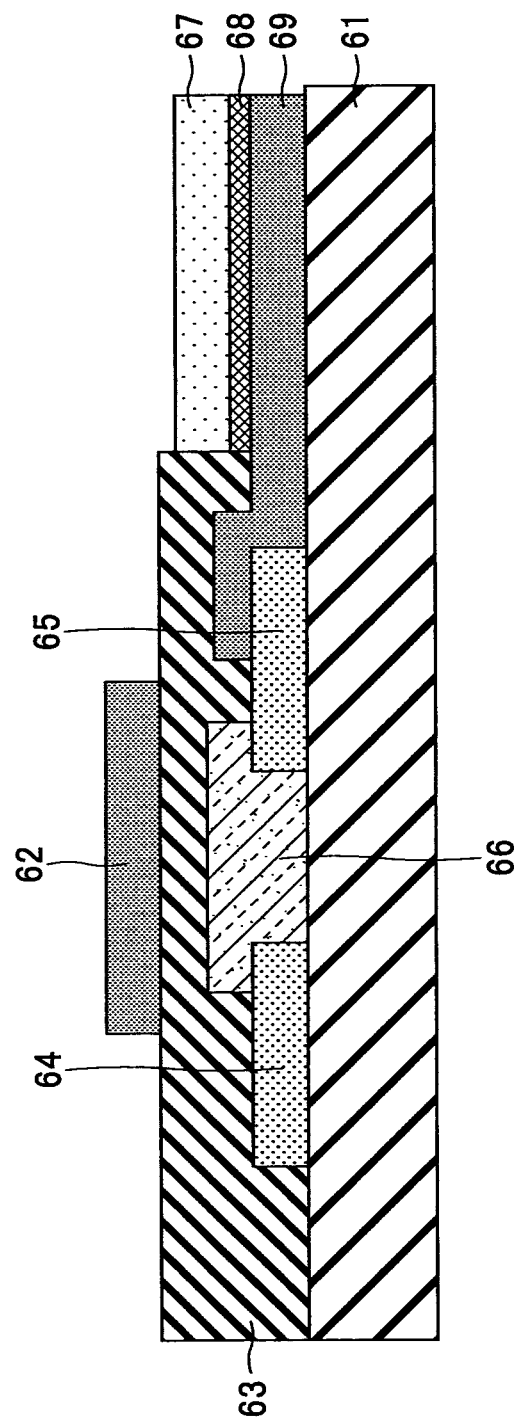
FIG. 8 illustrates yet another example (2) of the volatile memory according to the third embodiment of the present invention.
Figure 9:
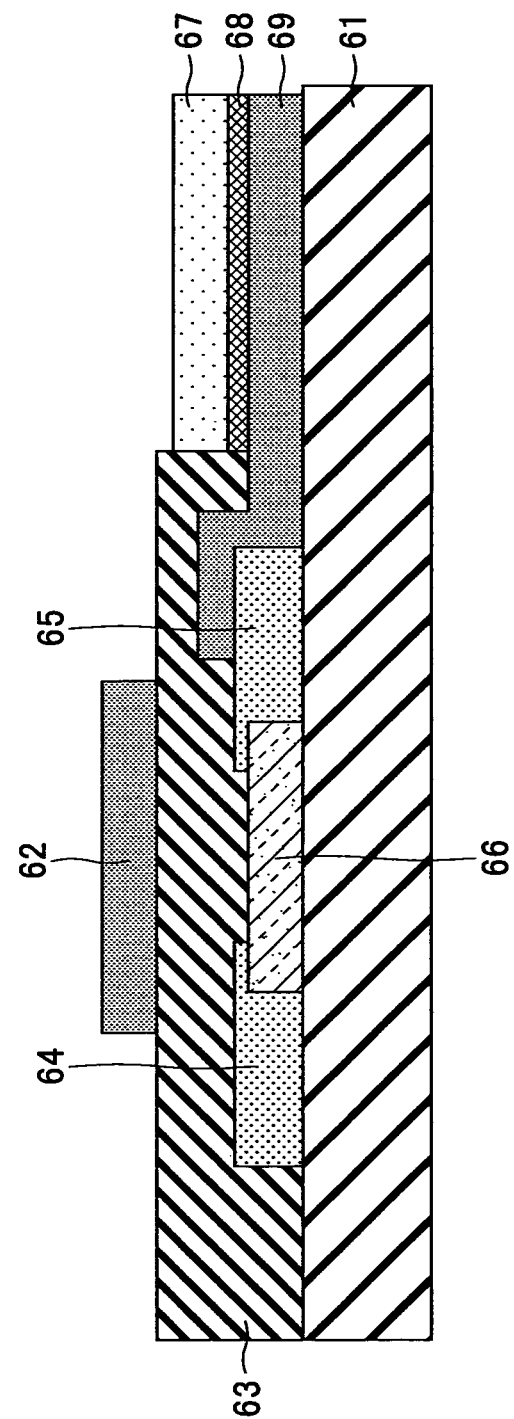
FIG. 9 illustrates yet another example (3) of the volatile memory according to the third embodiment of the present invention.

In the volatile memory (first example) shown in FIG. 6, the positional relationships of the gate electrode 62, the gate insulating layer 63, the source electrode 64, the drain electrode 65, and the semiconductor layer 66 correspond to a so-called bottom gate/bottom contact type. However, the volatile memory the present embodiment may be, for example, a bottom gate/top contact type as shown in FIG. 7, a top gate/bottom contact type as shown in FIG. 8, or a top gate/top contact type as shown in FIG. 9.

Furthermore, in the volatile memory (first example) shown in FIG. 6, the first capacitor electrode 67, the capacitor dielectric layer 68, and the second capacitor electrode 69 have planar structures; however, these elements may have three dimensional structures to increase the volume of the capacitors.

Fourth Embodiment

Figure 10:
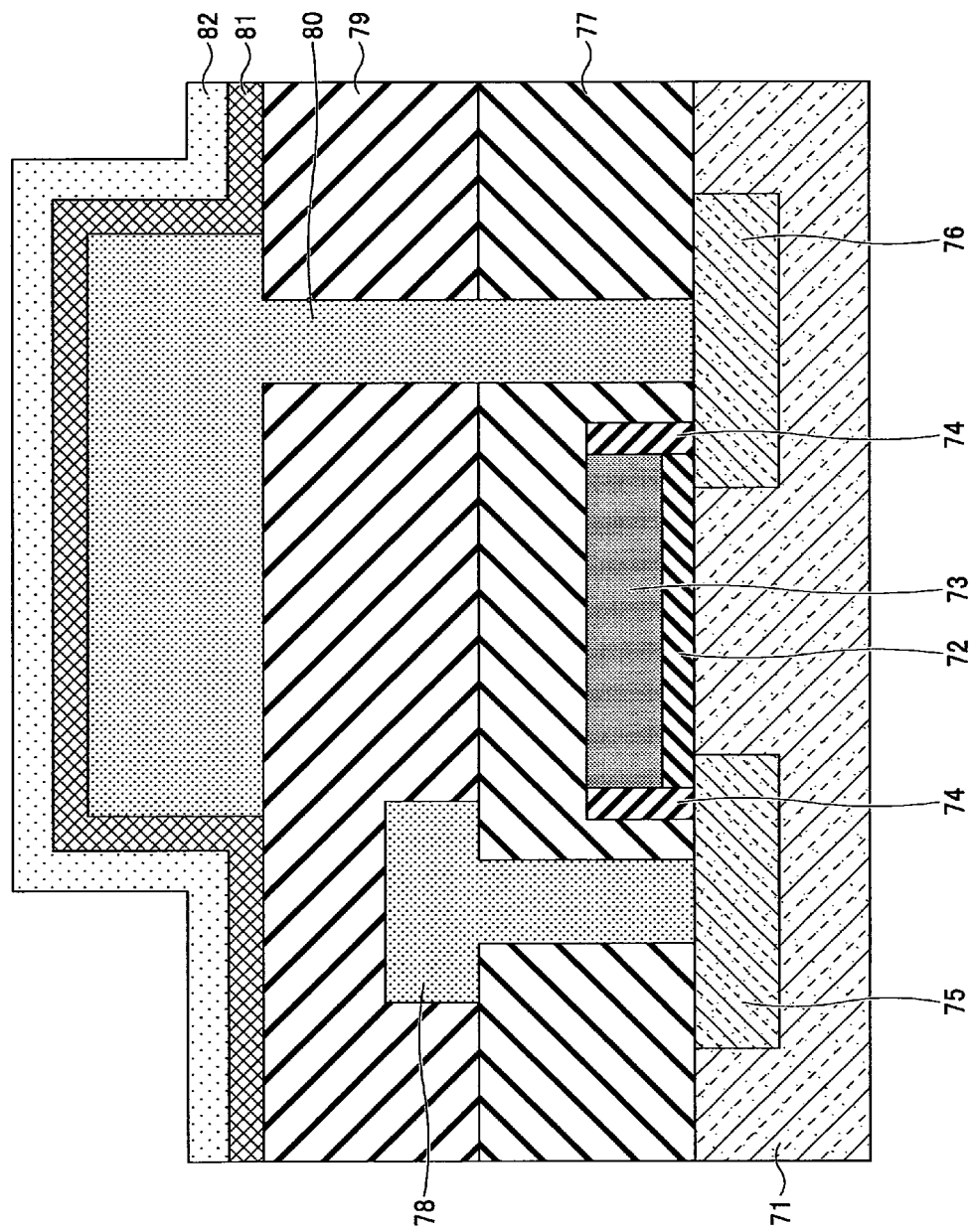
FIG. 10 illustrates a volatile memory according to a fourth embodiment of the present invention.

A description is given of a volatile semiconductor memory device (second example) according to a fourth embodiment of the present invention with reference to FIG. 10.

The volatile semiconductor memory device (second example) according to the present embodiment includes a semiconductor substrate 71, a gate insulating layer 72, a gate electrode 73, a gate side wall insulating film 74, a source area 75, a drain area 76, a first interlayer insulating film 77, a bit line electrode 78, a second interlayer insulating film 79, a first capacitor electrode 80, a capacitor dielectric layer 81, and a second capacitor electrode 82.

The semiconductor substrate 71, the gate insulating layer 72, the gate electrode 73, the gate side wall insulating film 74, the source area 75, the drain area 76, and the first interlayer insulating film 77 can be made with the same materials and processes as those of the semiconductor substrate 51, the gate insulating layer 52, the gate electrode 53, the gate side wall insulating film 54, the source area 55, the drain area 56, and the interlayer insulating film 57 of the second embodiment.

In the present embodiment, the gate insulating layer 72 is a composite metal oxide insulating film made of one or two or more alkaline-earth metal elements chosen from a group consisting of Be, Mg, Ca, Sr, Ba, and Ra; and one or two or more elements chosen from the other group consisting of Ga, Sc, Y, and lanthanoid except Ce.

The amounts of elements included in the composite metal oxide insulating film are not particularly limited. The composition can be determined so as to satisfy the respective properties required by the volatile semiconductor memory device to be manufactured, such as the dielectric constant, the dielectric loss, the thermal expansion coefficient, process compatibility, and cost. The gate insulating film according to an embodiment of the present invention may have a composition selected from a wide range, and therefore a wide range of requested specifications can be satisfied.

The process is not particularly limited. For example, a film is formed by a vacuum film forming process such as a CVD method, an ALD method, and a sputtering method, and then a photolithography method is performed to form a requested pattern. The film can be formed by preparing ink for forming the above composite metal oxide film, applying the ink on a substrate, and then firing the substrate under appropriate conditions. The method of applying the ink may be conventional methods such as spin coating, inkjet printing, slit coating, nozzle printing, gravure printing, and micro contact printing. By using appropriate printing methods and conditions, the ink can be printed only in a specified area, so that there is no need to subsequently perform a patterning procedure. An amorphous film can be formed by any of the film forming methods.

As described above, on the semiconductor substrate 71, the gate insulating layer 72, the gate electrode 73, the gate side wall insulating film 74, the source area 75, the drain area 76, and the first interlayer insulating film 77 are formed, and then the bit line electrode 78 is formed. The material and process are not particularly limited. Examples of materials are Al and Cu. Examples of processes are filling the through hole by a vacuum film forming process such as sputtering and CVD, and then performing patterning by photolithography, or by filling the through hole by CVD or a coating method, and then flattening the elements by CMP (Chemical Mechanical Polishing). A laminated body may be formed by laminating barrier metals such as TiN and TaN on the metal materials. A CVD method may be performed to form W plugs by filling the through hole with W.

Next, the second interlayer insulating film 79 is formed. The materials and processes are the same as those of the interlayer insulating film 57 of the second embodiment.

Next, the first capacitor electrode 80 is formed. The material and process are not particularly limited. Examples of materials are metal materials such as Al, Cu, and Ru, and polysilicon. Examples of processes are filling the through hole by a vacuum film forming process such as sputtering and CVD, and then performing patterning by photolithography, or by filling the through hole by CVD or a coating method, and then flattening the elements by CMP (Chemical Mechanical Polishing). A laminated body may be formed by laminating barrier metals such as TiN and TaN on the metal materials. A CVD method may be performed to form W plugs by filling the through holes with W.

Next, the capacitor dielectric layer 81 is formed. The materials of the capacitor dielectric layer 81 are not particularly limited. For example, a high dielectric oxide material including Hf, Ta, and La and a ferroelectric material such as lead zirconate titanate (PZT) and strontium bismuth tantalate (SBT) may be used. The capacitor dielectric layer 81 may be made of the insulating film according to an embodiment of the present invention, i.e., a composite metal oxide insulating film made of one or two or more alkaline-earth metal elements chosen from a group consisting of Be, Mg, Ca, Sr, Ba, and Ra; and one or two or more elements chosen from the other group consisting of Ga, Sc, Y, and lanthanoid except Ce.

The amounts of elements included in the composite metal oxide insulating film are not particularly limited. The composition can be determined so as to satisfy the respective properties required by the volatile semiconductor memory device to be manufactured, such as the dielectric constant, the dielectric loss, the thermal expansion coefficient, process compatibility, and cost. The gate insulating film according to an embodiment of the present invention may have a composition selected from a wide range, and therefore a wide range of requested specifications can be satisfied.

The process is not particularly limited. For example, a film is formed by a vacuum film forming process such as a CVD method, an ALD method, and a sputtering method, and then a photolithography method is performed to form a requested pattern. The film can be formed by preparing ink for forming the above composite metal oxide film, applying the ink on a substrate, and then firing the substrate under appropriate conditions. The method of applying the ink may be conventional methods such as spin coating, inkjet printing, slit coating, nozzle printing, gravure printing, and micro contact printing. By using appropriate printing methods and conditions, the ink can be printed only in a specified area, so that there is no need to subsequently perform a patterning procedure. An amorphous film can be formed by any of the film forming methods.

Next, the second capacitor electrode 82 is formed. The material and process are not particularly limited. Examples of materials are metal materials such as Al, Cu, and Ru, and polysilicon. Examples of processes are forming films by a vacuum film forming process such as sputtering and CVD, and then performing patterning by photolithography. A laminated body may be formed by laminating barrier metals such as TiN and TaN on the metal materials.

According to the above procedures, the volatile memory is formed.

From a first point of view, in the volatile memory according to the present embodiment, the composite metal oxide insulating film forming the gate insulating layer 72 has an amorphous structure, and the relative permittivity is greater than or equal to six, which is higher than that of $SiO_2$.

Therefore, the leakage current can be decreased, and the volatile memory can be highly integrated and can be driven at low voltage.

From a second point of view, in the volatile memory according to the present embodiment, the composite metal oxide insulating films forming the gate insulating layer 72 and the capacitor dielectric layer 81 have an amorphous structure, and the relative permittivity is greater than or equal to six, which is higher than that of $SiO_2$. Therefore, the leakage current can be decreased, and the volatile memory can be highly integrated and can be driven at low voltage.

The present embodiment describes a volatile memory having a stack type structure in which a capacitor is placed at the top of the field-effect transistor; however, the volatile memory is not so limited. For example, the volatile memory may have a trench type structure in which the capacitor is placed at the bottom of the field-effect transistor, by forming a groove (not shown) in the semiconductor substrate.

Furthermore, in the volatile memory (second example) shown in FIG. 10, the first capacitor electrode 80, the capacitor dielectric layer 81, and the second capacitor electrode 82 have planar structures; however, these elements may have three dimensional structures to increase the volume of the capacitors.

Fifth Embodiment

Figure 11:
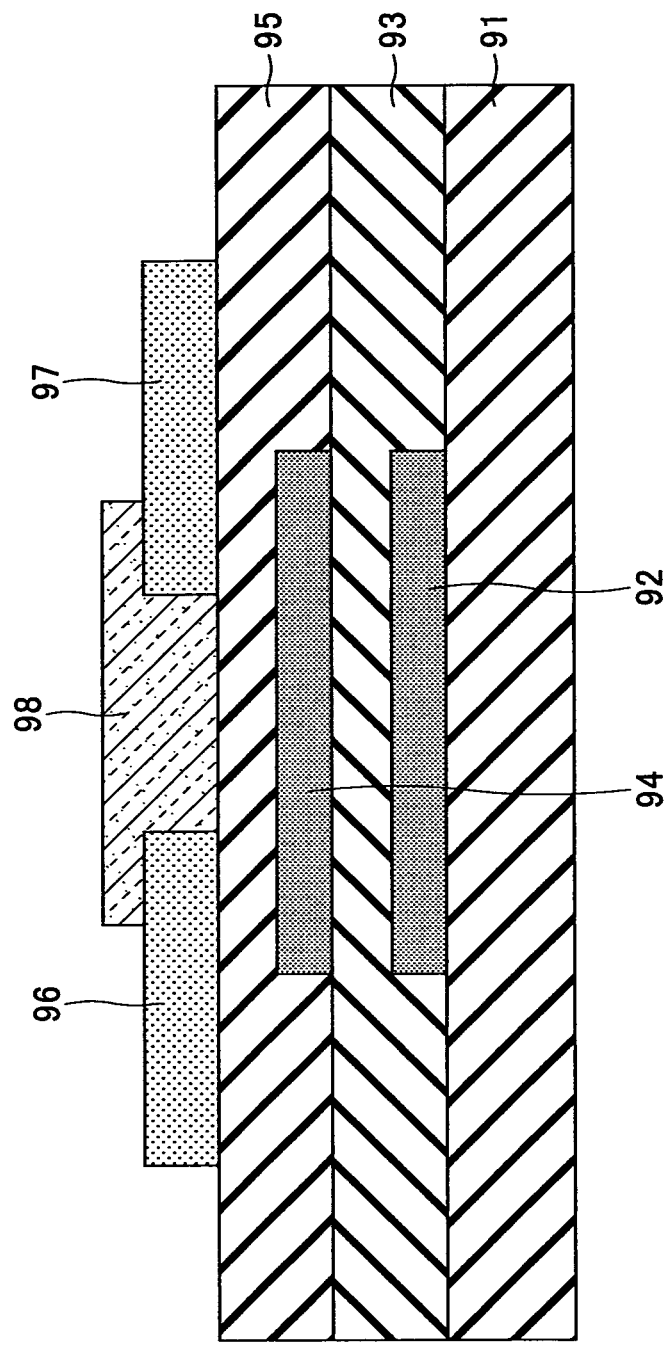
FIG. 11 illustrates a non-volatile memory according to a fifth embodiment of the present invention.

A description is given of a non-volatile semiconductor memory (first example) according to a fifth embodiment of the present invention with reference to FIG. 11.

The non-volatile semiconductor memory (first example) according to the present embodiment includes an insulating substrate 91, a gate electrode 92, a first gate insulating layer 93, a floating gate electrode 94, a second gate insulating layer 95, a source electrode 96, a drain electrode 97, and a semiconductor layer 98.

The first gate insulating layer 93 is a so-called inter-gate-electrode insulating layer, the second gate insulating layer 95 is a so-called tunnel insulating layer, and the gate electrode 92 is a so-called control gate electrode. Based on the conditions of voltage application to the source electrode 96, the drain electrode 97, and the gate electrode 92, according to a tunnel effect, electrons can be input to/output from the floating gate electrode 94 via the second gate insulating film 95 that is a tunnel insulating layer, thus functioning as a memory.

A method of forming the non-volatile semiconductor memory according to the present embodiment is described below.

First, the insulating substrate 91 is prepared. Materials are the same as those of the insulating substrate 11 of the first embodiment.

Next, the gate electrode 92 is formed on the insulating substrate 91. The materials and processes are the same as those of the gate electrode 12 of the first embodiment.

Next, the first gate insulating layer 93 is formed so as to cover the gate electrode 92. In the present embodiment, the first gate insulating layer 93 is a composite metal oxide insulating film made of one or two or more alkaline-earth metal elements chosen from a group consisting of Be, Mg, Ca, Sr, Ba, and Ra; and one or two or more elements chosen from the other group consisting of Ga, Sc, Y, and lanthanoid except Ce.

The amounts of elements included in the composite metal oxide insulating film are not particularly limited. The composition can be determined so as to satisfy the respective properties required by the non-volatile semiconductor memory device to be manufactured, such as the dielectric constant, the dielectric loss, the thermal expansion coefficient, process compatibility, and cost. The gate insulating film according to an embodiment of the present invention may have a composition selected from a wide range, and therefore a wide range of requested specifications can be satisfied.

The process is not particularly limited. For example, a film is formed by a vacuum film forming process such as a CVD method, an ALD method, and a sputtering method, and then a photolithography method is performed to form a requested pattern. The film can be formed by preparing ink for forming the above composite metal oxide film, applying the ink on a substrate, and then firing the substrate under appropriate conditions. The method of applying the ink may be conventional methods such as spin coating, inkjet printing, slit coating, nozzle printing, gravure printing, and micro contact printing. By using appropriate printing methods and conditions, the ink can be printed only in a specified area, so that there is no need to subsequently perform a patterning procedure. An amorphous film can be formed by any of the film forming methods.

Next, the floating gate electrode 94 is formed on the first gate insulating layer 93. Various materials and processes may be used to form the floating gate electrode 94. Examples of materials are alloys, metals such as Mo, Al, Cu, and Ru, transparent conducting oxides such as ITO and ATO, and organic conductive materials such as polyethylene dioxythiophene (PEDOT) and polyaniline (PANI). Examples of processes include forming a film by sputtering, spin coating, or dip coating, and then performing patterning by photolithography, or by performing a printing process such as inkjet printing, nano-in-printing, and gravure printing, so that a film having a requested shape is directly formed.

Next, the second gate insulating layer 95 is formed so as to cover the floating gate electrode 94. The material is not particularly limited; an optimum material may be appropriately selected. For the purpose of increasing the coupling ratio, an insulating material having a low dielectric constant such as $SiO_2$ or fluorinated polymer is preferably used. The process is not particularly limited. For example, a vacuum film forming process such as sputtering, CVD, and ALD, and a solution method such as spin coating, dye coating, nozzle coating, and inkjet printing for applying a liquid including metal alkoxide and a metal complex and a liquid including polymer may be appropriately used. Furthermore, a requested pattern may be formed by performing photolithography or printing.

Next, the source electrode 96 and the drain electrode 97 are formed on the second gate insulating layer 95. The materials and processes are the same as those of the source electrode 14 and the drain electrode 15 of the first embodiment.

Next, the semiconductor layer 98 is formed. The material is not particularly limited. Examples of the semiconductor layer 98 are an oxide semiconductor such as polycrystal silicon (p-Si), amorphous silicon (a-Si), and In—Ga—Zn—O, and an organic semiconductor such as pentacene, although not so limited. Among these, the oxide semiconductor is preferable. The process is not particularly limited. Examples of processes include forming a film by a vacuum film forming process such as sputtering, a pulse laser deposition (PLD) method, a CVD method, and an ALD method, and a solution process such as spin coating and dip coating, and then performing patterning by photolithography, or by performing a printing process such as inkjet printing, nanoin-printing, and gravure printing, so that a film having a requested shape is directly formed.

According to the above procedures, the non-volatile memory (first example) is formed.

In the non-volatile semiconductor memory according to the present embodiment, the composite metal oxide insulating film forming the first gate insulating layer 93 has an amorphous structure, and has a relative permittivity of approximately greater than or equal to six, which is higher than that of $SiO_2$. Therefore, the leakage current is decreased, and the voltage used for writing/erasing operations can be reduced.

Figure 12:
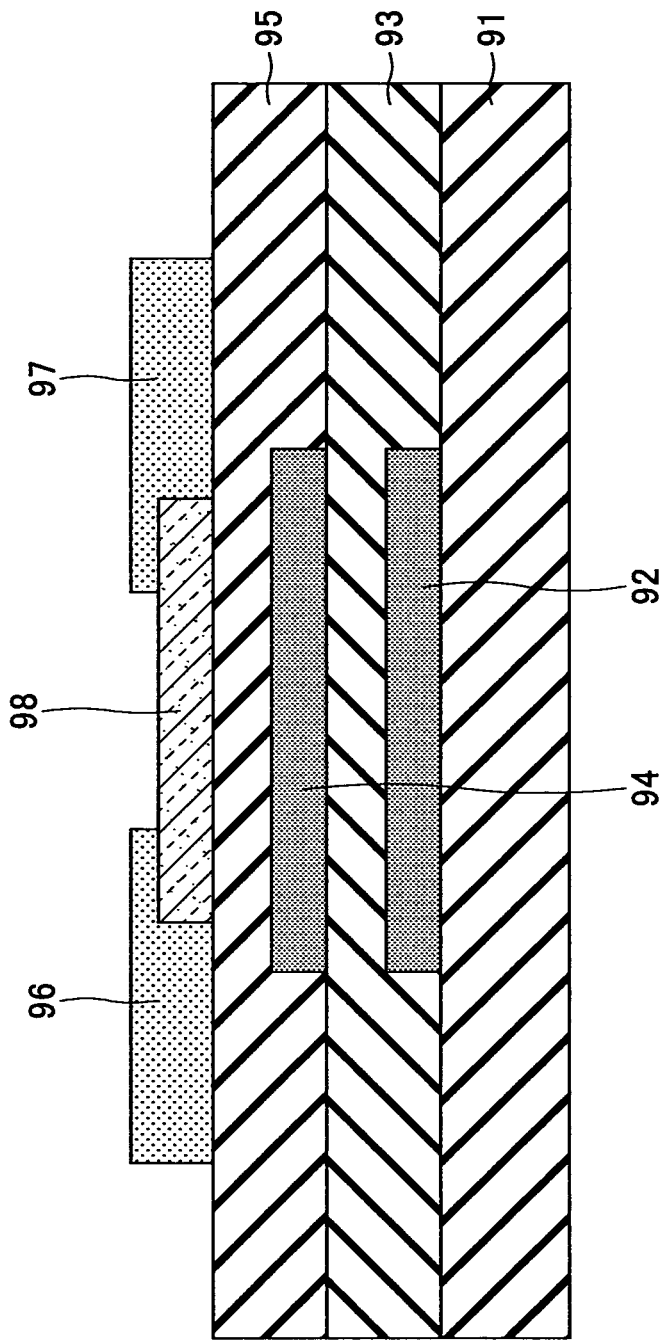
FIG. 12 illustrates another example (1) of the non-volatile memory according to the fifth embodiment of the present invention.
Figure 13:
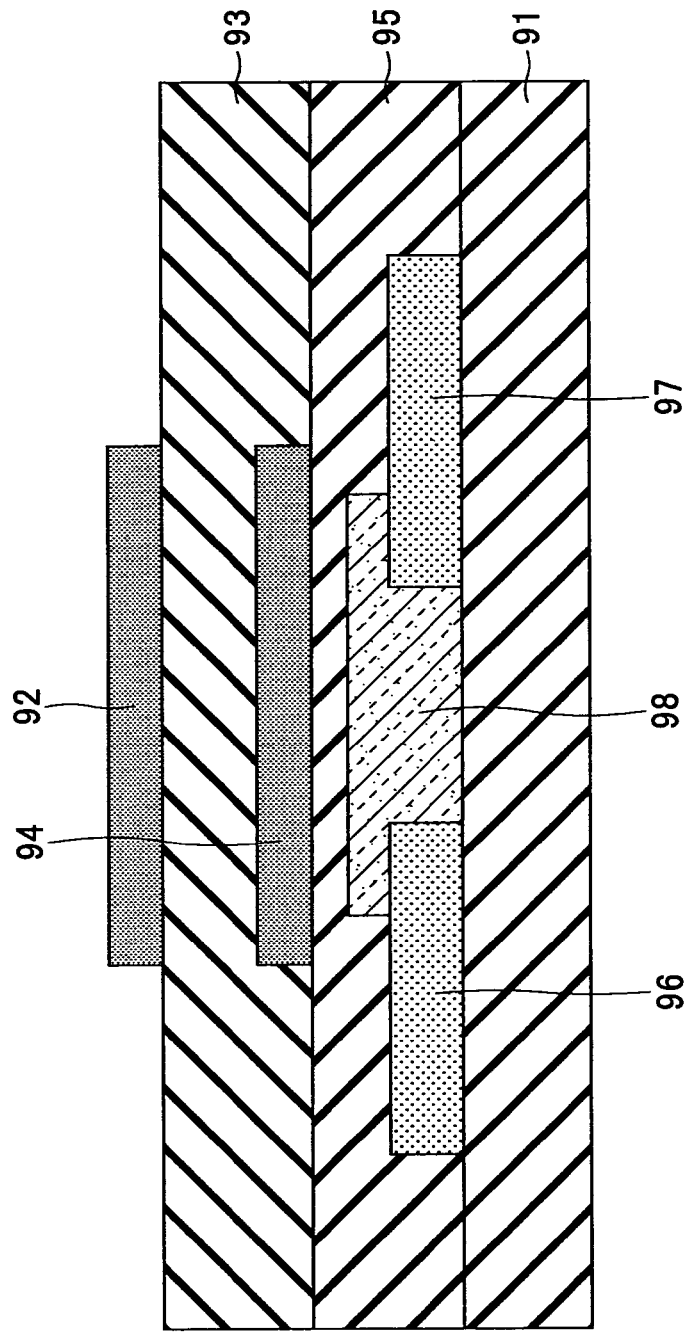
FIG. 13 illustrates yet another example (2) of the non-volatile memory according to the fifth embodiment of the present invention.
Figure 14:
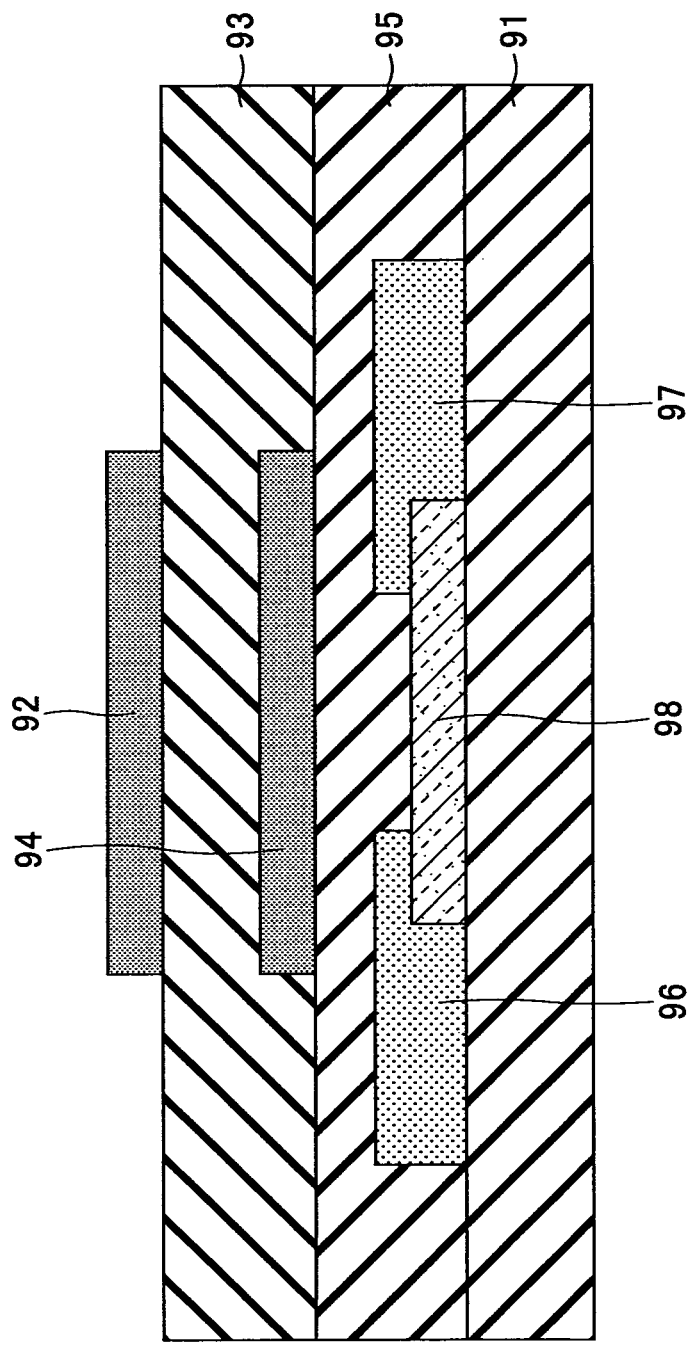
FIG. 14 illustrates yet another example (3) of the non-volatile memory according to the fifth embodiment of the present invention.

In the non-volatile memory (first example) shown in FIG. 11, the positional relationships of the gate electrode 92, the source electrode 96, the drain electrode 97, and the semiconductor layer 98 correspond to a so-called bottom gate/bottom contact type. However, the non-volatile memory of the present embodiment may be, for example, a bottom gate/top contact type as shown in FIG. 12, a top gate/bottom contact type as shown in FIG. 13, or a top gate/top contact type as shown in FIG. 14.

Furthermore, in FIGS. 11 through 14, the gate electrode 92, the first gate insulating layer 93, and the floating gate electrode 94 have planar structures; however, these elements may have three dimensional structures to increase the volume of the capacitors.

Sixth Embodiment

Figure 15:
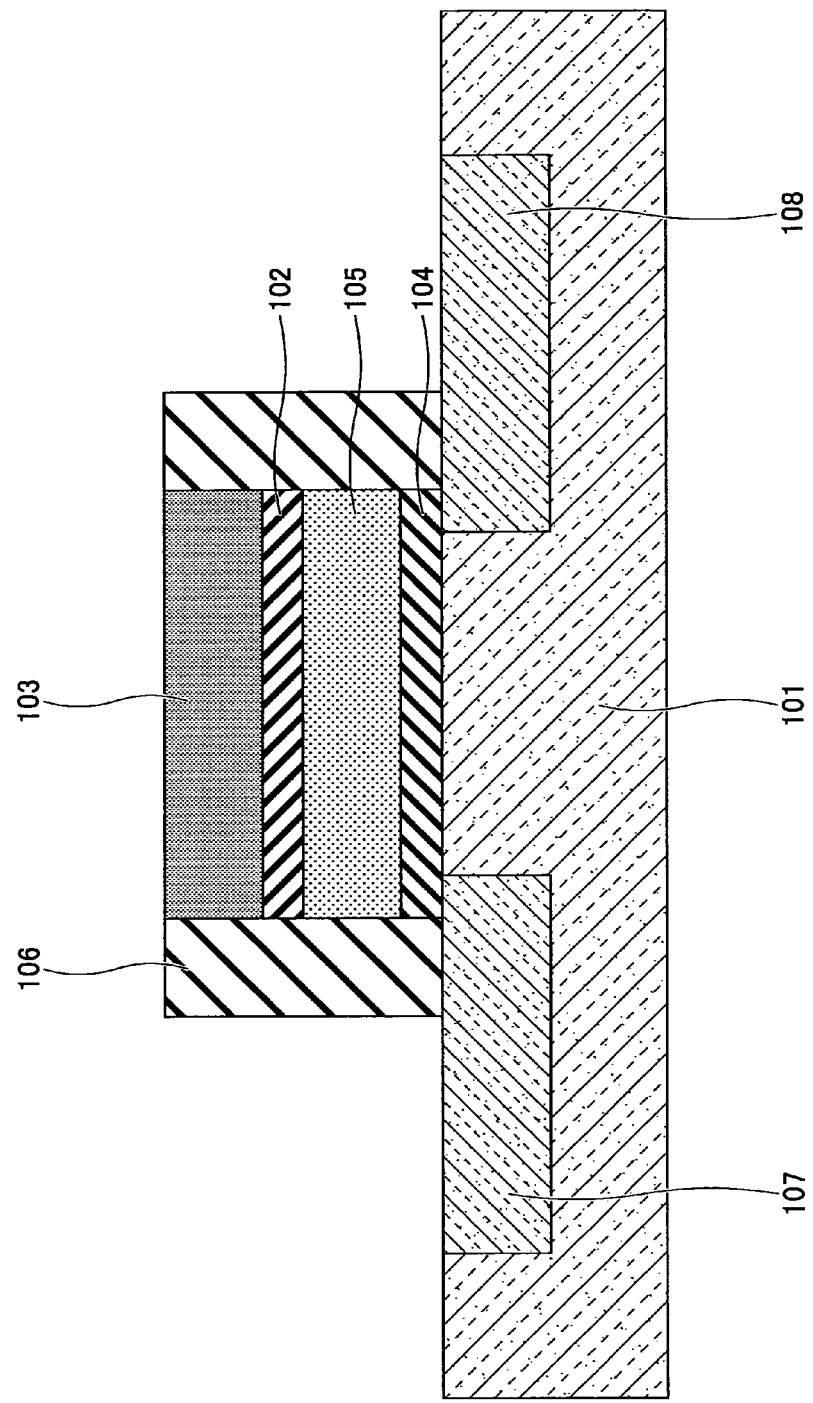
FIG. 15 illustrates a non-volatile memory according to a sixth embodiment of the present invention.

A description is given of a non-volatile semiconductor memory (second example) according to a sixth embodiment of the present invention with reference to FIG. 15.

The non-volatile semiconductor memory (second example) according to the present embodiment includes a semiconductor substrate 101, a first gate insulating layer 102, a gate electrode 103, a second gate insulating film 104, a floating gate electrode 105, a gate side wall insulating film 106, a source area 107, and a drain area 108.

The first gate insulating layer 102 is a so-called inter-gate-electrode insulating layer, the second gate insulating layer 104 is a so-called tunnel insulating layer, and the gate electrode 103 is a so-called control gate electrode. Based on the conditions of voltage application to the source area 107, the drain area 108, and the gate electrode 103, according to a tunnel effect, electrons can be input to/output from the floating gate electrode 105 via the second gate insulating film 104 that is a tunnel insulating layer, thus functioning as a memory.

A method of forming the non-volatile semiconductor memory according to the present embodiment is described below.

First, the semiconductor substrate 101 is prepared. Materials are the same as those of the semiconductor substrate 51 of the second embodiment.

Next, the second gate insulating film 104 is formed. The material is not particularly limited; one example is an insulating material having a low dielectric constant such as $SiO_2$. The process is not particularly limited; examples are a thermal oxidation method and a vacuum film forming method such as sputtering, CVD, and ALD.

Next, the floating gate electrode 105 is formed. The materials and processes are not particularly limited. Examples of materials are polysilicon, metal materials such as Al, and a laminated body, which may be formed by laminating barrier metals such as TiN and TaN laminated on those materials. Examples of processes are vacuum film forming processes such as CVD and sputtering.

Next, the first gate insulating layer 102 is formed. In the present embodiment, the first gate insulating layer 102 is a composite metal oxide insulating film made of one or two or more alkaline-earth metal elements chosen from a group consisting of Be, Mg, Ca, Sr, Ba, and Ra; and one or two or more elements chosen from the other group consisting of Ga, Sc, Y, and lanthanoid except Ce.

The amounts of elements included in the composite metal oxide insulating film are not particularly limited. The composition can be determined so as to satisfy the respective properties required by the non-volatile semiconductor memory device to be manufactured, such as the dielectric constant, the dielectric loss, the thermal expansion coefficient, process compatibility, and cost. The gate insulating film according to an embodiment of the present invention may have a composition selected from a wide range, and therefore a wide range of requested specifications can be satisfied.

The process is not particularly limited. For example, a film is formed by a vacuum film forming process such as a CVD method, an ALD method, and a sputtering method, and then a photolithography method is performed to form a requested pattern. The film can be formed by preparing ink for forming the above composite metal oxide film, applying the ink on a substrate, and then firing the substrate under appropriate conditions. The method of applying the ink may be conventional methods such as spin coating, inkjet printing, slit coating, nozzle printing, gravure printing, and micro contact printing. By using appropriate printing methods and conditions, the ink can be printed only in a specified area, so that there is no need to subsequently perform a patterning procedure. An amorphous film can be formed by any of the film forming methods.

The method of patterning the first gate insulating layer 102, the gate electrode 103, the second gate insulating film 104, and the floating gate electrode 105 is not particularly limited; for example, a requested pattern can be formed by photolithography.

Next, the gate side wall insulating film 106 is formed. The materials and processes are the same as those of the gate side wall insulating film 54 of the second embodiment. Next, ions are selectively implanted into the semiconductor substrate 101, to form the source area 107 and the drain area 108. Although not shown, there may be formed a silicide layer such as NiSi, CoSi, and TiSi on the surface of the source area 107 and the drain area 108 for the purpose of reducing the resistance.

According to the above procedures, the non-volatile memory (second example) is formed. In the non-volatile semiconductor memory according to the present embodiment, the composite metal oxide insulating film forming the first gate insulating layer 102 has an amorphous structure, and has a relative permittivity of approximately greater than or equal to six, which is higher than that of $SiO_2$. Therefore, the leakage current is decreased, and the voltage used for writing/erasing operations can be reduced.

Furthermore, in FIG. 15, the first gate insulating layer 102, the gate electrode 103, and the floating gate electrode 105 have planar structures; however, these elements may have three dimensional structures to increase the volume of the capacitors.

Seventh Embodiment

A description is given of a display element according to a seventh embodiment of the present invention with reference to FIGS. 16 through 22. The display element according to the present embodiment is an organic electro luminescence (organic EL) display element.

Figure 16:
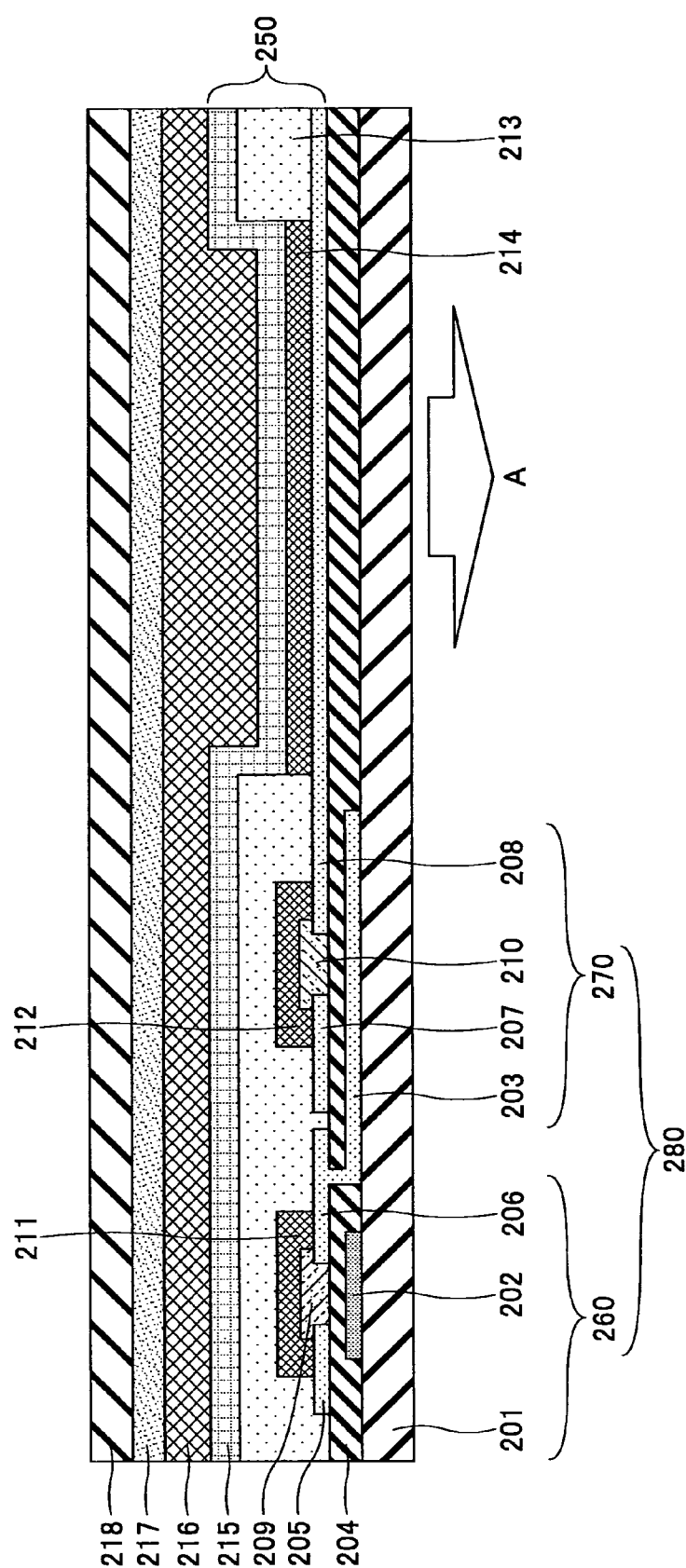
FIG. 16 illustrates an organic electro luminescence display element according to a seventh embodiment of the present invention.

A description is given of the organic EL display element according to the present embodiment, with reference to FIG. 16. The organic EL display element according to the present embodiment includes an insulating substrate 201, a first gate electrode 202, a second gate electrode 203, a gate insulating layer 204, a first source electrode 205, a first drain electrode 206, a second source electrode 207, a second drain electrode 208, a first semiconductor layer 209, a second semiconductor layer 210, a first protection layer 211, a second protection layer 212, a partition wall 213, an organic EL layer 214, an upper electrode 215, a sealing layer 216, an adhesive layer 217, and an opposing insulating substrate 218.

The organic EL display element according to the present embodiment includes an organic EL element 250 as an optical control element and a pixel driving circuit 280 including a first field-effect transistor 260 and a second field-effect transistor 270. The first field-effect transistor 260 includes the first gate electrode 202, the gate insulating layer 204, the first source electrode 205, the first drain electrode 206, the first semiconductor layer 209, and the first protection layer 211. The second field-effect transistor 270 includes the second gate electrode 203, the gate insulating layer 204, the second source electrode 207, the second drain electrode 208, the second semiconductor layer 210, and the second protection layer 212.

The pixel driving circuit 280 has a structure including two transistors and one capacitor, and the first drain electrode 206 is connected to the second gate electrode 203. In FIG. 16, as a matter of convenience, a capacitor is formed between the second source electrode 207 and the second gate electrode 203; however, the position of forming the capacitor is actually not so limited. A capacitor having the required capacitance may be appropriately designed/formed at required positions. The composite metal oxide insulating film according to an embodiment of the present invention may be used as the capacitor dielectric film. From the viewpoint of process design, the capacitor dielectric film and the gate insulating films of the two transistors are desirably formed with the same material at the same time.

Next, a description is given of a method of forming the organic EL display element according to the present embodiment.

The first field-effect transistor 260 and the second field-effect transistor 270 may be formed by the same materials and processes as those of the field-effect transistor according to the first embodiment.

In the present embodiment, the gate insulating layer 204 is a composite metal oxide insulating film made of one or two or more alkaline-earth metal elements chosen from a group consisting of Be, Mg, Ca, Sr, Ba, and Ra; and one or two or more elements chosen from the other group consisting of Ga, Sc, Y, and lanthanoid except Ce.

The amounts of elements included in the composite metal oxide insulating film are not particularly limited. The composition can be determined so as to satisfy the respective properties required by the organic EL display element to be manufactured, such as the dielectric constant, the dielectric loss, the thermal expansion coefficient, process compatibility, and cost. The gate insulating film according to an embodiment of the present invention may have a composition selected from a wide range, and therefore a wide range of requested specifications can be satisfied.

The process is not particularly limited. For example, a film is formed by a vacuum film forming process such as a CVD method, an ALD method, and a sputtering method, and then a photolithography method is performed to form a requested pattern. The film can be formed by preparing ink for forming the above composite metal oxide film, applying the ink on a substrate, and then firing the substrate under appropriate conditions. The method of applying the ink may be conventional methods such as spin coating, inkjet printing, slit coating, nozzle printing, gravure printing, and micro contact printing. By using appropriate printing methods and conditions, the ink can be printed only in a specified area, so that there is no need to subsequently perform a patterning procedure. An amorphous film can be formed by any of the film forming methods.

Various materials and processes may be used to form the first protection layer 211 and the second protection layer 212. Examples of materials are inorganic oxides and nitrides such as $SiO_2$, SiON, and $SiN_x$, and insulating materials such as fluorinated polymer. Examples of processes include forming a film by sputtering, CVD and spin coating, and then performing patterning by photolithography, or by performing a printing process such as inkjet printing, nano-in-printing, and gravure printing, so that a film having a requested shape is directly formed.

Various materials and processes may be used to form the partition wall 213. Examples of materials are inorganic oxides and nitrides such as $SiO_2$, SiON, and $SiN_x$, and insulating materials such as acrylic and polyimide. Examples of processes include forming a film by sputtering, CVD and spin coating, and then performing patterning by photolithography, or by performing a printing process such as inkjet printing, nano-in-printing, and gravure printing, so that a film having a requested shape is directly formed.

Next, a description is given of the organic EL element 250. The organic EL element 250 according to the present embodiment includes the organic EL layer 214, the upper electrode 215, and the second drain electrode 208 (lower electrode).

For example, the second drain electrode 208 is made of ITO. The second drain electrode 208 may be made of a transparent conducting oxide such as $In_2O_3$, $SnO_2$, ZnO, or a silver (Ag)-neodymium (Nd) alloy.

The organic EL layer 214 includes an electron transporting layer, a light emitting layer, and a hole transporting layer. The upper electrode 215 is connected to the electron transporting layer and the second drain electrode 208 is connected to the hole transporting layer. When a predetermined voltage is applied between the second drain electrode 208 and the upper electrode 215, holes and electrons that are implanted from the second drain electrode 208 and the upper electrode 215 are recombined in the light emitting layer, so that the luminescence centers emit light in the layer.

For example, the upper electrode 215 is made of aluminum (Al). The upper electrode 215 may be made of a magnesium (Mg)-silver (Ag) alloy, an aluminum (Al)-lithium (Li) alloy, and an ITO (Indium Tin Oxide).

The method of forming the organic EL element is not particularly limited, and may be a conventional method. For example, a film is formed by a vacuum film forming process such as a vacuum vapor-deposition method and a sputtering method, and by a solution process such as inkjet printing and nozzle printing.

After forming the pixel driving circuit 280 and the organic EL element 250, the sealing layer 216 is formed. Various materials and processes may be used to form the sealing layer 216. Examples of materials are inorganic oxides and nitrides such as $SiO_2$, SiON, and $SiN_x$. Examples of processes include a vacuum film forming method such as CVD and sputtering.

Finally, the opposing insulating substrate 218 is adhered via the adhesive layer 217 made of a material such as epoxy resin and acrylic resin, so that the organic EL display element is completed.

In the organic EL display element according to the present embodiment, when the first and second field-effect transistors are turned ON, the organic EL layer 214 emits light, so that an image is displayed from the insulating substrate 201 side as indicated by an arrow A. In this case, the insulating substrate 201, the second drain electrode 208, and the gate insulating layer 204 need to be made of transparent materials (ITO, $SiO_2$, etc.).

In the present embodiment, a description is given of a "bottom emission" type, where light is emitted from the insulating substrate 201; however, the present embodiment is not so limited. The organic EL display element may be a "top emission" type, where light is emitted from the opposing insulating substrate 218, on the opposite side to that of the arrow A. In this case for example, a high reflectance electrode such as a silver (Ag)-neodymium (Nd) alloy is used as the second drain electrode 208, and a semi-transparent electrode such as magnesium (Mg)-silver (Ag) alloy thin film is used as the upper electrode 215.

In the present embodiment, the organic EL element 250 is located next to the pixel driving circuit 280; however, the present embodiment is not so limited. For example, as shown in FIG. 17, the organic EL element 250 may be located above the pixel driving circuit 280.

Figure 17:
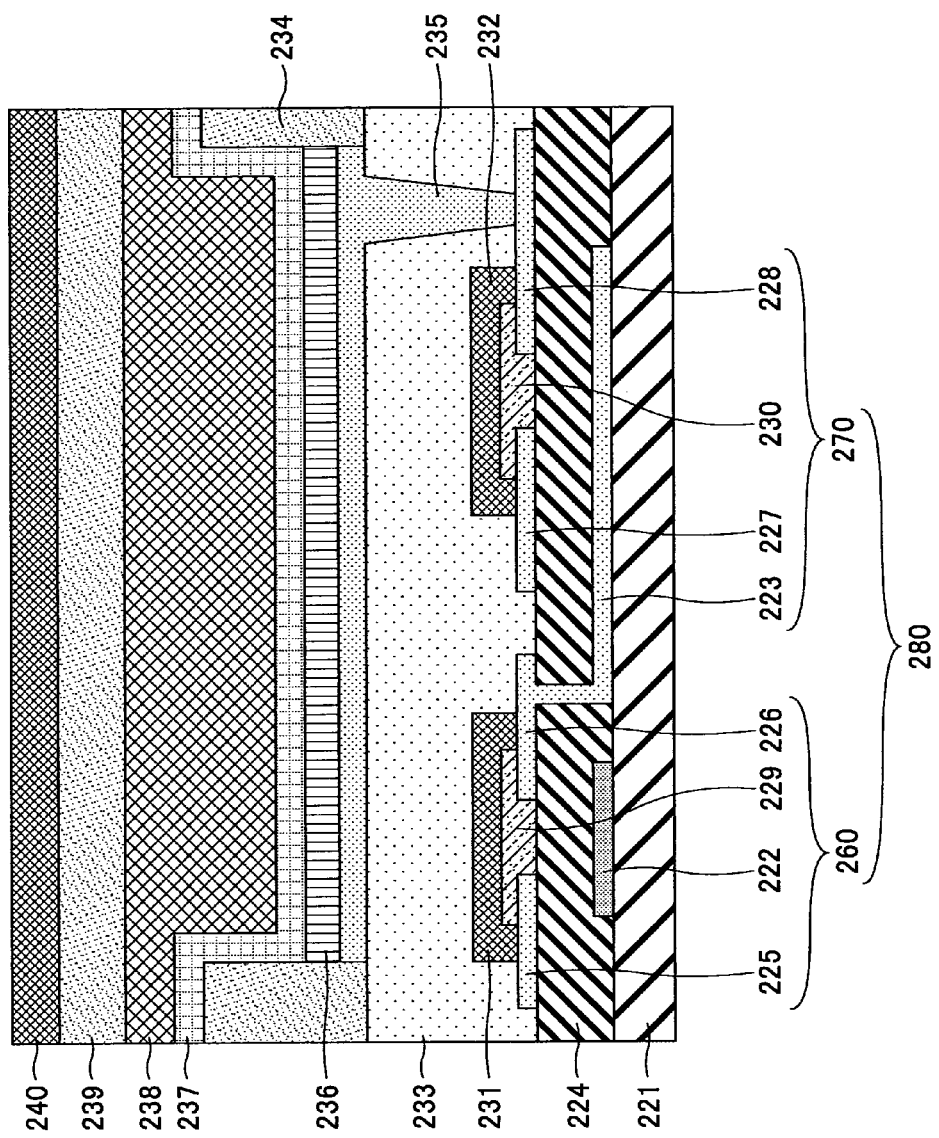
FIG. 17 illustrates another example of the organic electro luminescence display element according to the seventh embodiment of the present invention.
Figure 18:
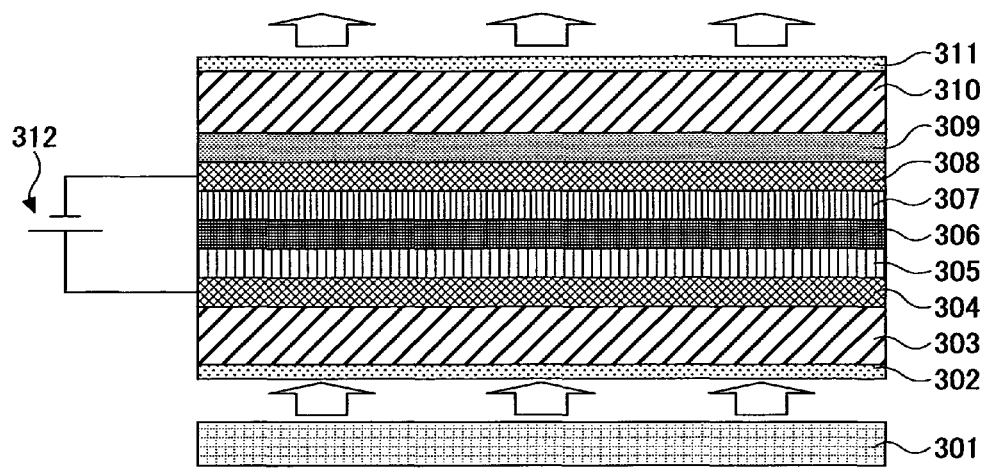
FIG. 18 illustrates a liquid crystal element used as a display element according to the seventh embodiment of the present invention.

In an organic EL display element shown in FIG. 17, on an insulating substrate 221, the first field-effect transistor 260 and the second field-effect transistor 270 are formed. The first field-effect transistor 260 includes a first gate electrode 222, a gate insulating layer 224, a first source electrode 225, a first drain electrode 226, a first semiconductor layer 229, and a first protection layer 231. The second field-effect transistor 270 includes a second gate electrode 223, the gate insulating layer 224, a second source electrode 227, a second drain electrode 228, a second semiconductor layer 230, and a second protection layer 232. An interlayer insulating film 233 is formed so as to cover the first field-effect transistor 260 and the second field-effect transistor 270. Partition walls 234 are formed on the interlayer insulating film 233. Meanwhile, the organic EL element formed on the pixel driving circuit 280 including the first field-effect transistor 260 and the second field-effect transistor 270, includes a lower electrode 235, an organic EL layer 236, and an upper electrode 237. The second drain electrode 228 and the lower electrode 235 are connected by a through hole formed in the interlayer insulating film 233. A sealing layer 238, an adhesive layer 239, and an opposing insulating substrate 240 are the same as the sealing layer 216, the adhesive layer 217, and the opposing insulating substrate 218 shown in FIG. 16.

In the present embodiment, the organic EL layer includes the electron transporting layer, the light emitting layer, and the hole transporting layer; however, the present embodiment is not so limited. For example, the electron transporting layer and the light emitting layer may be incorporated into a single layer. In another example, an electron injection layer may be provided between the electron transporting layer and the upper electrode 215. Furthermore, a hole injection layer may be provided between the hole transporting layer and the second drain electrode.

In the organic EL display element according to the present embodiment, the composite metal oxide insulating film forming the gate insulating layer 204 has an amorphous structure, and has a relative permittivity of approximately greater than or equal to six, which is higher than that of $SiO_2$.

Therefore, the leakage current is mitigated, and the organic EL display element can be operated with low power consumption.

In the above description, the pixel driving circuit driving the display elements has a structure including two transistors and one capacitor; however, the present embodiment is not so limited. The pixel driving circuit may have an optimum structure, for example four transistors and one capacitor or five transistors and two capacitors, etc. In any of these cases, the composite metal oxide insulating film according to an embodiment of the present invention may be used in both the gate insulating films of the transistor and the dielectric film of the capacitor.

The above describes an organic electro luminescence display device in which an organic EL element is used as the optical control element. However, the image display device may be a liquid crystal display device by using a liquid crystal element as the optical control element. An example of a liquid crystal element shown in FIG. 18 includes a polarization plate 302, a glass substrate 303, a transparent electrode 304, an alignment film 305, an alignment film 307, a transparent electrode 308, a color filter 309, a glass substrate 310, and a polarization plate 311. Furthermore, a liquid crystal layer 306 filled with a liquid crystal material is provided in the liquid crystal element. Furthermore, the liquid crystal element is provided with a back light system 301. A power source 312 applies a voltage between the transparent electrode. 304 and the transparent electrode 308 to control the alignment of the liquid crystal material, and to control the transmittance of light entering from the back light system 301. The liquid crystal element is driven by a voltage, and therefore the pixel driving circuit includes one transistor and one capacitor. In this case also, the composite metal oxide insulating film according to an embodiment of the present invention may be used in both the gate insulating films of the transistor and the dielectric film of the capacitor.

In the present embodiment, the display device may be a reflective display device, by using, as the optical control element (display element), an electrochromic element, an electrophoretic element, and an electrowetting element.

Figure 19:
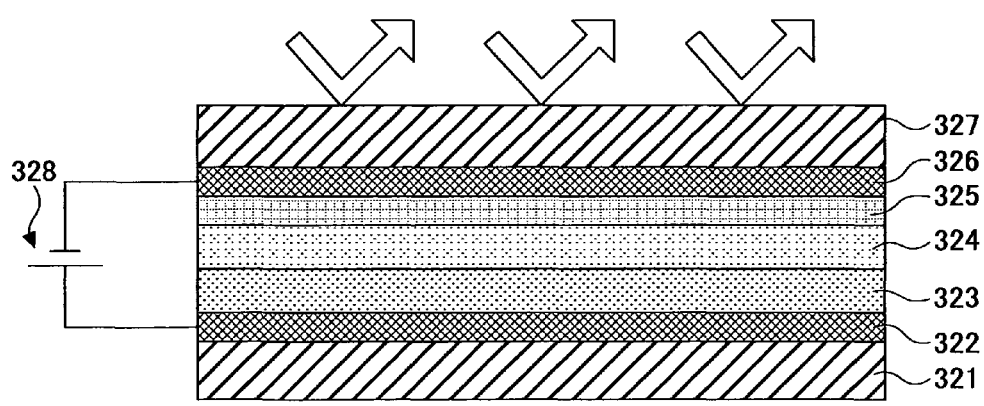
FIG. 19 illustrates an electrochromic element used as a display element according to the seventh embodiment of the present invention.

An example of an electrochromic element shown in FIG. 19 includes a glass substrate 321, a bottom electrode 322, a white reflective layer 323, an electrolyte solution or a solid electrolyte 324, an electrochromic layer 325, a top transparent electrode 326, and a glass substrate 327. When a power source 328 applies a predetermined voltage between the bottom electrode 322 and the top transparent electrode 326, the electrochromic material is reversibly oxidized or reduced, so that color is produced or erased. Accordingly, the electrochromic element functions as a display element.

Figure 20:
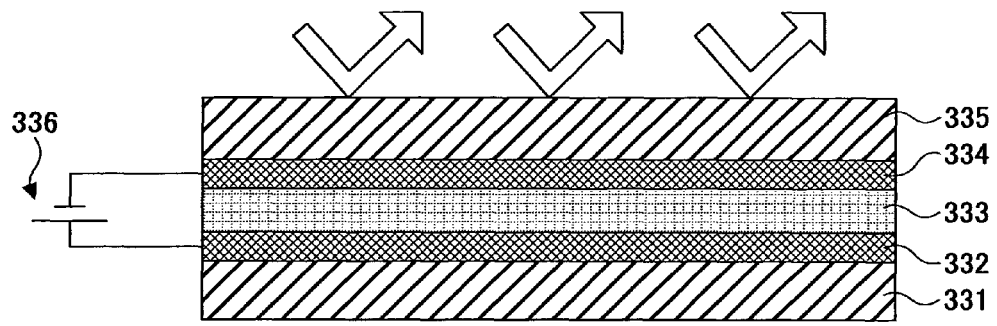
FIG. 20 illustrates an electrophoretic element used as a display element according to the seventh embodiment of the present invention.

Furthermore, an example of an electrophoretic element shown in FIG. 20 includes a glass substrate 331, a bottom electrode 332, a display layer 333, a top transparent electrode 334, and a glass substrate 335. In the display layer 333, white particles and black particles that have been charged are dispersed in a solvent. When a power source 336 applies a predetermined voltage between the bottom electrode 332 and the top transparent electrode 334, the charged particles move according to the electric field. Accordingly, the electrophoretic element functions as a display element.

Figure 21:
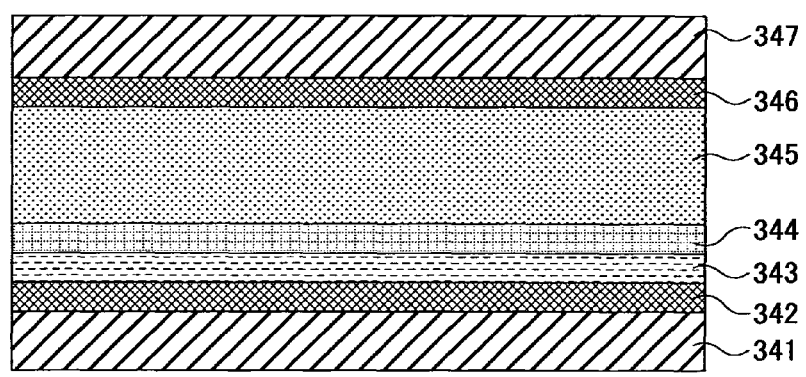
FIG. 21 illustrates an electrowetting element (1) used as a display element according to the seventh embodiment of the present invention.
Figure 22:
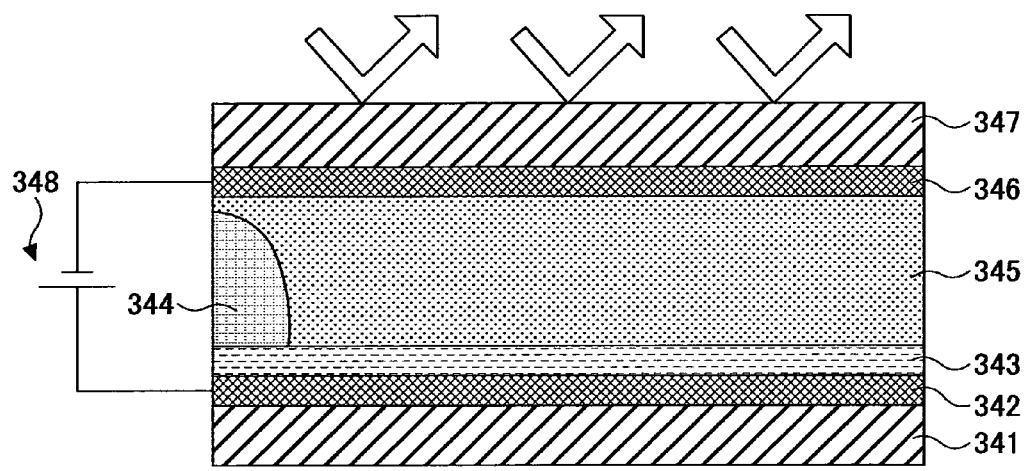
FIG. 22 illustrates the electrowetting element (2) used as a display element according to the seventh embodiment of the present invention.

Furthermore, an example of an electrowetting element shown in FIG. 21 includes a white substrate 341, a bottom transparent electrode 342, a hydrophobic insulating layer 343, an oil layer 344, an aqueous solution layer 345, a top transparent electrode 346, and a glass substrate 347. The oil layer 344 is colored, and the aqueous solution layer 345 is transparent. When the electrowetting element is turned off the color of the oil layer 344 is shown because the aqueous solution layer 345 is a translucent layer. Then, as shown in FIG. 22, when a power source 348 applies a predetermined voltage between the bottom transparent electrode 342 and the top transparent electrode 346, electric charges are generated on the surface of the hydrophobic insulating layer 343, so that the surface of the hydrophobic insulating layer 343 becomes a hydrophilic surface. That is to say, the affinity of the hydrophobic insulating layer 343 with respect to the oil layer 344 decreases, and the affinity of the hydrophobic insulating layer 343 with respect to the aqueous solution layer 345 increases. Consequently, the overall energy is reduced, so that the oil layer 344 moves in a direction such that the contact area between the oil layer 344 and the hydrophobic insulating layer 343 is minimized. Therefore, the color of the white substrate 341 is displayed. According to this principle, the electrowetting element functions as a display element.

The above-described electrochromic element, electrophoretic element, and electrowetting element may be combined with a color filter, to function as a reflective color display.

The above electrochromic element is a current-driven element, and therefore the pixel driving circuit needs to have two or more transistors and one or more capacitors, similar to the organic EL element. The electrophoretic element and electrowetting element are voltage-driven elements, and can therefore include only one transistor and one capacitor. In these cases also, the composite metal oxide insulating film according to an embodiment of the present invention may be used in both the gate insulating films of the transistor and the dielectric film of the capacitor.

Eighth Embodiment

Figure 23:
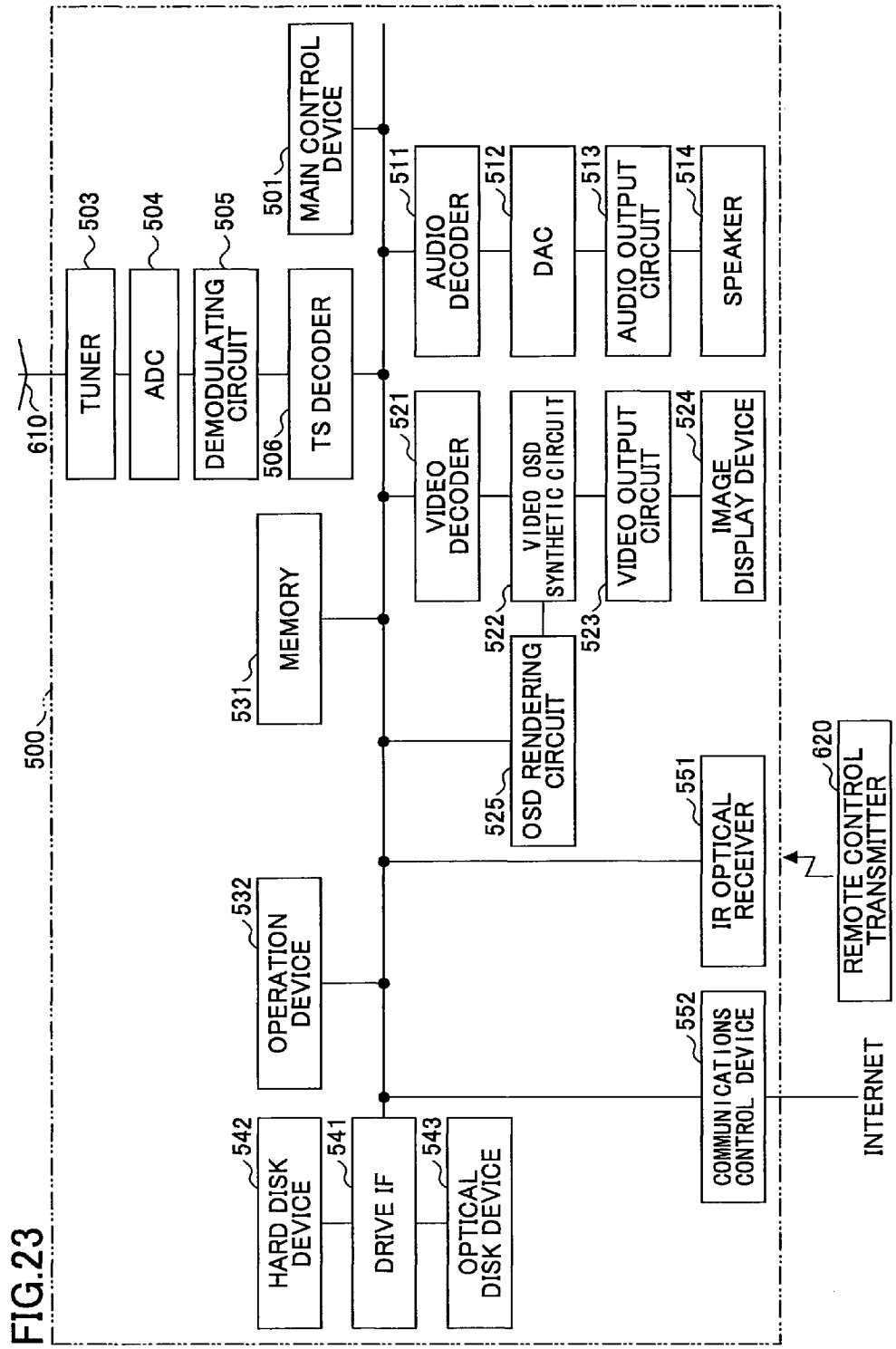
FIG. 23 is a block diagram of a television device according to an eighth embodiment of the present invention.

Next, with reference to FIGS. 23 through 31, a description is given of an image display device and a system according to an eighth embodiment of the present invention. FIG. 23 is a schematic diagram of a television device 500 that is a system according to the eighth embodiment. The connection lines in FIG. 23 indicate the flow of primary signals and information, and do not express all of the connection relationships between the blocks.

The television device 500 according to the eighth embodiment includes a main control device 501, a tuner 503, an AD converter (ADC) 504, a demodulating circuit 505, a TS (Transport Stream) decoder 506, an audio decoder 511, a DA converter (DAC) 512, an audio output circuit 513, a speaker 514, a video decoder 521, a video OSD synthetic circuit 522, a video output circuit 523, an image display device 524, an OSD rendering circuit 525, a memory 531, an operation device 532, a drive interface (drive IF) 541, a hard disk device 542, an optical disk device 543, an IR optical receiver 551, and a communications control device 552.

The main control device 501 controls the entire television device 500, and includes a CPU, a flash ROM, and a RAM. The flash ROM includes programs described by codes that can be decoded by the CPU, and various kinds of data used for processes performed by the CPU. Furthermore, the RAM is a work memory.

The tuner 503 selects to broadcast a channel that is set in advance, from among broadcast waves received with an antenna 610.

The ADC 504 converts output signals (analog information) from the tuner 503 into digital information.

The demodulating circuit 505 demodulates digital information from the ADC 504.

The TS decoder 506 performs TS-decoding on output signals from the demodulating circuit 505, and separates audio information from video information.

The audio decoder 511 decodes audio information from the TS decoder 506.

The DA converter (DAC) 512 converts output signals from the audio decoder 511 into analog signals.

The audio output circuit 513 outputs, to the speaker 514, output signals from the DA converter (DAC) 512.

The video decoder 521 decodes video information from the TS decoder 506.

The video OSD synthetic circuit 522 combines output signals from the video decoder 521 with output signals from the OSD rendering circuit 525.

The video output circuit 523 outputs, to the image display device 524, output signals from the video OSD synthetic circuit 522.

The OSD rendering circuit 525 includes a character generator for displaying characters and figures on a display screen of the image display device 524, and generates signals including display information in accordance with instructions from the operation device 532 and the IR optical receiver 551.

The memory 531 is used for temporarily storing AV (Audio-Visual) data.

The operation device 532 includes an input medium (not shown) such as a control panel, and receives various information items input by a user and reports the various information items to the main control device 501.

The drive IF 541 is a bidirectional communications interface, and conforms to, for example, ATAPI (AT Attachment Packet Interface).

The hard disk device 542 includes a hard disk and a driving device for driving this hard disk. The driving device records data in the hard disk and reproduces data recorded in the hard disk.

The optical disk device 543 records data in an optical disk (for example, a DVD), and reproduces data recorded in an optical disk.

The IR optical receiver 551 receives optical signals from a remote control transmitter 620, and reports the optical signals to the main control device 501.

The communications control device 552 controls communications with the Internet. The communications control device 552 can acquire various information items via the Internet.

Figure 24:
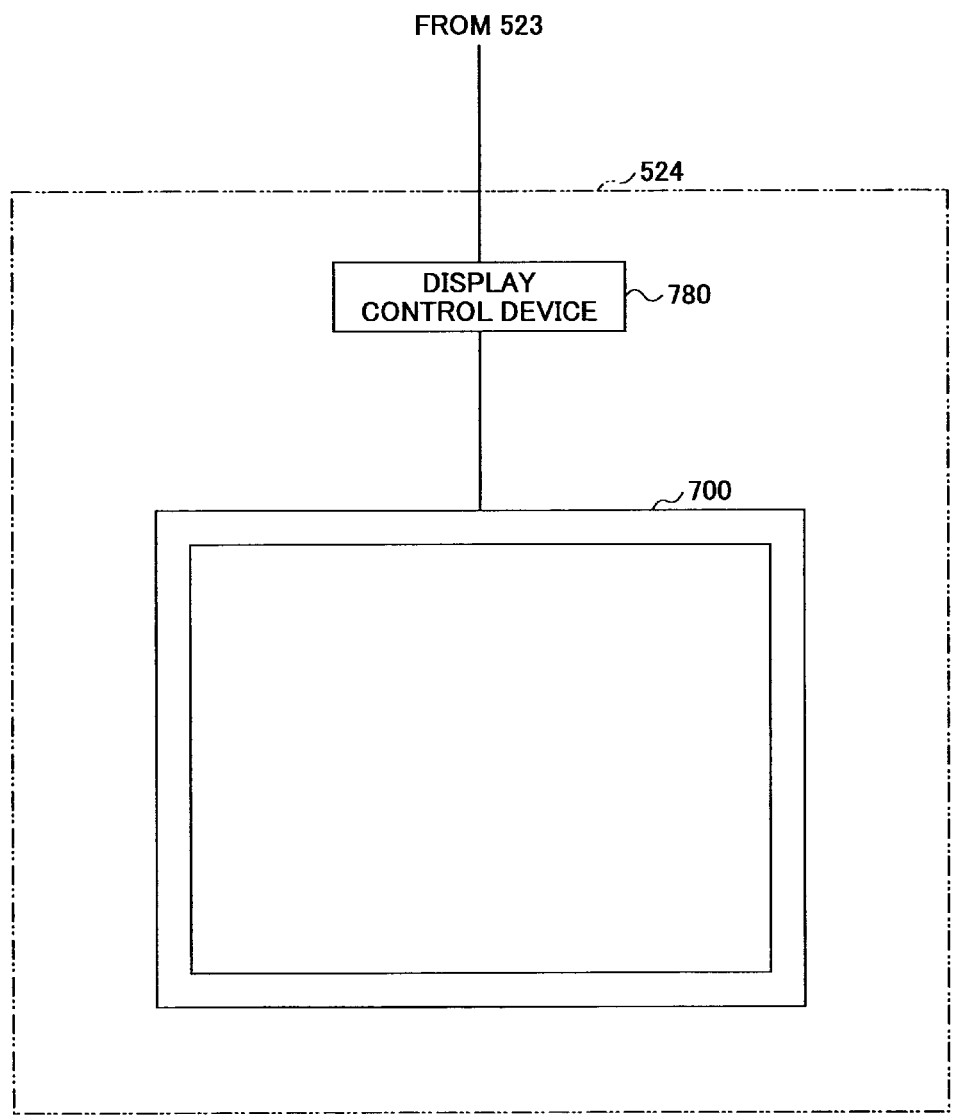
FIG. 24 is for describing the television device according to the eighth embodiment of the present invention (1)

The image display device 524 includes an indicator 700 and a display control device 780, as shown in FIG. 24.

Figure 25:
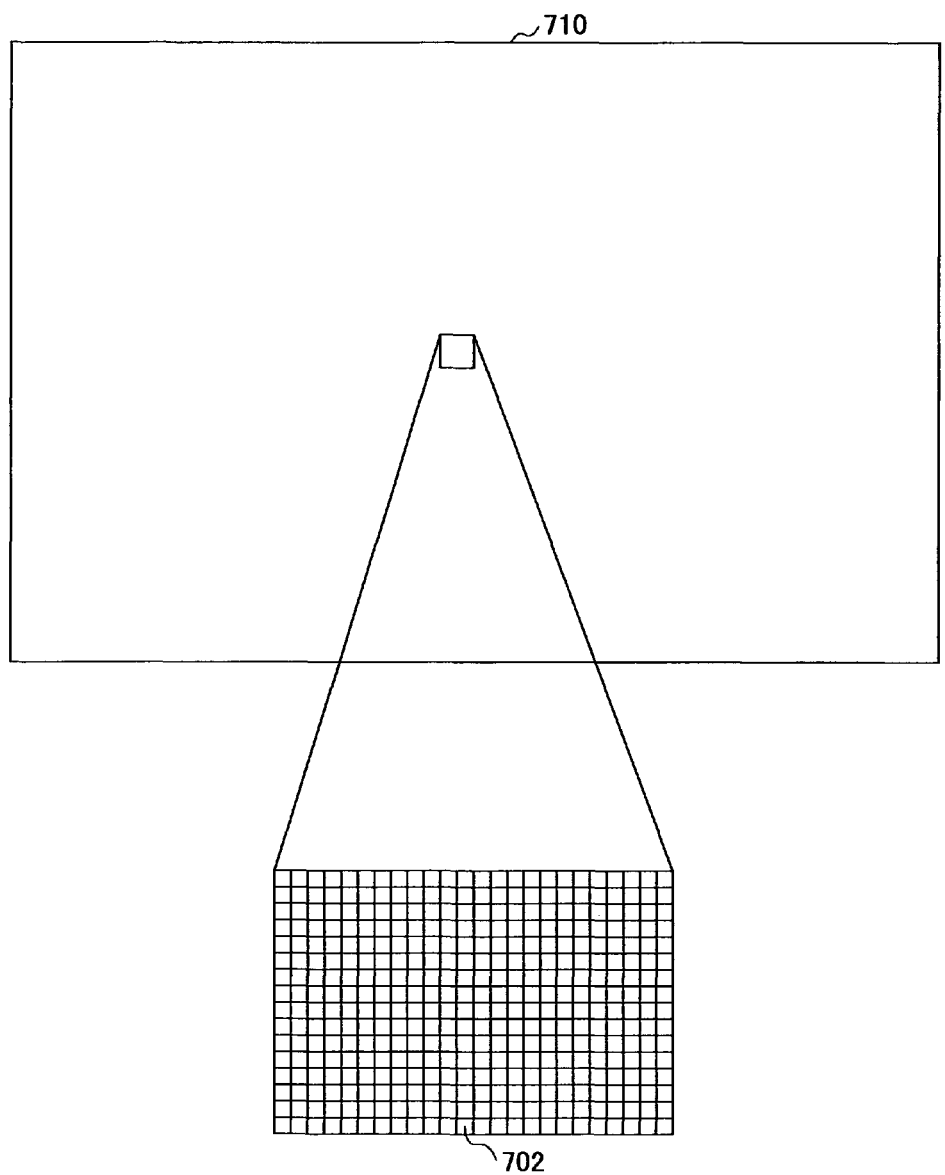
FIG. 25 is for describing the television device according to the eighth embodiment of the present invention (2)

As shown in FIG. 25, the indicator 700 includes a display 710 in which plural (n×m) display elements 702 are arranged in a matrix.

As shown in FIG. 26, the display 710 includes an n number of scanning lines (X0, X1, X2, X3, . . . , Xn−2, Xn−1) arranged equidistantly along an X axis direction, an m number of data lines (Y0, Y1, Y2, Y3, . . . , Ym−1) arranged equidistantly along a Y axis direction, and an m number of current supplying lines (Y0$i$, Y1$i$, Y2$i$, Y3$i$, . . . , Ym−1$i$) arranged equidistantly along the Y axis direction. The display elements 702 can be identified by using the scanning lines and data lines.

Figure 27:
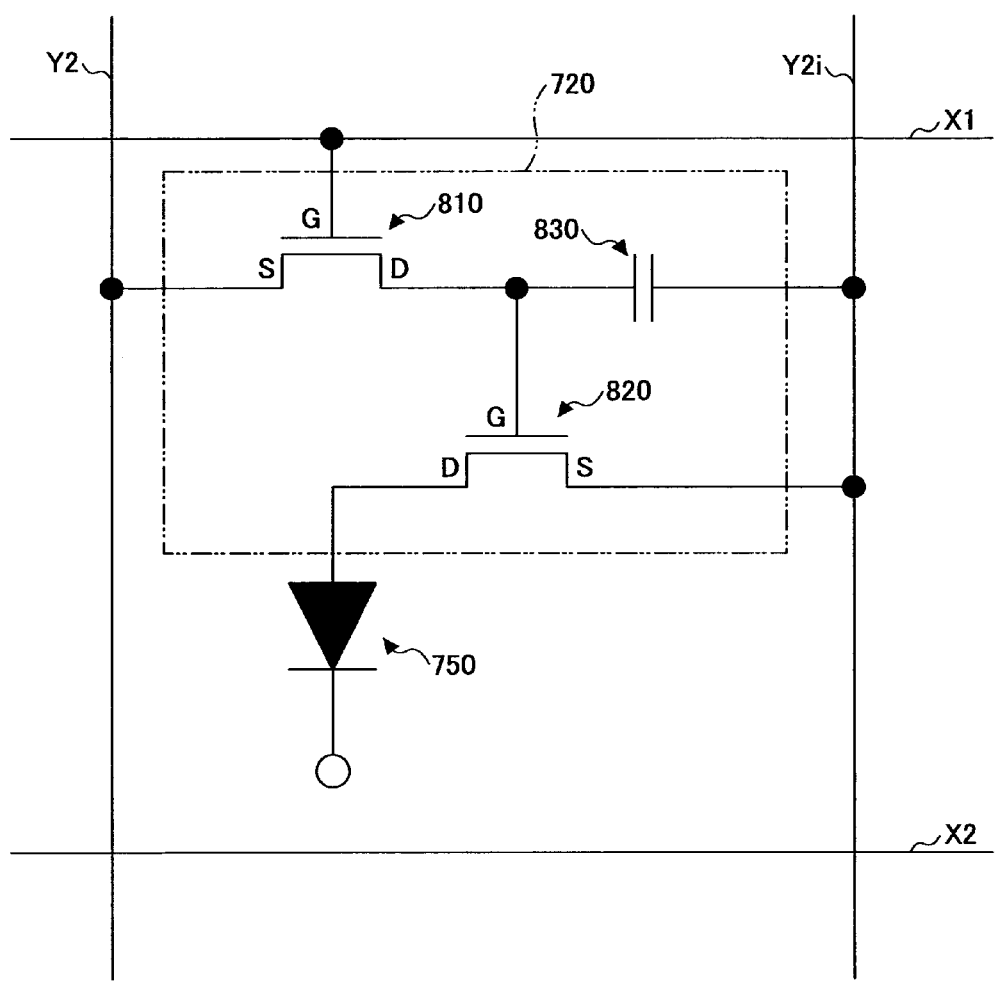
FIG. 27 is for describing a display element according to the eighth embodiment of the present invention.

As shown in FIG. 27, each of the display elements 702 includes an organic EL (electro luminescence) element 750, and a pixel drive circuit 720 for causing the organic EL element 750 to emit light. That is to say, the display 710 is a so-called active matrix type organic EL display. Furthermore, the display 710 is a color 32 inch display. However, the size of the display 710 is not so limited.

Figure 28:
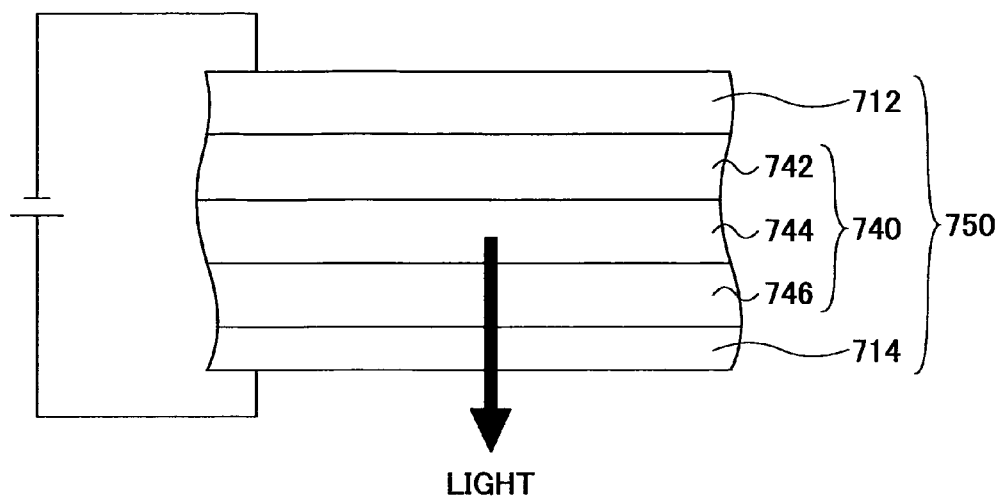
FIG. 28 is for describing an organic EL element according to the eighth embodiment of the present invention.

As shown in FIG. 28, the organic EL element 750 includes an organic EL thin film layer 740, a cathode 712, and an anode 714.

The cathode 712 is made of aluminum (Al). The cathode 712 may also be made of a magnesium (Mg)-silver (Ag) alloy, an aluminum (Al)-lithium (Li) alloy, and ITO (Indium Tin Oxide).

The anode 714 is made of ITO. The anode 714 may also be made of a transparent conducting oxide such as $In_2O_3$, $SnO_2$, and ZnO, and a silver (Ag)-neodymium (Nd) alloy.

The organic EL layer 740 includes an electron transporting layer 742, a light emitting layer 744, and a hole transporting layer 746. The cathode 712 is connected to the electron transporting layer 742 and the anode 714 is connected to the hole transporting layer 746. When a predetermined voltage is applied between the anode 714 and the cathode 712, the light emitting layer 744 emits light.

Furthermore, as shown in FIG. 27, the pixel drive circuit 720 includes two field-effect transistors 810 and 820, and a capacitor 830.

The field-effect transistor 810 operates as a switch element. A gate electrode G is connected to a predetermined scanning line, and a source electrode S is connected to a predetermined data line. Furthermore, a drain electrode D is connected to one of the terminals of the capacitor 830.

The capacitor 830 is for recording data relevant to the state of the field-effect transistor 810. The other terminal of the capacitor 830 is connected to a predetermined current supplying line.

The field-effect transistor 820 is for supplying large currents to the organic EL element 750. The gate electrode G of the field-effect transistor 820 is connected to the drain electrode D of the field-effect transistor 810. A drain electrode D of the field-effect transistor 820 is connected to the anode 714 of the organic EL element 750. A source electrode S of the field-effect transistor 820 is connected to a predetermined current supplying line.

When the field-effect transistor 810 is turned on, the organic EL element 750 is driven by the field-effect transistor 820.

Figure 29:
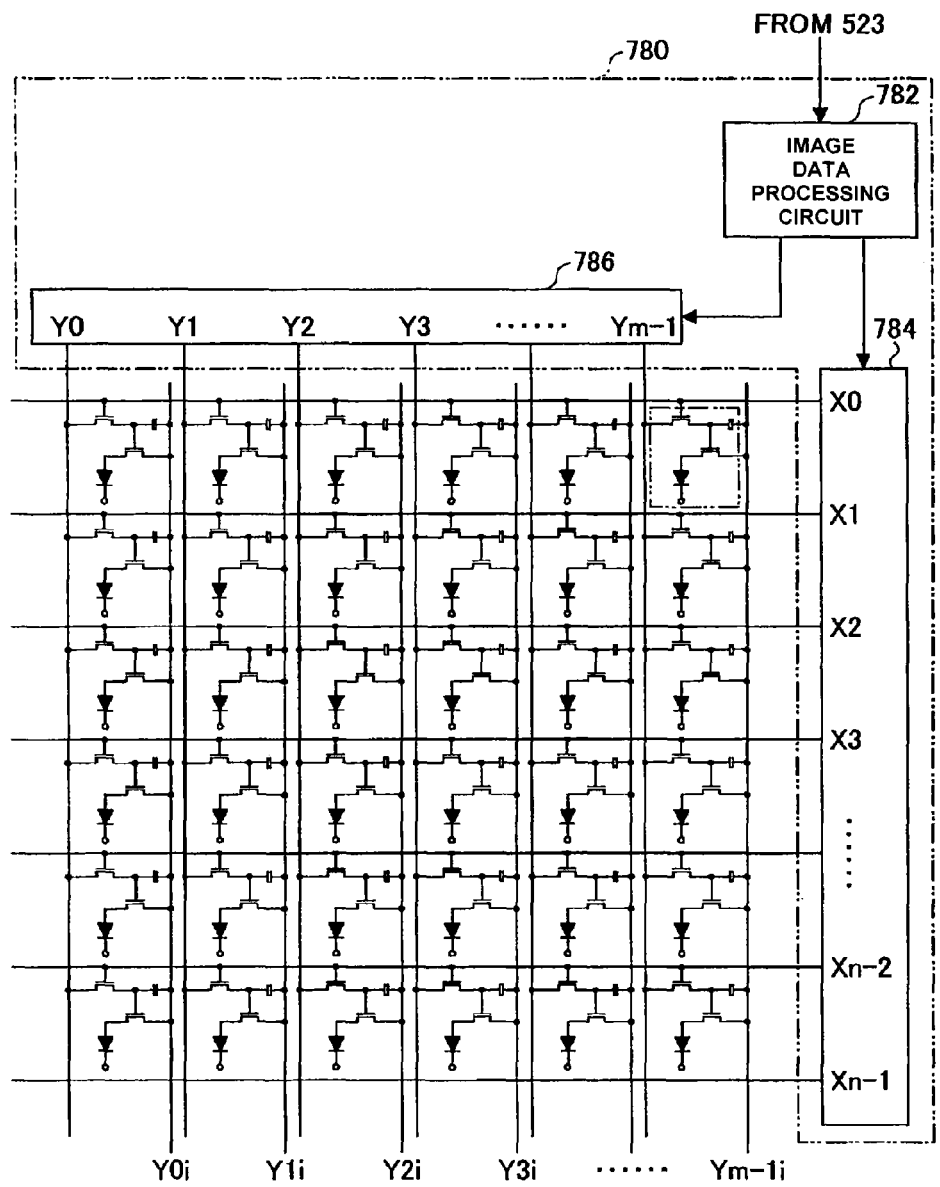
FIG. 29 is for describing the television device according to the eighth embodiment of the present invention (4)

As shown in FIG. 29, the display control device 780 includes an image data processing circuit 782, a scanning line driving circuit 784, and a data line driving circuit 786.

The image data processing circuit 782 determines the luminance of plural display elements 702 in the display 710, based on output signals from the video output circuit 523.

The scanning line driving circuit 784 separately applies a voltage to each of the n scanning lines in response to an instruction from the image data processing circuit 782.

The data line driving circuit 786 separately applies a voltage to each of the m data lines in response to an instruction from the image data processing circuit 782.

As apparent from the above description, the television device 500 according to the present embodiment has an image data creating device including the video decoder 521, the video OSD synthetic circuit 522, the video output circuit 523, and the OSD rendering circuit 525.

In the above description, the optical control element is an organic EL element; however, the present invention is not so limited. The optical control element may be a liquid crystal element, an electrochromic element, an electrophoretic element, and an electrowetting element.

Figure 30:
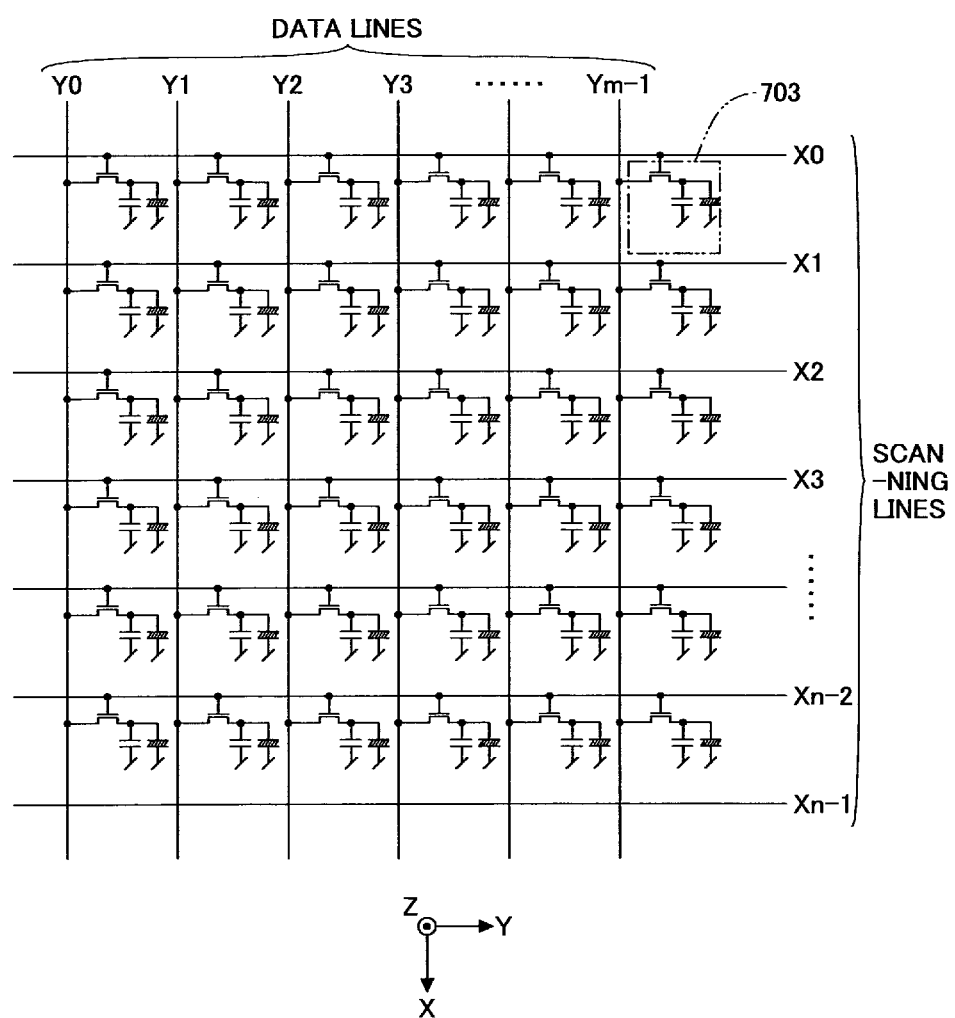
FIG. 30 is for describing another example (1) of the display element according to the eighth embodiment of the present invention.

For example, when the optical control element is a liquid crystal element, a liquid crystal display of an active matrix method is used as the display 710. In this case, the liquid crystal element is a voltage-driven element, and therefore there is no need to have current supplying lines as shown in FIG. 30.

Figure 31:
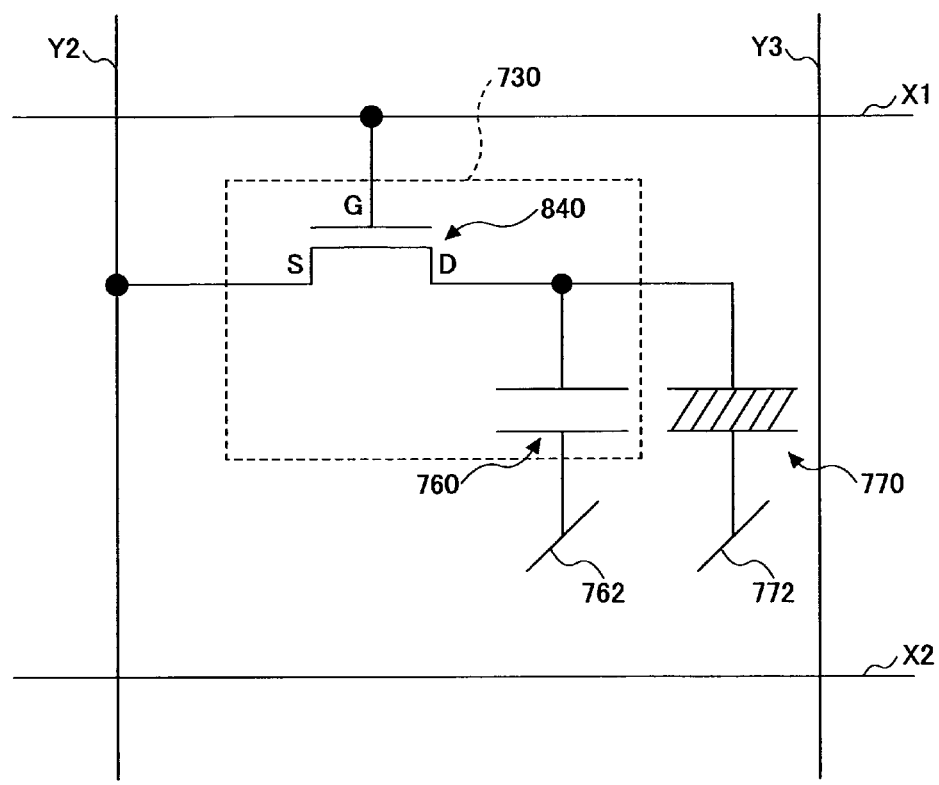
FIG. 31 is for describing yet another example (2) of the display element according to the eighth embodiment of the present invention.

An example of such a display element is shown in FIG. 31. Specifically, a pixel drive circuit 730 may include only one field-effect transistor 840 and only one capacitor 760. In the field-effect transistor 840, a gate electrode G is connected to a predetermined scanning line and a source electrode S is connected to a predetermined data line. Furthermore, a drain electrode D is connected to a pixel electrode of a liquid crystal element 770 and the capacitor 760. In FIG. 31, 762 and 772 denote opposite electrodes (common electrodes) of the capacitor 760 and the liquid crystal element 770, respectively.

The field-effect transistor according to the first embodiment is used as the field-effect transistors 810, 820, and 840 in the present embodiment. Therefore, a low-power consuming and high-performance television device is attained.

The dielectric films of the capacitors 760 and 830 according to the present embodiment are preferably formed by the same process and at the same time as the gate insulating film of the field-effect transistor according to an embodiment of the present invention. In this case, the relative permittivity of the capacitor insulating film is high, and therefore even if the area is small, it is possible to attain the same capacitance as the case where a conventional insulating film is used. Accordingly, it is possible to provide a display in which the pixel area is reduced and the display resolution is increased, or a display in which the aperture ratio of the pixel is increased and the luminance is increased.

Furthermore, the field-effect transistor according to the first embodiment and the volatile memory according to the third embodiment can be used in the image data processing circuit 782, the scanning line driving circuit 784, and the data line driving circuit 786 included in the display control device 780. Accordingly, it is possible to form the indicator 700 including the display 710 in which the display elements 702 are arranged in a matrix, and the display control device 780 on the same plane, and therefore a low-cost television device can be provided.

In the above-described embodiment, the system is a television device; however, the present embodiment is not so limited, as long as the image display device 524 is included as the device for displaying images and information. For example, the system may be a computer system in which a computer (may be a personal computer) and the image display device 524 are connected to each other.

Furthermore, the image display device 524 may be used as display means in portable information devices such as a mobile phone, a mobile music player, a mobile video player, an electronic book, and a PDA (Personal Digital Assistant), or in imaging devices such as a still camera and a video camera. Furthermore, the image display device 524 may be used as display means for various information items in mobile systems of vehicles, airplanes, trains, and ships. Furthermore, the image display device 524 may be used as display means for various information items in measurement devices, analyzing devices, medical equipment, and advertisement media.

The field-effect transistors, the volatile memories, and the non-volatile memories according to the first through sixth embodiments may also be applied to devices (e.g., an IC card and an ID tag) other than a display device or an image display device.

EXAMPLES

Example 1

As example 1, a description is given of a field-effect transistor according to an embodiment of the present invention. With reference to FIG. 2, a description is given of a method of manufacturing the field-effect transistor formed according to example 1.

First, the gate electrode 22 was formed to deposit a molybdenum (Mo) film via a metal mask on the insulating substrate 21 made of alkali-free glass by a DC magnetron sputtering method. Thickness of the film was 100 nm.

Next, the gate insulating layer 23 was formed. A magnesium lanthanum composite oxide insulating film was deposited by CVD method. A raw material was made by dissolving La(thd)$_3$ and Mg(thd)$_2$ (thd=2,2,6,6-tetramethyl-3,5-heptanedionato) in solvents of tetraethylene glycol dimethyl ether (tetraglyme) and tetrahydrofuran (THF), respectively. The thickness of the insulating film is 200 nm.

Next, a magnesium indium oxide film as the semiconductor layer 24 was formed via a metal mask on the gate insulator by a DC magnetron sputtering method at room temperature. The target was an MgIn$_2$O$_4$ sintered body and the sputtering gas was the mixture of argon and oxygen. The thickness of the formed semiconductor layer 24 was approximately 100 nm.

Next, an aluminum film as the source electrode 25 and the drain electrode 26 was formed by vacuum vapor deposition with the use of a metal mask. Accordingly, the source electrode 25 and the drain electrode 26 were formed only in predetermined areas. Furthermore, the thicknesses of the source electrode 25 and the drain electrode 26 were approximately 100 nm, so that the channel length was approximately 50 μm and the channel width was approximately 400 μm.

Next, the semiconductor layer was subjected to a heating process in air at 300° C. for one hour.

Accordingly, the field-effect transistor of example 1 was formed.

Comparative Example 1

Next, as a comparative example 1, a description is given of a field-effect transistor having a conventional structure, with reference to FIG. 2. The difference between the field-effect transistor according to example 1 and the field-effect transistor according to comparative example 1 is that the method of forming the gate insulating layer 23 is different; as for the other layers, the same manufacturing method and materials were used.

The gate electrode 22 was formed on the insulating substrate 21 by the same method as that of example 1. Next, a SiO$_2$ film having a thickness of 200 nm was formed by a RF sputtering method in conventional condition, to form the gate insulating layer 23. Next, by the same method as that of example 1, the semiconductor layer 24, the source electrode 25, and the drain electrode 26 were formed and subsequently annealed, thereby forming the field-effect transistor according to comparative example 1.

Example 1 and Comparative Example 1

Figure 32:
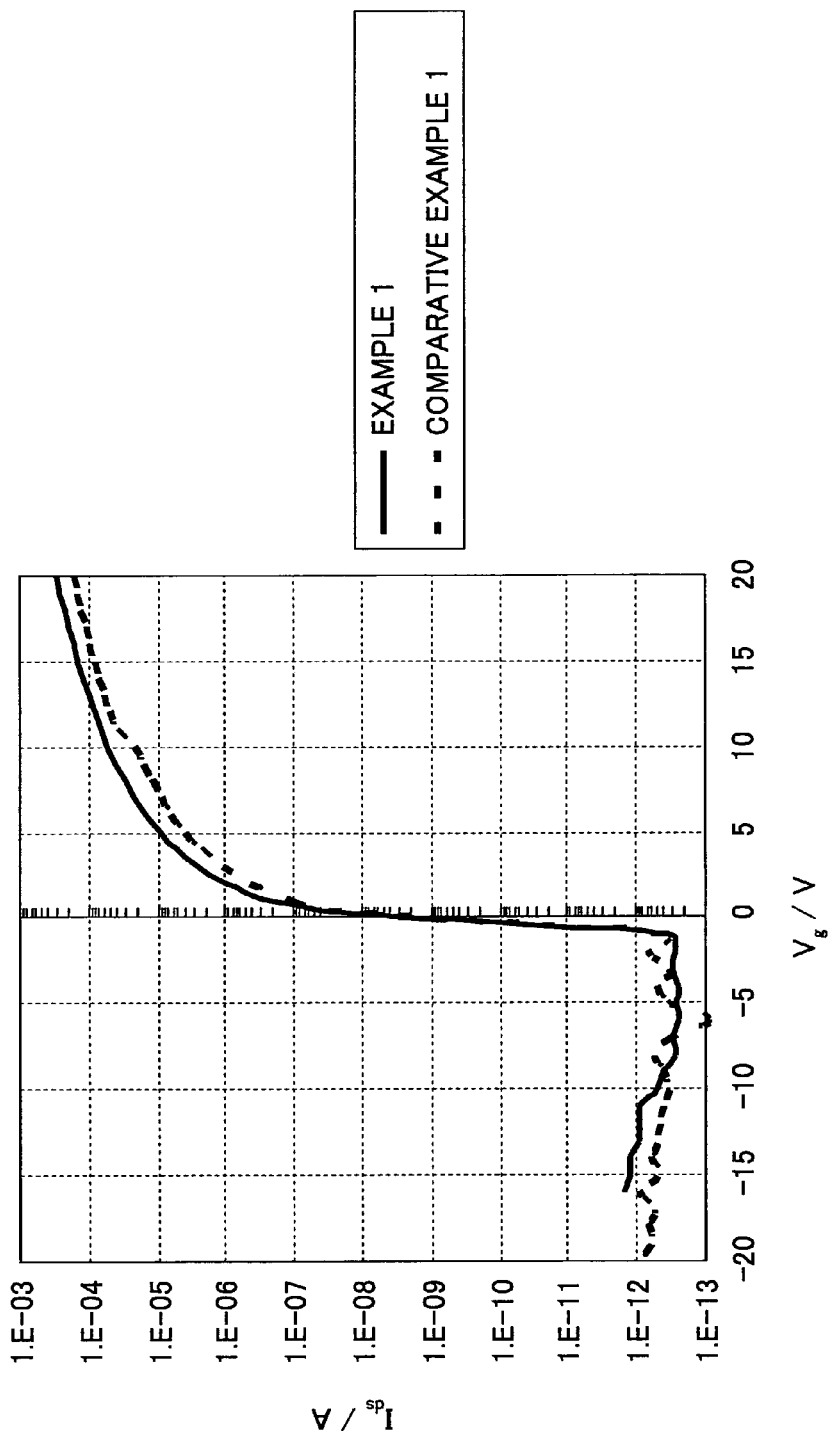
FIG. 32 indicates transistor properties of field-effect transistors according to example 1 and comparative example 1.

FIG. 32 indicates transistor properties of the field-effect transistor according to example 1 and the field-effect transistor according to comparative example 1. Both the field-effect transistor according to example 1 and the field-effect transistor according to comparative example 1 have an ON/OFF ratio of greater than or equal to seven digits, and therefore good switching properties are achieved. Specifically, the ON/OFF ratio is the current ratio of a current flowing in an ON state and a current flowing in an OFF state. Furthermore, in the field-effect transistor according to example 1, a current Id starts increasing when the gate voltage V$_g$ is approximately 0V, similar to the field-effect transistor according to comparative example 1. Accordingly, the field-effect transistor according to example 1 indicates good transistor properties. Furthermore, as described above, the gate insulating layer of the field-effect transistor according to example 1 has a higher relative permittivity than that of the field-effect transistor according to comparative example 1. Therefore, in the field-effect transistor according to example 1, the current I$_{ds}$ that flows in the ON state is higher than that of the field-effect transistor according to comparative example 1.

Furthermore, the magnesium lanthanum composite oxide forming the gate insulating layer 23 in example 1 showed a relative permittivity of approximately nine. This is much higher than the relative permittivity of approximately 3.9 of the SiO$_2$ film in comparative example 1. Furthermore, a low leakage current property was confirmed. Furthermore, in an X ray diffraction experiment, even when the gate insulating layer 23 was heated at 400° C. for one hour, a diffraction peak could not be observed. Accordingly, an amorphous state was confirmed.

Example 2

A description is given of a field-effect transistor (MOS-FET) according to example 2, with reference to FIG. 5. The MOS-FET according to example 2 was formed as follows. A liquid raw material was made by dissolving La(thd)$_3$ and Sr(thd)$_2$ (thd=2,2,6,6-tetramethyl-3,5-heptanedionato) in tetraethylene glycol dimethyl ether (tetraglyme) and tetrahydrofuran (THF), respectively. This liquid raw material was applied on the p type Si substrate 51 by a CVD method to form a lanthanum strontium composite oxide insulating film having a thickness of 5 nm. Furthermore, a CVD method was performed to form a polycrystalline silicon film, and a photolithography procedure is performed to pattern the polycrystalline silicon film and the lanthanum strontium composite oxide insulating film, thereby forming the gate insulating layer 52 and the gate electrode 53. Next, a CVD method was performed to deposit SiON. Then, the entire surface was subjected to dry etching, so that the gate side wall insulating film 54 was formed. Next, the gate electrode 53 and the gate side wall insulating film 54 were used as a self-alignment mask to implant phosphorus ions into the p type Si substrate 51. According to ion diffusion, the source area 55 and the drain area 56 were formed. Next, a CVD method was performed to deposit SiO$_2$, and a photolithography procedure was performed to form the interlayer insulating film 57 having contact holes. Finally, a sputtering method was performed to deposit an Al layer, with which the contact holes were filled. Then, patterning was performed by a photolithography procedure, so that the source electrode 58 and the drain electrode 59 were formed. By performing the above procedures, the field-effect transistor (MOS-FET) was formed.

The field-effect transistor formed in example 2 showed good transistor properties and low leakage current properties. The lanthanum strontium composite oxide forming the gate insulating layer 52 formed in example 2 showed a relative permittivity of approximately 10, and a low leakage current property was confirmed. Furthermore, in an X ray diffraction experiment, it was found that an amorphous state is attained.

Example 3

Figure 33:
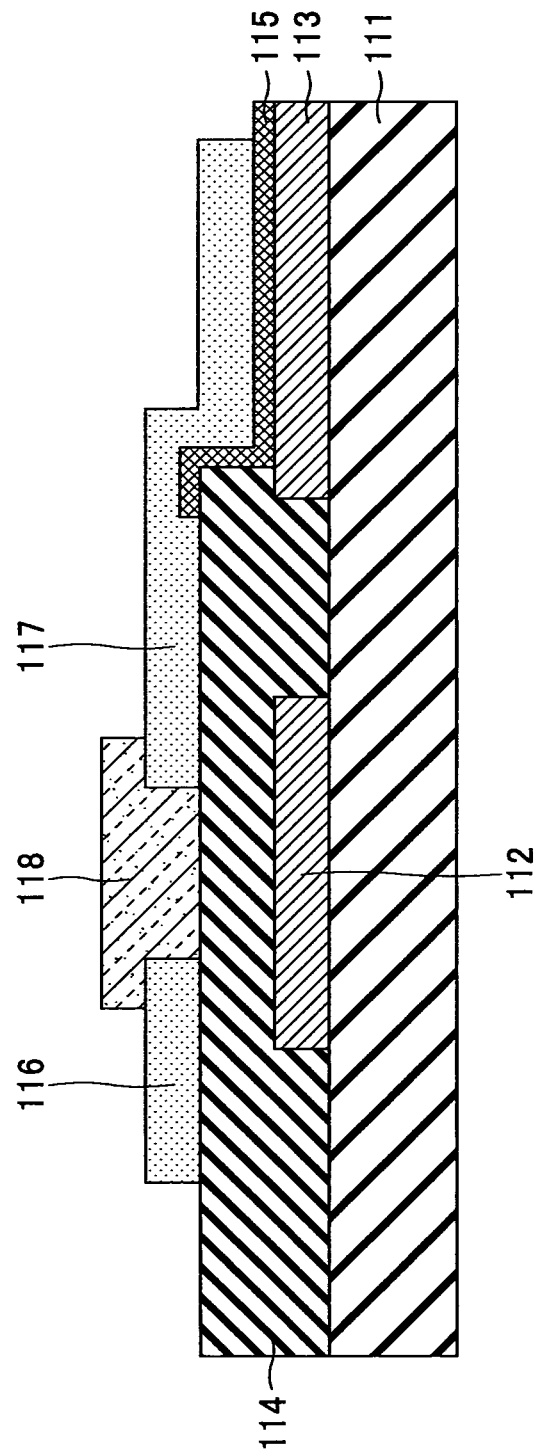
FIG. 33 illustrates a volatile memory according to example 3.

As example 3, a description is given of a volatile memory according to an embodiment of the present invention. With reference to FIG. 33, a description is given of a method of manufacturing the volatile memory formed according to example 3.

First, a gate electrode 112 and a second capacitor electrode 113 were formed on a substrate 111 made of alkali-free glass. Specifically, a molybdenum (Mo) film having a thickness of approximately 100 nm was formed on the glass substrate 111 by a DC sputtering method. Subsequently, a photoresist was applied, and subjected to prebaking, exposing by a stepper with a photomask, and developing, so that a resist pattern having the same pattern as the gate electrode 112 and the second capacitor electrode 113 was formed. Furthermore, RIE (Reactive Ion Etching) was performed to remove the molybdenum film from areas where the resist pattern was not formed. Subsequently, the resist pattern was also removed, so that the gate electrode 112 and the second capacitor electrode 113 were formed.

Next, a gate insulating layer 114 was formed. Specifically, a liquid raw material was made by dissolving La(thd)$_3$ and Ba(thd)$_2$ (thd=2,2,6,6-tetramethyl-3,5-heptanedionato) in tetraethylene glycol dimethyl ether (tetraglyme) and tetrahydrofuran (THF), respectively. This liquid raw material was applied on the gate electrode 112 and the glass substrate 111 by a CVD method, to form a barium lanthanum composite oxide insulating film having a thickness of 200 nm, so that the gate insulating layer 114 was formed. Subsequently, a photoresist was applied, and the photoresist was subjected to prebaking, exposing by a stepper with a photomask, and developing, so that a resist pattern having the same pattern as the gate insulating layer 114 was formed. Furthermore, RIE (Reactive Ion Etching) was performed to remove the barium lanthanum composite oxide insulating film from areas where the resist pattern was not formed. Subsequently, the resist pattern was also removed, so that the gate insulating layer 114 was formed.

Next, a capacitor dielectric layer 115 was formed. Specifically, a liquid raw material was made by dissolving La(thd)$_3$ and Ba(thd)$_2$ (thd=2,2,6,6-tetramethyl-3,5-heptanedionato) in tetraethylene glycol dimethyl ether (tetraglyme) and tetrahydrofuran (THF), respectively. This liquid raw material was applied on the gate electrode 112 and the glass substrate 111 by a CVD method, to form a barium lanthanum composite oxide insulating film having a thickness of 50 nm, so that the capacitor dielectric layer 115 was formed. Subsequently, a photoresist was applied, and the photoresist was subjected to prebaking, exposing by a stepper with a photomask, so that a resist pattern having the same pattern as the capacitor dielectric layer 115 was formed. Furthermore, RIE (Reactive Ion Etching) was performed to remove the barium lanthanum composite oxide insulating film from areas where the resist pattern was not formed. Subsequently, the resist pattern was also removed, so that the capacitor dielectric layer 115 was formed.

Next, a source electrode 116 and a drain electrode 117 were formed. In example 3, the drain electrode 117 also acts as the first capacitor electrode in the third embodiment, and forms capacitors together with the capacitor dielectric layer 115 and the second capacitor electrode 113.

Specifically, an ITO film that is a transparent conducting film was formed on the gate insulating layer 114 and the capacitor dielectric layer 115 by a DC sputtering method, so that the ITO film had a thickness of approximately 100 nm. Subsequently, a photoresist was applied on the ITO film, and the photoresist was subjected to prebaking, exposing by a stepper with a photomask, and developing, so that a resist pattern having the same pattern as the source electrode 116 and the drain electrode 117 was formed. Furthermore, RIE (Reactive Ion Etching) was performed to remove the ITO film from areas where the resist pattern was not formed. Subsequently, the resist pattern was also removed, so that the source electrode 116 and the drain electrode 117 made from the ITO film are formed.

Next, a semiconductor layer 118 was formed. Specifically, an magnesium indium oxide film having a thickness of approximately 100 nm was formed by a DC sputtering method. Subsequently, a photoresist was applied on the magnesium indium oxide film, and the photoresist was subjected to prebaking, by a stepper with a photomask, and developing, so that a resist pattern having the same pattern as the semiconductor layer 118 was formed. Furthermore, RIE (Reactive Ion Etching) was performed to remove the magnesium indium film from areas where the resist pattern was not formed. Subsequently, the resist pattern was also removed, so that the semiconductor layer 118 was formed. Accordingly, the semiconductor layer 118 was formed such that a channel was formed between the source electrode 116 and the drain electrode 117.

According to the above procedures, the volatile memory was formed. The barium lanthanum composite oxide forming the gate insulating layer 114 and the capacitor dielectric layer 115 of the volatile memory formed in example 3 showed a relative permittivity of approximately 11, and a low leakage current property was confirmed. Furthermore, in an X ray diffraction experiment, it was found that an amorphous state was attained.

Example 4

A description is given of a volatile semiconductor memory according to example 4, with reference to FIG. 10. The volatile semiconductor memory according to example 4 was formed as follows. A raw material was made by dissolving Y(thd)$_3$ and Sr(thd)$_2$ (thd=2,2,6,6-tetramethyl-3,5-heptanedionato) in tetraethylene glycol dimethyl ether (tetraglyme) and tetrahydrofuran (THF), respectively. This liquid raw material was applied on the p type Si substrate 71 by a CVD method to form a yttrium strontium composite oxide insulating film having a thickness of 5 nm. Furthermore, a CVD method was performed to form a polycrystalline silicon film, and a photolithography procedure was performed to pattern the polycrystalline silicon film and the yttrium strontium composite oxide insulating film, thereby forming the gate insulating layer 72 and the gate electrode 73. Next, a CVD method was performed to deposit SiON. Then, the entire surface was subjected to dry etching, so that the gate side wall insulating film 74 is formed. Next, the gate electrode 73 and the gate side wall insulating film 74 were used as a self-alignment mask to implant phosphorus ions into the p type Si substrate 71. According to ion diffusion, the source area 75 and the drain area 76 were formed. Next, a CVD method was performed to deposit SiO$_2$, and a photolithography procedure was performed to form the interlayer insulating film 77 having contact holes. Then, a CVD method was performed to deposit the polycrystalline silicon film, with which the contact holes were filled. Then, a photolithography procedure was performed to form the bit line electrode 78. Next, a CVD method was performed to deposit $SiO_2$, and a photolithography procedure was performed to form the interlayer insulating film 79 having a contact hole above the drain area 76. Next, a CVD method was performed to form a polycrystalline silicon film, and a photolithography procedure was performed to form the first capacitor electrode (capacitor lower electrode) 80. Next, a raw material was made by dissolving $Y(thd)_3$ and $Sr(thd)_2$ (thd=2,2,6,6-tetramethyl-3,5-heptanedionato) in tetraethylene glycol dimethyl ether (tetraglyme) and tetrahydrofuran (THF), respectively. This raw material was used to form a yttrium strontium composite oxide insulating film having a thickness of 30 nm by a CVD method, so that the capacitor dielectric layer 81 was formed. Subsequently, a polycrystalline silicon film was formed by a CVD method, so that the second capacitor electrode (capacitor upper electrode) 82 was formed.

According to the above procedures, the volatile memory was formed. The yttrium strontium composite oxide insulating film forming the gate insulating layer 72 and the capacitor dielectric layer 81 of the volatile memory formed in example 4 showed a relative permittivity of approximately seven, and a low leakage current property was confirmed. Furthermore, in an X ray diffraction experiment, it was found that an amorphous state was attained.

Example 5

As example 5, a description is given of a non-volatile memory according to an embodiment of the present invention. With reference to FIG. 11, a description is given of a method of manufacturing the non-volatile memory formed according to example 5.

First, the gate electrode 92 was formed on the substrate 91 made of alkali-free glass. Specifically, a molybdenum (Mo) film having a thickness of approximately 30 nm was formed on the glass substrate 91 by a DC sputtering method. Subsequently, a photoresist was applied, and the photoresist was subjected to prebaking, by a stepper with a photomask, and developing, so that a resist pattern having the same pattern as the gate electrode 92 was formed. Furthermore, RIE (Reactive Ion Etching) was performed to remove the molybdenum film from areas where the resist pattern was not formed. Subsequently, the resist pattern was also removed, so that the gate electrode 92 was formed.

Next, the gate insulating layer 93 was formed. Specifically, a liquid raw material was made by dissolving $La(thd)_3$ and $Ca(thd)_2$ (thd=2,2,6,6-tetramethyl-3,5-heptanedionato) in tetraethylene glycol dimethyl ether (tetraglyme) and tetrahydrofuran (THF), respectively. This liquid raw material was applied on the gate electrode 92 and the glass substrate 91 by a CVD method, to form a calcium lanthanum composite oxide insulating film having a thickness of 100 nm, so that the gate insulating layer 93 was formed.

Next, the floating gate electrode 94 was formed. Specifically, a molybdenum (Mo) film having a thickness of approximately 15 nm was formed on the first gate insulating layer 93 by a DC sputtering method. Subsequently, a photoresist was applied, and the photoresist was subjected to prebaking, exposing by a stepper with a photomask, and developing, so that a resist pattern having the same pattern as the floating gate electrode 94 was formed. Furthermore, RIE (Reactive Ion Etching) was performed to remove the molybdenum film from areas where the resist pattern was not formed. Subsequently, the resist pattern was also removed, so that the floating gate electrode 94 was formed.

Next, the second gate insulating layer 95 was formed. Specifically, a $SiO_2$ layer having a thickness of approximately 50 nm was formed by a CVD method on the first gate insulating layer 93 and the floating gate electrode 94, so that the second gate insulating layer 95 was formed.

Next, the source electrode 96 and the drain electrode 97 were formed. Specifically, an ITO film that was a transparent conducting film having a thickness of approximately 100 nm was formed on the second gate insulating layer 95 by a DC sputtering method. Subsequently, a photoresist was applied on the ITO film, and the photoresist was subjected to prebaking, exposing by a stepper with a photomask, and developing, so that a resist pattern having the same pattern as the source electrode 96 and the drain electrode 97 was formed. Furthermore, RIE (Reactive Ion Etching) was performed to remove the ITO film from areas where the resist pattern was not formed. Subsequently, the resist pattern was also removed, so that the source electrode 96 and the drain electrode 97 made of ITO films were formed.

Next, the semiconductor layer 98 was formed. Specifically, an magnesium indium oxide film having a thickness of approximately 100 nm was formed by a DC sputtering method. Subsequently, a photoresist was applied on the magnesium indium oxide film, and the photoresist was subjected to prebaking, exposing by a stepper with a photomask, and developing, so that a resist pattern having the same pattern as the semiconductor layer 98 was formed. Furthermore, RIE (Reactive Ion Etching) was performed to remove the magnesium indium oxide film from areas where the resist pattern was not formed. Subsequently, the resist pattern was also removed, so that the semiconductor layer 98 was formed. Accordingly, the semiconductor layer 98 was formed such that a channel was formed between the source electrode 96 and the drain electrode 97.

According to the above procedures, the non-volatile memory was formed. The calcium lanthanum composite oxide insulating film forming the gate insulating layer 93 of the non-volatile memory formed in example 5 showed a relative permittivity of approximately eight, and a low leakage current property was confirmed. Furthermore, in an X ray diffraction experiment, it was found that an amorphous state is attained.

Example 6

A description is given of a non-volatile semiconductor memory according to example 6, with reference to FIG. 15. The non-volatile semiconductor memory according to example 6 was formed as follows. An $SiO_2$ having a thickness of 5 nm was formed on the p type Si substrate 101 by performing thermal oxidation on the surface. Then, the second gate insulating film 104 that is the second gate insulating layer was formed by performing photolithography. Next, a CVD method was performed to form a polycrystalline silicon film, and a photolithography procedure was performed to form the floating gate electrode 105.

Next, a raw material was made by dissolving a powder mixture of $Y(thd)_3$ and $Sr(thd)_2$ (thd=2,2,6,6-tetramethyl-3,5-heptanedionato) in a mixed solvent of tetrahydrofuran (THF) and ethylene glycol dimethyl ether (DME). This raw material was applied by a CVD method to form a barium strontium composite oxide insulating film of 25 nm, and a photolithography procedure was performed to form the first gate insulating layer 102. Next, a CVD method was performed to form a polycrystalline silicon film, and a photolithography procedure was performed to form the gate electrode 103.

Next, a CVD method was performed to deposit SiON. Then, the entire surface was subjected to dry etching, so that the gate side wall insulating film 106 was formed. Next, the gate electrode 103 and the gate side wall insulating film 106 were used as a self-alignment mask to implant phosphorus ions into the p type Si substrate 101. According to ion diffusion, the source area 107 and the drain area 108 were formed.

According to the above procedures, the non-volatile memory was formed. The barium strontium composite oxide insulating film forming the first gate insulating layer 102 of the non-volatile memory formed in example 6 showed a relative permittivity of approximately seven, and a low leakage current property was confirmed. Furthermore, in an X ray diffraction experiment, it was found that an amorphous state was attained.

Example 7

Figure 34:
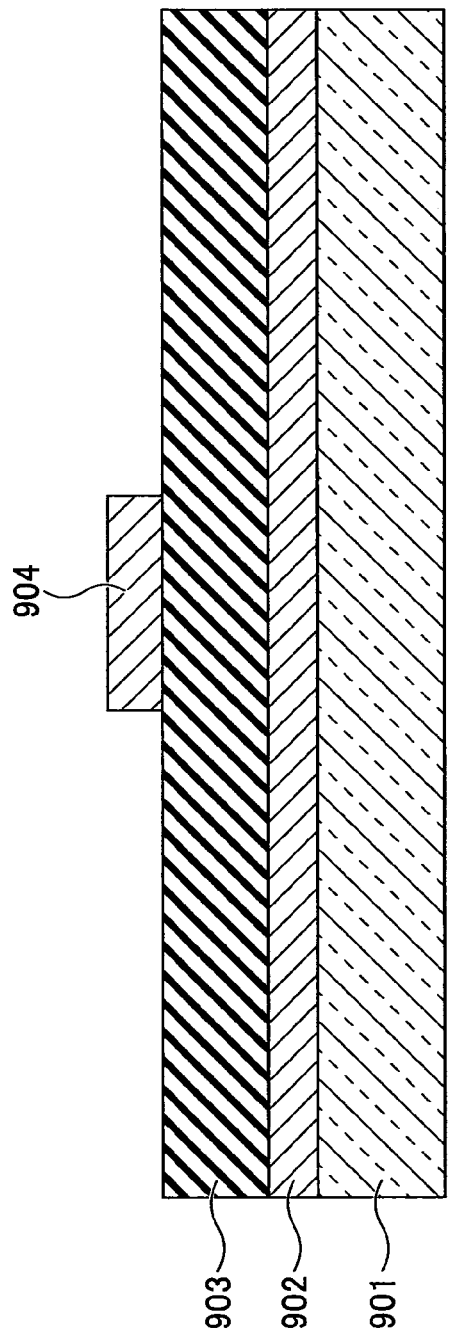
FIG. 34 illustrates a capacitor formed according to examples 7 and 8 and comparative example 2.

Next, as example 7, a description is given of a capacitor according to an embodiment of the present invention. This capacitor may be used in the one-transistor/one-capacitor circuit for driving the liquid crystal element according to the seventh embodiment, or the volatile memory according to the third embodiment. The following description is given with reference to FIG. 34.

First, an aluminum film having a thickness of approximately 100 nm was formed on a substrate 901 made of alkali-free glass via a metal mask by vacuum vapor deposition, to form a lower capacitor electrode 902 having a requested shape.

Next, a magnesium lanthanum oxide insulating thin film was formed, which becomes a capacitor dielectric layer 903. First, ink for forming an oxide insulating film was manufactured. Specifically, 0.8 ml of magnesium 2-ethylhexanoate solution in toluene (Mg content 3 wt %, STREM12-1260) and 2 ml of lanthanum 2-ethylhexanoate solution in toluene (La content 7 wt %, 122-03371 manufactured by Wako Pure Chemical Industries, Ltd.) were mixed together. Furthermore, 3 ml of toluene was added to dilute this mixture. Accordingly, colorless, transparent ink for forming a magnesium lanthanum oxide insulating film was prepared. Next, this ink was applied onto the substrate 901 onto which the lower capacitor electrode 902 had been formed by spin coating (rotating at 1000 rpm for five seconds, and then rotating at 3000 rpm for 20 seconds). Then, a heating process was performed in air (for one hour each at 200° C., 300° C., and 400° C.). Accordingly, a magnesium lanthanum oxide insulating thin film having a thickness of 354 nm was formed.

Next, an aluminum film having a thickness of approximately 100 nm was formed via a metal mask by vacuum vapor deposition, to form an upper capacitor electrode 904.

Figure 35:
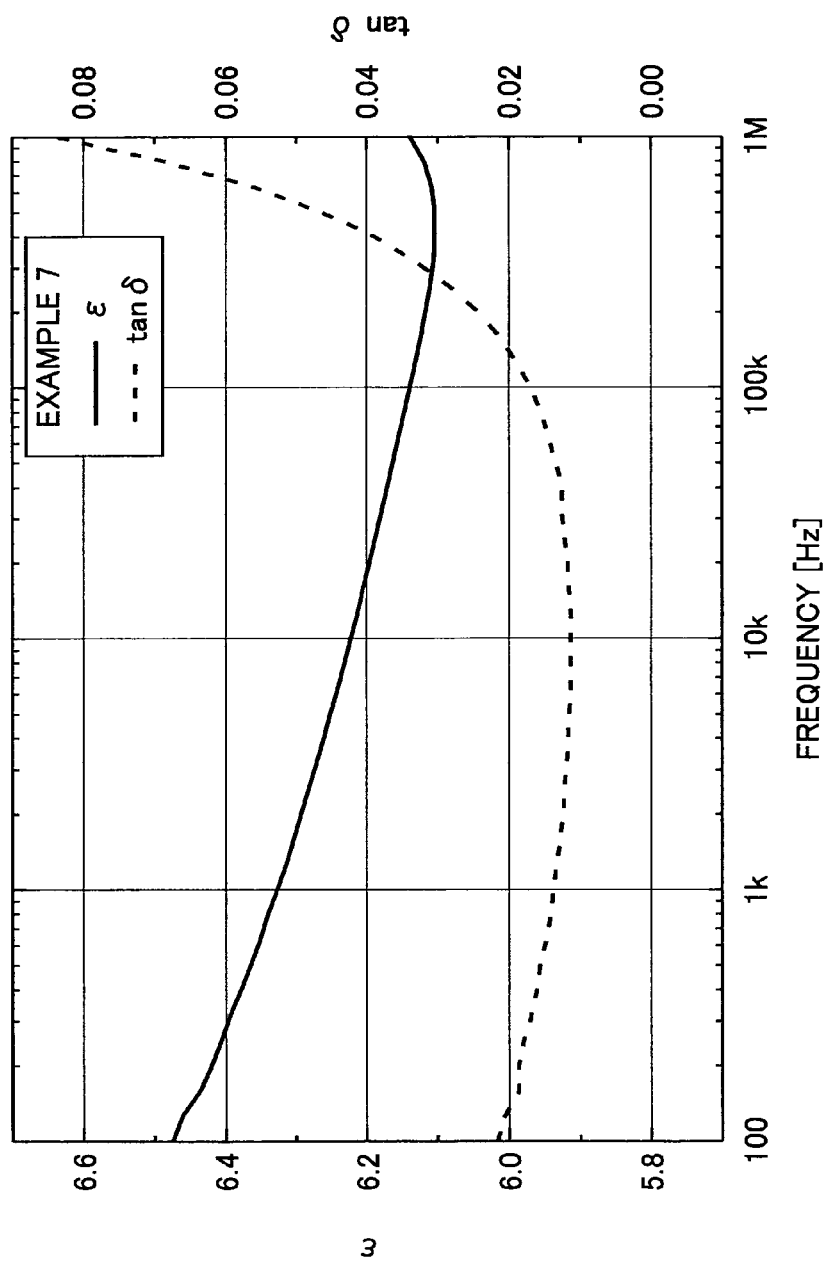
FIG. 35 indicates properties of the capacitor according to example 7.

FIG. 35 indicates relationships between the frequency of the applied electric field and the relative permittivity c of the capacitor formed in example 7, and the relationship between the frequency of the applied electric field and the dielectric loss tan δ of the capacitor formed in example 7. As shown in FIG. 35, the relative permittivity E of the capacitor formed in example 7 is greater than or equal to 6.1 in the region ranging from 100 Hz through 1 MHz, and therefore a high relative permittivity is confirmed. Furthermore, it is also confirmed that the dielectric loss tan δ is low, at less than or equal to approximately 2%, in the region ranging from 100 Hz through 100 kHz.

Example 8

Next, as example 8, a description is given of a capacitor according to an embodiment of the present invention. Similar to example 7, this capacitor may be used in the one-transistor/one-capacitor circuit for driving the liquid crystal element according to the seventh embodiment, or the volatile memory according to the third embodiment. The following description is given with reference to FIG. 34.

First, an aluminum film having a thickness of approximately 100 nm was formed on a substrate 901 made of alkali-free glass via a metal mask by vacuum vapor deposition, to form a lower capacitor electrode 902 having a requested shape.

Next, a strontium lanthanum oxide insulating thin film is formed, which becomes a capacitor dielectric layer 903. First, ink for forming an oxide insulating film was manufactured. Specifically, 4.4 ml of strontium 2-ethylhexanoate solution in toluene (Sr content 2 wt %, 195-09561 manufactured by Wako Pure Chemical Industries, Ltd.) and 2 ml of lanthanum 2-ethylhexanoate solution in toluene (La content 7 wt %, 122-03371 manufactured by Wako Pure Chemical Industries, Ltd.) were mixed together. Furthermore, 6 ml of toluene was added to dilute this mixture. Accordingly, colorless, transparent ink for forming a strontium lanthanum oxide insulating film was prepared. Next, this ink was applied onto the substrate 901 onto which the lower capacitor electrode 902 was formed by spin coating (rotating at 1000 rpm for five seconds, and then rotating at 3000 rpm for 20 seconds). Then, a heating process was performed in air (for one hour each at 200° C., 300° C., and 400° C.). Accordingly, a strontium lanthanum oxide insulating thin film having a thickness of 180 nm was formed.

Next, an aluminum film having a thickness of approximately 100 nm was formed via a metal mask by vacuum vapor deposition, to form an upper capacitor electrode 904.

Figure 36:
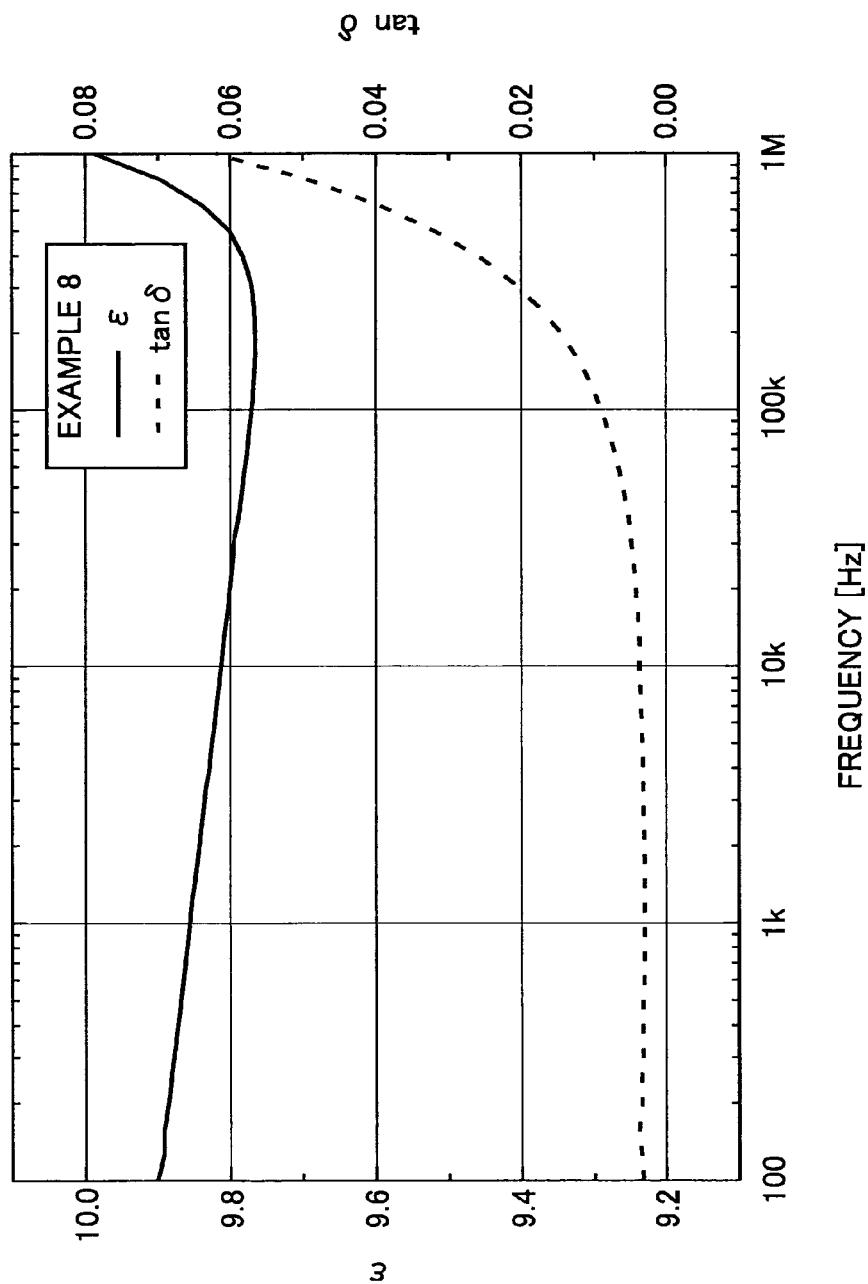
FIG. 36 indicates properties of the capacitor according to example 8.

FIG. 36 indicates relationships between the frequency of the applied electric field and the relative permittivity ∈ of the capacitor formed in example 8, and the relationship between the frequency of the applied electric field and the dielectric loss tan δ of the capacitor formed in example 8. As shown in FIG. 36, the relative permittivity ∈ of the capacitor formed in example 8 is greater than or equal to 9.7 in the region ranging from 100 Hz through 1 MHz, and therefore a high relative permittivity is confirmed. Furthermore, it is also confirmed that the dielectric loss tan δ is low, at less than or equal to approximately 1% in the region ranging from 100 Hz through 100 kHz.

Comparative Example 2

Next, a description is given of a capacitor formed in comparative example 2. The structure of the capacitor formed in comparative example 2 is the same as those of examples 7 and 8 illustrated in FIG. 34.

In the capacitor of comparative example 2, an aluminum film having a thickness of approximately 100 nm was formed on a substrate 901 made of alkali-free glass via a metal mask by vacuum vapor deposition, to form a lower capacitor electrode 902 having a requested shape.

Then, a SiO$_2$ film having a thickness of approximately 285 nm was formed by RF magnetron sputtering to form an insulating film 903. Then, an aluminum film having a thickness of approximately 100 nm was formed via a metal mask by vacuum vapor deposition, to form an upper capacitor electrode 904.

Figure 37:
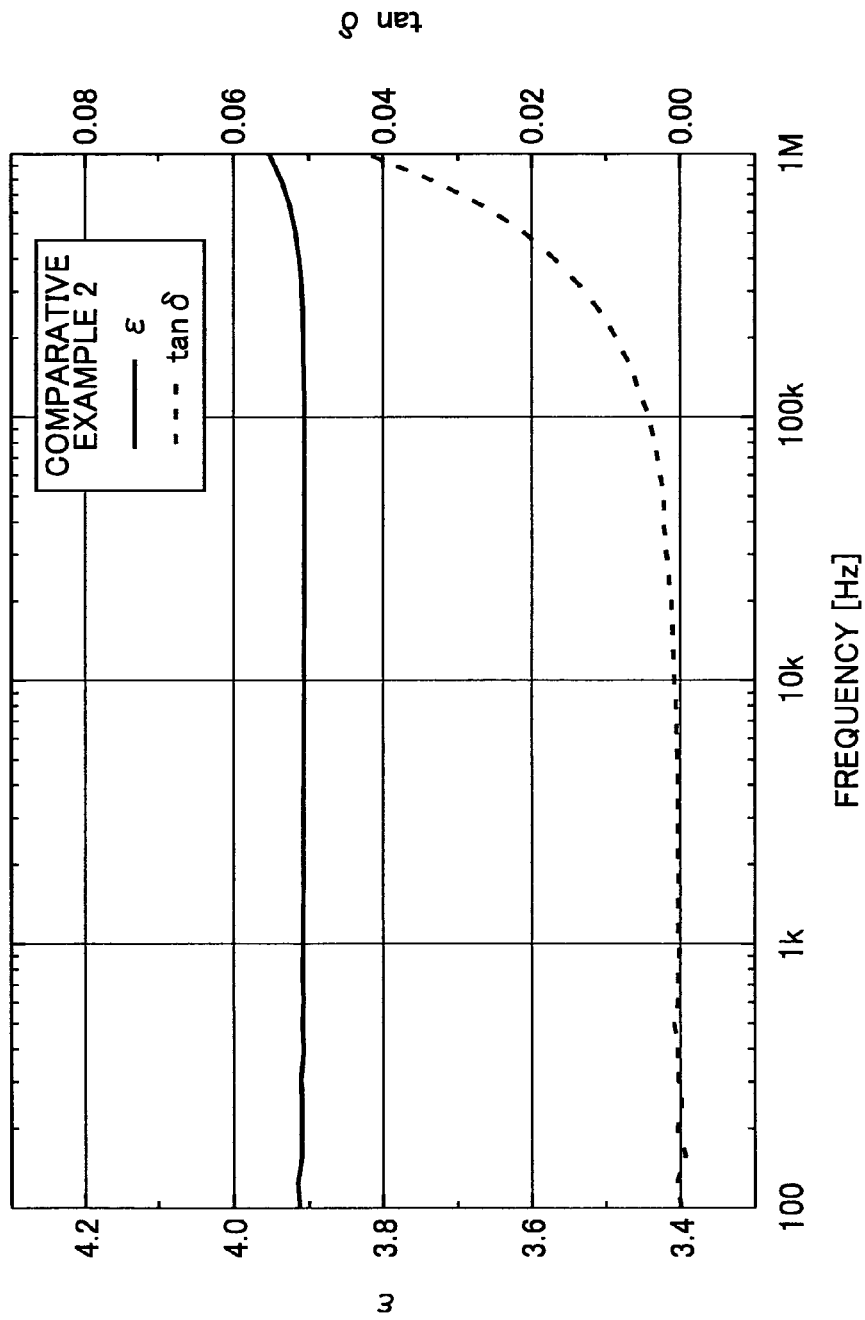
FIG. 37 indicates properties of the capacitor according to comparative example 2.

FIG. 37 indicates relationships between the frequency of the applied electric field and the relative permittivity ∈ of the capacitor formed in comparative example 2, and the relationship between the frequency of the applied electric field and the dielectric loss tan δ of the capacitor formed in comparative example 2. As shown in FIG. 37, the dielectric loss tan δ of the capacitor formed in comparative example 2 is low, at less than or equal to approximately 1% in the region up to 250 kHz. However, the relative permittivity E is approximately 3.9 in the region ranging from 100 Hz through 1 MHz, which is a lower value than those of examples 7 and 8.

Example 9

Next, as example 9, a description is given of a field-effect transistor according to an embodiment of the present invention with reference to FIG. 2. The field-effect transistor of example 9 was formed as follows. First, an aluminum film having a thickness of approximately 100 nm was formed on the substrate 21 made of alkali-free glass via a metal mask by vacuum vapor deposition, to form the gate electrode 22. Next, by the same method as that of example 8, the gate insulating layer 23 made of a strontium lanthanum oxide and having a thickness of 230 nm was formed. Next, an $MgIn_2O_4$ film which becomes the semiconductor layer 24 was formed in room temperature by DC magnetron sputtering. The sputtering gas was a mixture of argon and oxygen, and a film having a thickness of 100 nm was formed in a requested region with the use of a metal mask. Next, an aluminum film having a thickness of 100 nm was formed via a metal mask by vacuum vapor deposition, so that the source electrode 25 and the drain electrode 26 were formed. The channel length L was 50 μm and the channel width W was 400 μm. Finally, a heating process was performed in air at 300° C. for one hour. Accordingly, the field-effect transistor of example 9 was formed.

Comparative Example 3

Next, as comparative example 3, a description is given of a field-effect transistor having a conventional structure, with reference to FIG. 2. The difference between the field-effect transistor according to example 9 and the field-effect transistor according to comparative example 3 is the method of forming the gate insulating layer 23; as for the other layers, the same manufacturing method and materials were used.

The gate electrode 22 was formed on the insulating substrate 21 by the same method as that of example 9. Subsequently, a $SiO_2$ film having a thickness of 200 nm was formed by RF magnetron sputtering, to form the gate insulating layer 23. Subsequently, by the same method as that of example 9, the semiconductor layer 24, the source electrode 25, and the drain electrode 26 were formed. Finally, a heating process was performed in air at 300° C. for one hour, similar to example 9. Accordingly, the field-effect transistor according to comparative example 3 was formed.

Example 9 and Comparative Example 3

Figure 38:
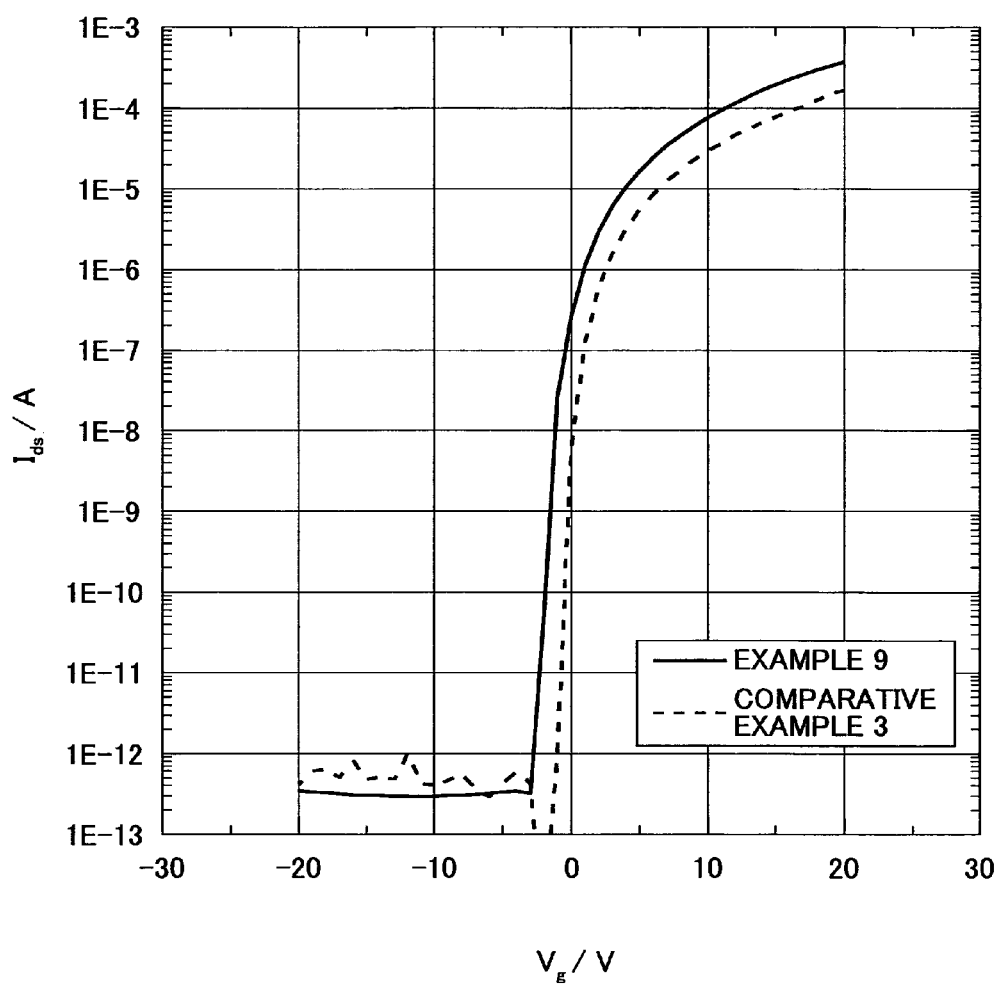
FIG. 38 indicates properties of field-effect transistors according to example 9 and comparative example 3.

FIG. 38 indicates the relationship between a gate voltage $V_g$ and an inter-source-drain current $I_{ds}$ in a case where an inter-source-drain voltage $V_d$ is 20 V, in the field-effect transistor according to example 9 and the field-effect transistor according to comparative example 3. As shown in FIG. 38, both the field-effect transistor according to example 9 and the field-effect transistor according to comparative example 3 have an ON/OFF ratio of greater than or equal to eight digits, and therefore TFT properties with good switching properties are achieved. Furthermore, in the field-effect transistor according to example 9, the ON current is greater than or equal to two times as that of the field-effect transistor according to comparative example 3. This is because the relative permittivity of the gate insulating film in example 9 is greater than or equal to two times as that of the gate insulating film in comparative example 3.

Example 10

Next, a description is given of an image display device according to an embodiment of the present invention, as example 10. The image display device according to example 10 is an organic EL display device illustrated in FIG. 16. A method of manufacturing the organic EL display device according to example 10 is described with reference to FIG. 39.

In step S102, the first gate electrode 202 and the second gate electrode 203 were formed. Specifically, on the glass substrate 201 made of alkali-free glass, a molybdenum (Mo) film having a thickness of approximately 100 nm was formed by DC sputtering. Subsequently, a photoresist was applied to form a resist pattern having the same pattern as that to be formed. The photoresist was subjected to prebaking, exposing by a stepper with a photomask, and developing. Furthermore, RIE (Reactive Ion Etching) was performed to remove the molybdenum film from areas where the resist pattern was not formed. Subsequently, the resist pattern was also removed, so that the first gate electrode 202 and the second gate electrode 203 were formed.

Next, in step S104, the gate insulating layer 204 was formed. Specifically, a liquid raw material was made by dissolving La(thd)$_3$ and Mg(thd)$_2$ (thd=2,2,6,6-tetramethyl-3,5-heptanedionato) in tetraethylene glycol dimethyl ether (tetraglyme) and tetrahydrofuran (THF), respectively. This liquid raw material was applied on the first gate electrode 202, the second gate electrode 203, and the glass substrate 201 by a CVD method, to form a magnesium lanthanum composite oxide insulating film having a thickness of 200 nm. Subsequently, a photoresist was applied to form a resist pattern having the same pattern as that to be formed. The photoresist was subjected to prebaking, exposing by a stepper with a photomask, and developing. Furthermore, RIE (Reactive Ion Etching) was performed to remove the magnesium lanthanum composite oxide insulating film from areas where the resist pattern was not formed. Subsequently, the resist pattern was also removed, so that the gate insulating film 204 having through holes was formed on the second gate electrode 203.

Next, in step S106, the first source electrode 205, the second source electrode 207, the first drain electrode 206, and the second drain electrode 208 were formed. Specifically, an ITO film which was a transparent conductive film having a thickness of approximately 100 nm was formed on the gate insulating layer 204 by DC sputtering. Subsequently, a photoresist was applied on the ITO film. The photoresist was subjected to prebaking, exposing by a stepper with a photomask, and developing, thereby forming a resist pattern having the same pattern as that to be formed. Furthermore, RIE (Reactive Ion Etching) was performed to remove the ITO film from areas where the resist pattern was not formed. Subsequently, the resist pattern was also removed, so that the first source electrode 205, the second source electrode 207, the first drain electrode 206, and the second drain electrode 208 made of ITO films were formed. Accordingly, the first drain electrode 206 and the second gate electrode 203 were connected.

Next, in step S108, the first semiconductor layer 209 and the second semiconductor layer 210 were formed. Specifically, a magnesium indium oxide film having a thickness of approximately 100 nm was formed by DC sputtering. Subsequently, a photoresist was applied on the magnesium indium film. The photoresist was subjected to prebaking, exposing by a stepper with a photomask, and developing, thereby forming a resist pattern having the same pattern as that to be formed. Furthermore, RIE (Reactive Ion Etching) was performed to remove the magnesium indium oxide film from areas where the resist pattern was not formed. Subsequently, the resist pattern was also removed, so that the first semiconductor layer 209 and the second semiconductor layer 210 were formed. Accordingly, the first semiconductor layer 209 was formed such that a channel was formed between the first source electrode 205 and the first drain electrode 206, and the second semiconductor layer 210 was formed such that a channel was formed between the second source electrode 207 and the second drain electrode 208.

Next, in step S110, the first protection layer 211 and the second protection layer 212 were formed. Specifically, photosensitive fluorine resin was applied on the entire substrate. The photosensitive fluorine resin is subjected to prebaking, exposing by a stepper with a photomask, and developing, so that a requested pattern was formed. The photosensitive fluorine resin was then subjected to postbaking. Accordingly, the first protection layer 211 and the second protection layer 212 having a thickness of approximately 400 nm were formed.

Next, in step S112, the partition wall 213 was formed. Specifically, on the entire substrate, a photosensitive polyimide material was applied. The photosensitive polyimide material was subjected to prebaking, exposing by a stepper with a photomask, and developing, so that a requested pattern was formed. The photosensitive polyimide material was then subjected to postbaking. Accordingly, the partition wall 213 having a thickness of approximately 1 μm was formed.

Next, in step S114, the organic EL layer 214 was formed an area where the partition wall 213 was not formed, with the use of an inkjet printer.

Next, in step S116, the top electrode 215 was formed. Specifically, MgAg was deposited by vacuum vapor deposition, so that the top electrode 215 was formed.

Next, in step S118, the sealing layer 216 was formed. Specifically, an $SiO_2$ film having a thickness of approximately 2 μm was formed by CVD, so that the sealing layer 216 was formed.

Next, in step S120, the opposing insulating substrate 218 was adhered. Specifically, the adhesive layer 217 was formed on the sealing layer 216, and the opposing insulating substrate 218 made of alkali-free glass was adhered to the adhesive layer 217. Accordingly, a display panel of the organic EL display device according to example 7 was formed as shown in FIG. 16.

Next in step S122, a display control device was connected. Specifically, a display control device (not shown) was connected to the display panel so that images can be displayed on the display panel. Accordingly, an image display system including the organic EL display device was formed.

The organic EL display device formed in example 7 can be driven at low voltage, and therefore power consumption of the image display system can be reduced.

The present invention is not limited to the specific embodiments described herein, and variations and modifications may be made without departing from the scope of the present invention.

The present application is based on Japanese Priority Applications No. 2009-295425 filed on Dec. 25, 2009, No. 2010-062244 filed on Mar. 18, 2010, No. 2010-270240 filed on Dec. 3, 2010, and No. 2010-271980 filed on Dec. 6, 2010 with the Japan Patent Office, the entire contents of which are hereby incorporated by reference.

The invention claimed is:

1. A field-effect transistor comprising:
 a substrate;
 a source electrode, a drain electrode, and a gate electrode formed on the substrate;
 a semiconductor layer by which a channel is formed between the source electrode and the drain electrode when a predetermined voltage is applied to the gate electrode; and
 a paraelectric gate insulating layer having a portion thereof provided between the gate electrode and the semiconductor layer,
 wherein the paraelectric gate insulating layer is formed of a composite metal oxide insulating film having an amorphous structure and including one or two or more elements selected from a group consisting of Be, Mg, Ca, Sr, and Ra and one or two or more elements selected from a group consisting of Ga, Sc, Y, and lanthanoid except Ce, the composite metal oxide insulating film having a resistivity greater than or equal to 1.1E+04 Ω·cm,
 wherein the composite metal oxide insulating film excludes a perovskite metal oxide and a layer type perovskite metal oxide, and
 wherein the paraelectric gate insulating layer is in direct contact with the semiconductor layer.

2. The field-effect transistor according to claim 1, wherein the semiconductor layer is an oxide semiconductor.

3. The field-effect transistor according to claim 1, wherein the substrate is an insulating substrate.

4. The field-effect transistor according to claim 1, wherein the substrate is a semiconductor substrate.

5. A volatile semiconductor memory comprising:
 the field-effect transistor according to claim 1;
 a first capacitor electrode connected to the drain electrode;
 a second capacitor electrode; and
 a capacitor dielectric layer provided between the first capacitor electrode and the second capacitor electrode.

6. The volatile semiconductor memory according to claim 5, wherein the capacitor dielectric layer is formed of an amorphous composite metal oxide insulating film including one or two or more alkaline-earth metal elements and one or two or more elements selected from a group consisting of Ga, Sc, Y, and lanthanoid except Ce.

7. A non-volatile semiconductor memory comprising:
 the field-effect transistor according to claim 1,
 wherein a second gate insulating layer and a floating gate electrode are provided between the semiconductor layer and the gate insulating layer.

8. A display element comprising:
 an optical control element whose optical output is controlled in accordance with driving signals; and
 a driving circuit that drives the optical control element, the driving circuit including the field-effect transistor according to claim 1.

9. The display element according to claim 8, wherein the optical control element includes an organic electro luminescence element.

10. The display element according to claim 8, wherein the optical control element includes a liquid crystal element.

11. The display element according to claim 8, wherein the optical control element includes an electrochromic element.

12. The display element according to claim 8, wherein the optical control element includes an electrophoretic element.

13. The display element according to claim 8, wherein the optical control element includes an electrowetting element.

14. An image display device for displaying an image in accordance with image data, comprising:
- a plurality of the display elements according to claim 8 arranged in a matrix;
- a plurality of wirings that separately apply gate voltages to the field-effect transistors included in the plural display elements; and
- a display control device that separately controls the gate voltages of the field-effect transistors via the plural wirings, in accordance with the image data.

15. A system comprising:
- the image display device according to claim 14; and
- an image data creating device that creates the image data based on image information to be displayed, and that outputs the image data to the image display device.

16. The field-effect transistor according to claim 1, wherein a volume resistivity of the composite metal oxide insulating film is $\rho > 5.9E+6$ $\Omega$cm.

17. The field-effect transistor according to claim 1, wherein the resistivity of the paraelectric gate insulating film does not change with respect to voltage applied from the gate electrode.

18. A field-effect transistor comprising:
- a substrate;
- a source electrode, a drain electrode, and a gate electrode formed on the substrate;
- a semiconductor layer by which a channel is formed between the source electrode and the drain electrode when a predetermined voltage is applied to the gate electrode; and
- a paraelectric gate insulating layer having a portion thereof provided between the gate electrode and the semiconductor layer,
- wherein the paraelectric gate insulating layer consists of a composite metal oxide insulating film having an amorphous structure and including one or two or more elements selected from a group consisting of Be, Mg, Ca, Sr, and Ra and one or two or more elements selected from a group consisting of Ga, Sc, Y, and lanthanoid except Ce,
- wherein the composite metal oxide insulating film excludes a perovskite metal oxide and a layer type perovskite metal oxide, and
- wherein the paraelectric gate insulating layer is in direct contact with the semiconductor layer.

19. The field-effect transistor according to claim 18, wherein the resistivity of the paraelectric gate insulating film does not change with respect to voltage applied from the gate electrode.

20. A field-effect transistor comprising:
- a substrate;
- a source electrode, a drain electrode, and a gate electrode formed on the substrate;
- a semiconductor layer by which a channel is formed between the source electrode and the drain electrode when a predetermined voltage is applied to the gate electrode; and
- a paraelectric gate insulating layer having a portion thereof provided between the gate electrode and the semiconductor layer,
- wherein the paraelectric gate insulating layer is formed of a composite metal oxide insulating film having an amorphous structure and including one or two or more elements selected from a group consisting of Be, Mg, Ca, Sr, and Ra and one or two or more elements selected from a group consisting of Ga, Sc, Y, and lanthanoid except Ce, the composite metal oxide insulating film having a resistivity greater than or equal to 1.1E+04 $\Omega$·cm,
- wherein the paraelectric gate insulating layer is in direct contact with the semiconductor layer, and
- wherein the composite metal oxide insulating film excludes a perovskite metal oxide and a layer type perovskite metal oxide.

21. The field-effect transistor according to claim 20, wherein the resistivity of the paraelectric gate insulating film does not change with respect to voltage applied from the gate electrode.

* * * * *